(12) United States Patent
Fukagawa et al.

(10) Patent No.: US 11,183,645 B2
(45) Date of Patent: Nov. 23, 2021

(54) ORGANIC THIN FILM AND METHOD FOR MANUFACTURING ORGANIC THIN FILM, ORGANIC ELECTROLUMINESCENCE ELEMENT, DISPLAY DEVICE, ILLUMINATION DEVICE, ORGANIC THIN FILM SOLAR CELL, THIN FILM TRANSISTOR, AND COATING COMPOSITION

(71) Applicants: NIPPON HOSO KYOKAI, Tokyo (JP); NIPPON SHOKUBAI CO., LTD., Osaka (JP)

(72) Inventors: Hirohiko Fukagawa, Tokyo (JP); Takahisa Shimizu, Tokyo (JP); Katsuyuki Morii, Osaka (JP); Munehiro Hasegawa, Osaka (JP); Syun Gohda, Osaka (JP)

(73) Assignees: Nippon Hoso Kyokai, Tokyo (JP); Nippon Shokubai Co., Ltd., Osaka (JP)

( * ) Notice: Subject to any disclaimer, the term of this patent is extended or adjusted under 35 U.S.C. 154(b) by 113 days.

(21) Appl. No.: 15/573,375

(22) PCT Filed: Mar. 17, 2016

(86) PCT No.: PCT/JP2016/058615
§ 371 (c)(1),
(2) Date: Mar. 6, 2018

(87) PCT Pub. No.: WO2016/181705
PCT Pub. Date: Nov. 17, 2016

(65) Prior Publication Data
US 2019/0081239 A1    Mar. 14, 2019

(30) Foreign Application Priority Data
May 11, 2015    (JP) .............................. JP2015-096928

(51) Int. Cl.
*H01L 51/00* (2006.01)
*H01L 51/50* (2006.01)
(Continued)

(52) U.S. Cl.
CPC ........ *H01L 51/008* (2013.01); *H01L 51/0067* (2013.01); *H01L 51/0072* (2013.01);
(Continued)

(58) Field of Classification Search
CPC ............... H01L 51/008; H01L 51/0067; H01L 51/0072; H01L 51/5012; H01L 51/5206;
(Continued)

(56) References Cited

U.S. PATENT DOCUMENTS 4,929,782 A * 5/1990 Venier ..................... C07C 2/861
585/375
5,817,430 A * 10/1998 Hsieh ..................... C08G 61/02
428/690

(Continued)

FOREIGN PATENT DOCUMENTS

JP     4-085389          3/1992
JP     04085389 A  *    3/1992

(Continued)

OTHER PUBLICATIONS

Lavrentiev et al., "A Theoretical Investigation of the Low Lying Electronic Structure of Poly(p-phenylene vinylene)", Jan. 13, 1999, http://arxiv.org/abs/cond-mat/9901115v1 (Year: 1999).*

(Continued)

*Primary Examiner* — Alexander O Williams
(74) *Attorney, Agent, or Firm* — Hamre, Schumann, Mueller & Larson, P.C.

(57) ABSTRACT

An organic thin film that imparts an excellent electron injection property when it is used as an electron injection layer of an organic EL device and a method for producing (Continued)

the organic thin film are provided. An organic thin film at least includes: a first material which is an organic material having an acid dissociation constant pKa of 1 or greater; and a second material which transports an electron. The first material is at least one selected from the group consisting of tertiary amines, phosphazene compounds, guanidine compounds, heterocyclic compounds containing an amidine structure, hydrocarbon compounds having a ring structure, and ketone compounds.

21 Claims, 15 Drawing Sheets

(51) Int. Cl.
- H01L 51/52 (2006.01)
- H01L 27/32 (2006.01)
- H01L 51/05 (2006.01)
- H01L 51/42 (2006.01)

(52) U.S. Cl.
CPC ...... H01L 51/5012 (2013.01); H01L 51/5206 (2013.01); H01L 51/5221 (2013.01); H01L 27/32 (2013.01); H01L 51/0074 (2013.01); H01L 51/0097 (2013.01); H01L 51/0512 (2013.01); H01L 51/42 (2013.01); H01L 51/5056 (2013.01); H01L 51/5072 (2013.01); H01L 51/5092 (2013.01); H01L 2251/5353 (2013.01); H01L 2251/5361 (2013.01); Y02E 10/549 (2013.01); Y02P 70/50 (2015.11)

(58) Field of Classification Search
CPC ............ H01L 51/5211; H01L 51/0074; H01L 51/0097; H01L 51/0512; H01L 51/42; H01L 51/5056; H01L 51/5072; H01L 51/5092; H01L 2251/5361; H01L 2251/5353; H01L 51/00; H01L 51/50; H01L 51/52; H01L 27/32; Y02E 10/549; Y02P 70/50
USPC .......................................................... 257/40
See application file for complete search history.

(56) References Cited

U.S. PATENT DOCUMENTS

| | | | | |
|---|---|---|---|---|
| 8,803,134 | B2* | 8/2014 | Inoue | C09K 11/025 257/40 |
| 9,277,619 | B2* | 3/2016 | Hyuga | H01L 51/5016 |
| 9,306,186 | B2* | 4/2016 | Suematsu | H01L 51/5215 |
| 2004/0113542 | A1* | 6/2004 | Hsiao | H01L 51/5253 313/504 |
| 2006/0083944 | A1* | 4/2006 | Igarashi | H01L 51/0057 428/690 |
| 2007/0145355 | A1* | 6/2007 | Werner | B82Y 10/00 257/40 |
| 2008/0008884 | A1 | 1/2008 | Ishii et al. | |
| 2012/0252147 | A1 | 10/2012 | Takahashi | |
| 2013/0099224 | A1 | 4/2013 | Iijima et al. | |
| 2013/0134400 | A1* | 5/2013 | Tsutsui | H01L 51/504 257/40 |
| 2014/0001456 | A1* | 1/2014 | Mizutani | H01L 51/0067 257/40 |
| 2014/0042411 | A1* | 2/2014 | Fukuzaki | C07C 211/61 257/40 |
| 2014/0051827 | A1* | 2/2014 | Endo | C08G 73/026 528/405 |
| 2014/0103329 | A1* | 4/2014 | Ogiwara | H01L 51/5004 257/40 |
| 2014/0167026 | A1* | 6/2014 | Kato | H01L 51/0072 257/40 |
| 2014/0183500 | A1* | 7/2014 | Ikeda | C07D 409/14 257/40 |
| 2014/0209886 | A1* | 7/2014 | Ishidai | H01L 51/0072 257/40 |
| 2014/0306869 | A1* | 10/2014 | Fujita | C07F 15/0033 345/77 |
| 2014/0319510 | A1* | 10/2014 | Kageyama | H01L 51/0058 257/40 |
| 2014/0374720 | A1* | 12/2014 | Kato | C09B 57/00 257/40 |
| 2015/0115225 | A1* | 4/2015 | Kawamura | H01L 51/0067 257/40 |
| 2015/0123091 | A1* | 5/2015 | Hakii | H01L 51/5234 257/40 |
| 2015/0125679 | A1* | 5/2015 | Ishikawa | H01L 51/5253 428/216 |
| 2015/0188070 | A1* | 7/2015 | Ogiwara | H01L 51/0054 257/40 |
| 2015/0228904 | A1* | 8/2015 | Kawamura | H01L 51/0085 257/40 |
| 2015/0255726 | A1* | 9/2015 | Kawamura | H01L 51/0067 257/40 |
| 2016/0072082 | A1* | 3/2016 | Brooks | H01L 51/005 257/40 |
| 2016/0104845 | A1* | 4/2016 | Mizuki | C07D 403/14 257/40 |
| 2016/0163998 | A1* | 6/2016 | Saito | C07D 487/06 257/40 |
| 2017/0162802 | A1* | 6/2017 | Weaver | C07F 15/0033 |
| 2018/0375058 | A1* | 12/2018 | Kawamura | H01L 51/504 |
| 2020/0317609 | A1* | 10/2020 | Ota | C07C 309/75 |

FOREIGN PATENT DOCUMENTS

| | | |
|---|---|---|
| JP | 2003-045658 | 2/2003 |
| JP | 2006-278549 | 10/2006 |
| JP | 2008-016297 | 1/2008 |
| JP | 2010-045221 | 2/2010 |
| JP | 2012-128954 | 7/2012 |
| JP | 2012-216484 | 11/2012 |
| JP | 2013-053123 | 3/2013 |
| JP | 2013053123 A * | 3/2013 |
| JP | 2013-100239 | 5/2013 |
| JP | 2014-040067 | 3/2014 |
| JP | 2015-079838 | 4/2015 |
| WO | 2011/070841 | 6/2011 |

OTHER PUBLICATIONS

Walzer, et al., "Highly Efficient Organic Devices Based on Electrically Doped Transport Layers", Chem. Rev. 2007, 107, pp. 1233-1271.

Wei, et al., "Use of 1H-Benzoimidazole Derivative as an n-Type Dopant and to Enable Air-Stable Solution-Processed n-Channel Organic Thin-Film Transistors", J. Am. Chem. Soc., 2010, 132, pp. 8852-8853.

Chen, et al., "Solution-processable small molecules as efficient universal bipolar host for blue, green and red phosphorescent inverted OLEDs", J. Mater. Chem, 2012, 22, pp. 5164-5170.

Choi, et al., "Combination of Titanium Oxide and a Conjugated Polyelectrolyte for High-Performance Inverted-Type Organic Optoelectronic Devices", Adv. Mater. 2011, 23, pp. 2759-2763.

Zhou, et al., "A Universal Method to Produce Low-Work Function Electrodes for Organic Electronics", Science, 336 (6079), Apr. 20, 2012, pp. 327-332.

Kim, et al., "Polyethylene Imine as an Ideal Interlayer for Highly Efficient Inverted Polymer Light-Emitting Diodes", Adv. Funct. Mater., 2014, 24, pp. 3808-3814.

Hofle, et al., "Enhanced Electron Injection into Inverted Polymer Light-Emitting Diodes by Combined Solution-Processed Zinc Oxide/Polyethylenimine Interlayers", Adv. Mater., 2014, 26, pp. 2750-2754.

Hofle, et al., "Solution Processed, White Emitting Tandem Organic Light-Emitting Diodes with Inverted Device Architecture", Adv. Mater. 2014, 26, pp. 5155-5159.

\* cited by examiner

ORGANIC THIN FILM AND METHOD FOR MANUFACTURING ORGANIC THIN FILM, ORGANIC ELECTROLUMINESCENCE ELEMENT, DISPLAY DEVICE, ILLUMINATION DEVICE, ORGANIC THIN FILM SOLAR CELL, THIN FILM TRANSISTOR, AND COATING COMPOSITION

TECHNICAL FIELD

The present invention relates to an organic thin film, a method for producing an organic thin film, an organic electroluminescence (hereinafter, electroluminescence is also referred to as "EL") device, a display device, a lighting system, an organic thin-film solar cell, a thin-film transistor, and a coating composition.

BACKGROUND ART

Organic EL devices are thin, soft, and flexible. Display devices including organic EL devices are capable of providing higher brightness, higher definition display than currently dominant liquid crystal display devices and plasma display devices. Further, display devices including organic EL devices have a wider viewing angle than liquid crystal display devices. Thus, organic EL display devices are expected to be widely used, for example, as displays of TVs and mobiles.

In addition, organic EL devices are also expected to be used as lighting systems.

Organic EL devices are each a laminate of a cathode, an emitting layer, and an anode. In organic EL devices, the energy difference between the work function of the anode and the highest occupied molecular orbital (HOMO) of the emitting layer is smaller than the energy difference between the work function of the cathode and the lowest unoccupied molecular orbital (LUMO) of the emitting layer. It is therefore more difficult to inject electrons into the emitting layer from the cathode than to inject holes into the emitting layer from the anode. For this reason, in conventional organic EL devices, an electron injection layer is placed between the cathode and the emitting layer to promote injection of electrons from the cathode to the emitting layer. In addition, the electron injection property and the electron transport performance are improved by doping dopants in a layer between the cathode and the emitting layer (see, for example, Non-patent documents 1 and 2).

An example of the electron injection layer of an organic EL device is an inorganic oxide layer (see, for example, Non-patent document 3). However, the inorganic oxide layer is poor in electron injection property.

The electron injection property of an organic EL device can be improved by forming an additional electron injection layer on an inorganic oxide layer. For example, Non-patent document 4 discloses an organic EL device that includes an electron injection layer formed from polyethyleneimine. Further, Non-patent document 5 discloses that amines effectively improve the injection rate of electrons. Non-patent documents 6, 7, and 8 disclose the effects of an amino group on electron injection at an interface between an electrode and an organic layer.

CITATION LIST

Non-Patent Document

Non-patent document 1: Karsten Walzer and three others, "Chemical Review", Vol. 107, 2007, pp. 1233-1271

Non-patent document 2: Peng Wei and three others, "Journal of the American Chemical Society", Vol. 132, 2010, p. 8852

Non-patent document 3: Jiangshan Chen and six others, "Journal Of Materials Chemistry", Vol. 22, 2012, pp. 5164-5170

Non-patent document 4: Hyosung Choi and eight others, "Advanced Materials", Vol. 23, 2011, p. 2759

Non-patent document 5: Yinhua Zho and 21 others, "Science", Vol. 336, 2012, p. 327

Non-patent document 6: Young-Hoon Kim and five others, "Advanced Functional Materials", 2014, DOI: 10.1002/adfm.201304163

Non-patent document 7: Stefan Hofle and four others, "Advanced Materials", 2014, DOI: 10.1002/adma.201304666

Non-patent document 8: Stefan Hofle and five others, "Advanced Materials", Vol. 26, 2014, DOI: 10.1002/adma.201400332

Non-patent document 9: Peng Wei and three others, "Journal of the American Chemical Society", Vol. 132, 2010, p. 8852

SUMMARY OF INVENTION

Technical Problem

However, organic EL devices including a conventional electron injection layer need to be further improved so that the electron injection property is further enhanced.

The present invention has been made in view of the above-mentioned circumstances, and aims to provide an organic thin film that imparts an excellent electron injection property when it is used as an electron injection layer of an organic EL device, a coating composition suitable for producing the organic thin film, and a method for producing the organic thin film.

The present invention also aims to provide an organic EL device including the organic thin film of the present invention, a display device and a lighting system each including the organic EL device, and an organic thin-film solar cell and an organic thin-film transistor each including the organic thin film of the present invention.

Solution to Problem

The present inventors focused on and examined basic organic materials as materials for producing an electron injection layer of an organic EL device. As a result of the examination, the inventors found that an organic thin film containing an electron transport material and any one or two or more organic materials having an acid dissociation constant pKa of 1 or greater selected from the group consisting of tertiary amines, phosphazene compounds, guanidine compounds, heterocyclic compounds containing an amidine structure, hydrocarbon compounds having a ring structure, and ketone compounds is suitably used as an electron injection layer of an organic EL device.

That is, the organic materials having a pKa of 1 or greater are capable of extracting a proton ($H^+$) from other materials. Thus, it is presumable that, in an organic EL device having an electron injection layer formed from such an organic thin film, the organic material having a pKa of 1 or greater extracts a proton (W) from the electron transport material, so that a negative charge is generated, leading to enhancement of the electron injection property.

The present invention has been accomplished based on the above findings, and the following describes the summary thereof.

[1] An organic thin film at least including:
a first material which is an organic material having an acid dissociation constant pKa of 1 or greater; and
a second material which transports an electron,
the first material being one or two or more selected from the group consisting of tertiary amines, phosphazene compounds, guanidine compounds, heterocyclic compounds containing an amidine structure, hydrocarbon compounds having a ring structure, and ketone compounds.

[2] The organic thin film according to [1], wherein the second material is at least one compound selected from the group consisting of boron-containing compounds represented by formulas (14), (37), (39), (16), and (18):

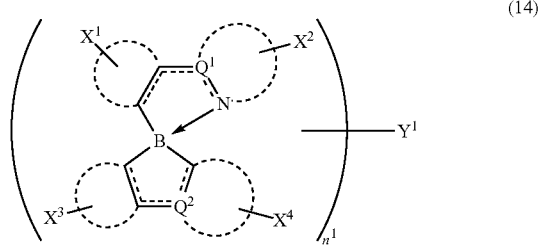

(14)

wherein the dotted arcs indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^1$ and $Q^2$ are the same as or different from each other and each represent a linking group in the backbone shown in the solid lines, at least part of the linking group forms a ring structure with a dotted arc portion and is optionally substituted; $X^1$, $X^2$, $X^3$, and $X^4$ are the same as or different from each other and each represent a hydrogen atom or a monovalent substituent as a substituent in the corresponding ring structure; each of the ring structures forming the dotted arc portions optionally contains multiple $X^1$s, multiple $X^2$s, multiple $X^3$s, or multiple $X^4$s; $n^1$ represents an integer of 2 to 10; and $Y^1$ represents a direct bond or an $n^1$-valent linking group and bonds to each of $n^1$ structural units other than $Y^1$ independently at any one site selected from the ring structures forming the dotted arc portions, $Q^1$, $Q^2$, $X^1$, $X^2$, $X^3$, and $X^4$;

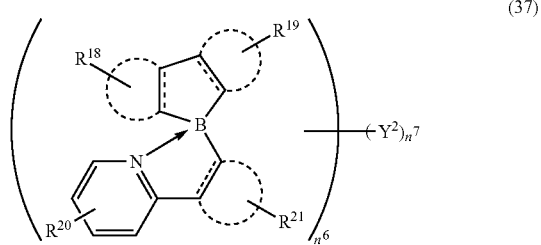

(37)

wherein the dotted arcs are the same as or different from each other and indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $R^{18}$ to $R^{21}$ are the same as or different from each other and each represent a hydrogen atom, a monovalent substituent as a substituent in the corresponding ring structure, a divalent group, or a direct bond; each of the ring structures forming the dotted arc portions optionally contains multiple $R^{18}$s, multiple $R^{19}$s, or multiple $R^{21}$s; the pyridine ring structure optionally contains multiple $R^{20}$s; the ring to which $R^{21}$ is bonded is an aromatic heterocyclic ring; $n^6$ is an integer of 1 to 4; $n^7$ is 0 or 1; when $n^7$ is 1, $Y^2$ represents an $n^6$-valent linking group or a direct bond and bonds to each of $n^6$ structural units other than $Y^2$ independently at any one site selected from $R^{18}$, $R^{19}$, $R^{20}$, and $R^{21}$; and when $n^7$ is 0, $n^6$ is 1 and at least one of $R^{18}$ to $R^{21}$ represents a monovalent substituent as a substituent in the corresponding ring structure;

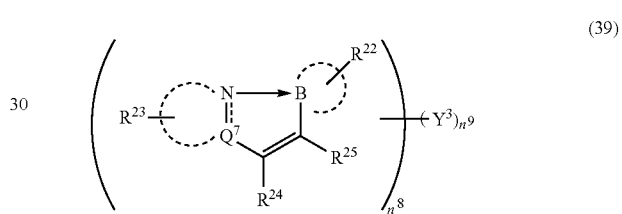

(39)

wherein the dotted arcs indicate that ring structures are formed with the boron atom or the backbone shown in the solid lines; the ring structures are the same as or different from each other and are each optionally a monocyclic structure constituted by one ring or a fused ring structure constituted by multiple rings; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^7$ represents a linking group in the backbone shown in the solid lines, at least part of the linking group forms a ring structure with a dotted arc portion and is optionally substituted; $R^{22}$ and $R^{23}$ are the same as or different from each other and each represent a hydrogen atom, a monovalent substituent as a substituent in the corresponding ring structure, a divalent group, or a direct bond; each of the ring structures forming the dotted arc portions optionally contains multiple $R^{22}$s or multiple $R^{23}$s; $R^{24}$ and $R^{25}$ are the same as or different from each other and each represent a hydrogen atom, a monovalent substituent, a divalent group, or a direct bond; $R^{24}$ and $R^{25}$ are not bonded to each other and do not form a ring structure with the backbone portion shown in the double line; $n^8$ is an integer of 1 to 4; $n^9$ is 0 or 1; when $n^9$ is 1, $Y^3$ represents an $n^8$-valent linking group or a direct bond and bonds to each of $n^8$ structural units other than $Y^3$ independently at any one site selected from $R^{22}$, $R^{23}$, $R^{24}$, and $R^{25}$; and

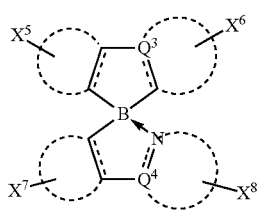

(16)

wherein the dotted arcs indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^3$ and $Q^4$ are the same as or different from each other and each represent a linking group in the backbone shown in the solid lines, at least part of the linking group forms a ring structure with a dotted arc portion and is optionally substituted; $X^5$ and $X^6$ are the same as or different from each other and each represent a hydrogen atom or a monovalent substituent as a substituent in the corresponding ring structure; $X^7$ and $X^8$ are the same as or different from each other and each represent a monovalent substituent having electron transporting property as a substituent in the corresponding ring structure; and each of the ring structures forming the dotted arc portions optionally contains multiple $X^5$s, multiple $X^6$s, multiple $X^7$s, or multiple $X^8$s;

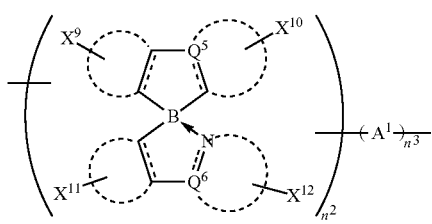

(18)

wherein the dotted arcs indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^5$ and $Q^6$ are the same as or different from each other and each represent a linking group in the backbone shown in the solid lines, at least part of the linking group forms a ring structure with a dotted arc portion and is optionally substituted; $X^9$, $X^{10}$, $X^{11}$, and $X^{12}$ are the same as or different from each other and each represent a hydrogen atom, a monovalent substituent as a substituent in the corresponding ring structure, or a direct bond; each of the ring structures forming the dotted arc portions optionally contains multiple $X^9$s, multiple $X^{10}$s, multiple $X^{11}$s, or multiple $X^{12}$s; $A^1$s are the same as or different from each other and each represent a divalent group; the structural unit in a parenthesis marked with $n^2$ bonds to its adjacent structural units via any two of $X^9$, $X^{10}$, $X^{11}$, and $X^{12}$; and $n^2$ and $n^3$ are the same as or different from each other and each independently represent 1 or greater.

[3] The organic thin film according to [1] or [2], wherein the second material is any one of boron-containing compounds represented by formulas (1), (14-2), and (21-2) and a phosphine oxide derivative represented by formula (2):

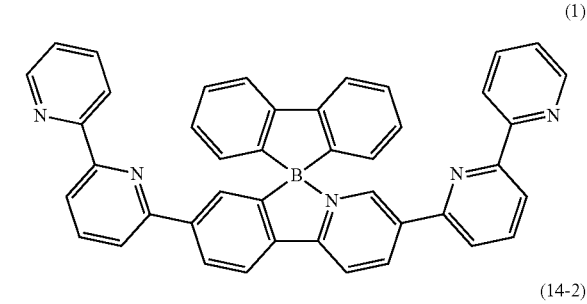

(1)

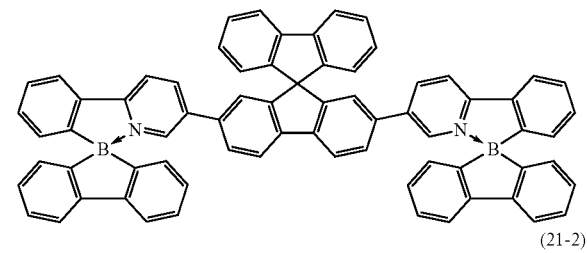

(14-2)

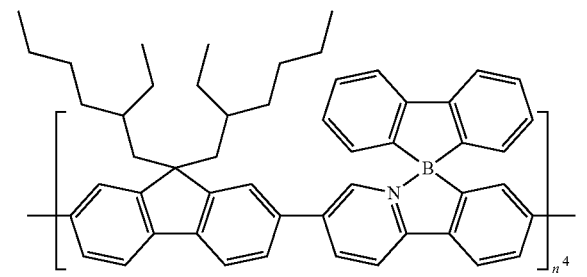

(21-2)

in formula (21-2), $n^4$ represents 1 or greater; and

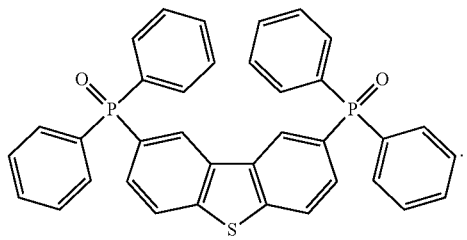

(2)

[4] The organic thin film according to any one of [1] to [3], wherein the acid dissociation constant pKa of the first material is 11 or greater.

[5] A laminate film including:

an oxide layer; and the organic thin film according to any one of [1] to [4] formed on the oxide layer.

[6] An organic electroluminescence device including:

a cathode;

an anode;

an emitting layer between the electrodes; and the organic thin film according to any one of [1] to [4] or the laminate film according to [5] between the cathode and the emitting layer.

[7] The organic electroluminescence device according to [6], wherein the organic thin film has an average thickness of 5 to 100 nm.

[8] The organic electroluminescence device according to [6] or [7], further including an inorganic oxide layer between the cathode and the organic thin film.

[9] A display device including the organic electroluminescence device according to any one of [6] to [8].

[10] A lighting system including the organic electroluminescence device according to any one of [6] to [8].

[11] An organic thin-film solar cell including the organic thin film according to any one of [1] to [4] or the laminate film according to [5].

[12] A thin-film transistor including the organic thin film according to any one of [1] to [4] or the laminate film according to [5].

[13] A method for producing the organic thin film according to any one of [1] to [4], the method including applying a coating composition that at least contains the first material and the second material to a surface on which the organic thin film is to be formed.

[14] A coating composition at least including:
a first material which is an organic material having an acid dissociation constant pKa of 1 or greater; and
a second material which transports an electron,
the first material being one or two or more selected from the group consisting of tertiary amines, phosphazene compounds, guanidine compounds, heterocyclic compounds containing an amidine structure, hydrocarbon compounds having a ring structure, and ketone compounds.

[15] The coating composition according to [14], wherein the acid dissociation constant pKa of the first material is 11 or greater.

Advantageous Effects of Invention

The organic thin film of the present invention at least contains a first material composed of a specific organic material having an acid dissociation constant pKa of 1 or greater and a second material which transports an electron. Therefore, when such an organic thin film of the present invention is used as, for example, an electron injection layer in an organic EL device, the organic EL device can impart an excellent electron injection property.

The organic EL device of the present invention, which includes the organic thin film of the present invention between the cathode and the emitting layer, can impart an excellent electron injection property owing to the organic thin film.

The organic thin film of the invention can be easily formed by the method for producing an organic thin film of the present invention that includes applying a coating composition, to a surface on which the organic thin film is to be formed, which contains the first material composed of a specific organic material having an acid dissociation constant pKa of 1 or greater and the second material which transports an electron. Also, the method for producing an organic thin film of the present invention can provide an organic thin film having a smooth surface. This organic thin film, when used as an electron injection layer of an organic EL device, can sufficiently prevent leakage during the production process.

The coating composition of the present invention contains the first material which is composed of a specific organic material having an acid dissociation constant pKa of 1 or greater and a second material which transports an electron. Therefore, an organic thin film suitable for an electron injection layer of an organic EL device can be obtained by applying the coating composition of the present invention to a surface on which the organic thin film is to be formed.

The display device and the lighting system of the present invention each include the organic EL device of the present invention, and are therefore driven at a low voltage and have excellent characteristics.

In addition, the organic thin-film solar cell and the organic thin-film transistor of the present invention each include the organic thin film of the present invention, and therefore have excellent characteristics.

DESCRIPTION OF EMBODIMENTS

Figure 1:
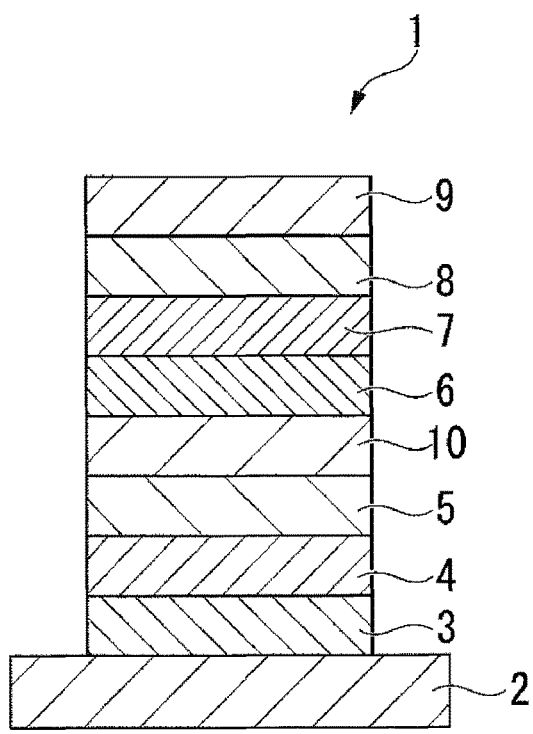
FIG. 1 is an explanatory cross-sectional view schematically showing an example of the organic EL device of the present invention.

The present invention will be described in detail below.
"Organic thin film"

The organic thin film of the present embodiment at least contains a first material which is an organic material having an acid dissociation constant pKa of 1 or greater and a second material which transports an electron. The first material of the present embodiment is composed of one or two or more selected from the group consisting of tertiary amines, phosphazene compounds, guanidine compounds, heterocyclic compounds containing an amidine structure, hydrocarbon compounds having a ring structure, and ketone compounds.

Since the first material constituting the organic thin film of the present embodiment is an organic material having a pKa of 1 or greater, it can extract a proton (H$_+$) from the second material. The first material preferably has a pKa of 5 or greater, more preferably 11 or greater. The higher the pKa of the first material, the higher the ability of the first material to extract a proton from the second material. As a result, an organic EL device including the organic thin film, for example, as an electron injection layer can achieve an excellent electron injection property. Further, it is confirmed that the first material is suitably placed at a defective portion of an inorganic compound to prevent reaction at an interface with oxygen or water entering from the outside, leading to an increase in atmospheric stability of the device.

Therefore, the organic thin film of the present invention may be used not only in a device consisting only of an organic compound, but also in, in particular, a device formed from an organic compound and an inorganic compound, and can improve the electron injection property and the atmospheric stability.

In the present invention, the "pKa" usually means the "acid dissociation constant in water". When the pKa cannot be measured in water, it means the "acid dissociation constant in dimethyl sulfoxide (DMSO)", and when the pKa cannot be measured even in DMSO, it means the "acid dissociation constant in acetonitrile". The pKa preferably means the "acid dissociation constant in water".

The tertiary amines (tertiary amine derivatives) used as the first material each may be a chain or cyclic amine compound, and when the tertiary amine is a cyclic amine compound, it may be a heterocyclic amine compound such as an aliphatic amine or an aromatic amine. The tertiary amine preferably contains 1 to 4 amino groups, more preferably 1 or 2 amino groups. Further, the amine compound may contain an alkyl group, an alkylamino group, or an alkoxy group. Specific examples of the amine compound include (mono, di, tri) alkylamines, aromatic amines containing 1 to 3 alkylamino groups, and aromatic amines containing 1 to 3 alkoxy groups.

The tertiary amine preferably does not contain a primary amine or a secondary amine. Specific examples of the tertiary amine used as the first material include dialkylaminopyridines such as dimethylaminopyridines (DMAP) represented by formula (3) or (4), amines having a structure represented by NR$^1$R$^2$R$^3$, such as triethylamine represented by formula (5) (wherein R$^1$, R$^2$, and R$^3$ are the same as or different from each other, and each represent a hydrocarbon group which may optionally be substituted), and acridine orange (AOB) represented by formula (43). The hydrocarbon group contains preferably 1 to 30 carbon atoms, more preferably 1 to 8 carbon atoms, still more preferably 1 to 4 carbon atoms, further more preferably 1 or 2 carbon atoms. When the hydrocarbon group is substituted, the above number of carbon atoms preferably indicates the total number of carbon atoms of the hydrocarbon group and a substituent thereof. Examples of the hydrocarbon group include an alkyl group, an alkenyl group, and an alkynyl group. Preferred is an alkyl group. Examples of the substituent of the hydrocarbon group when it is substituted include a halogen atom, a heterocyclic group, a cyano group, a hydroxy group, an alkoxy group, an aryloxy group, and an amino group. The dimethylaminopyridines are preferably those in which an electron-donating dimethylamino group is bonded to a pyridine ring at position 2 (2-DMAP) or position 4 (4-DMAP). In particular, 4-dimethylaminopyridine in which a dimethylamino group is bonded to a pyridine ring at position 4 is preferred because it has a high pKa and an organic EL device including, as an electron injection layer, an organic thin film containing 4-dimethylaminopyridine has a long life.

The tertiary amine used as the first material may also be an alkoxypyridine derivative such as a methoxypyridine derivative. The alkoxy group is preferably a C1-C30 alkoxy group, more preferably a C1-C8 alkoxy group, still more preferably a C1-C4 alkoxy group, further more preferably a C1-C2 alkoxy group. The alkoxypyridine derivative may also include a compound having a structure in which one or two or more hydrogen atoms of the alkoxypyridine are replaced by a substituent. Examples of the substituent include those mentioned as substituents for the hydrocarbon group of the tertiary amines.

The methoxypyridine derivative is preferably 4-methoxypyridine (4-MeOP) represented by formula (6) in which a methoxy group is bonded to a pyridine ring at position 4 or 3-methoxypyridine (3-MeOP) represented by formula (7) in which a methoxy group is bonded to a pyridine ring at position 3. In particular, 4-methoxypyridine in which a methoxy group is bonded to a pyridine ring at position 4 is preferred because it has a high pKa.

The tertiary amine preferably includes one or two or more selected from heterocyclic aromatic amines containing a dialkylamino group and/or an alkoxy group and trialkylamines. In order to enhance the electron injection property and increase in life, one or two or more selected from dialkylaminopyridines, trialkylamines, and alkoxypyridine derivatives are particularly preferably used.

The first material may also be a heterocyclic compound containing an amidine structure. The amidine structure refers to a structure represented by $R^1$—C(=$NR^2$)—$NR^3R^4$ (wherein $R^1$ to $R^3$ are the same as or different from each other and each represent a hydrogen atom or a hydrocarbon group). Examples of the heterocyclic compound containing an amidine structure include diazabicyclononene derivatives and diazabicycloundecene derivatives.

Examples of the diazabicyclononene derivatives include 1,5-diazabicyclo[4.3.0]nonene-5 (DBN) represented by formula (8). DBN is preferred because an organic EL device including an organic thin film containing DBN as an electron injection layer can have a long life.

Examples of the diazabicycloundecene derivatives include 1,8-diazabicyclo[5.4.0]undecene-7 (DBU) represented by formula (9). The diazabicyclononene derivatives may also include compounds having a structure in which one or two or more hydrogen atoms of the diazabicyclononene are replaced by a substituent. The diazabicycloundecene derivatives may also include compounds having a structure in which one or two or more hydrogen atoms of the diazabicycloundecene are replaced by a substituent. Examples of the substituent include those mentioned as substituents for the hydrocarbon group of the tertiary amines.

The phosphazene compounds (phosphazene base derivatives) are compounds having, for example, a structure represented by formula (35):

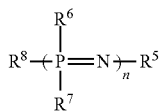

(35)

wherein $R^5$ represents a hydrogen atom or a hydrocarbon group; $R^6$ to $R^8$ each represent a hydrogen atom, a hydrocarbon group, —NR'R" (wherein R' and R" each independently represent a hydrogen atom or a hydrocarbon group), or a group represented by formula (36); and n represents 1 to 5.

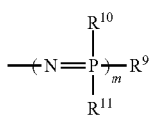

(36)

In formula (36), $R^9$ to $R^{11}$ each represent a hydrogen atom, a hydrocarbon group, or —NR'R" (wherein R' and R" each independently represent a hydrogen atom or a hydrocarbon group), and m represents 1 to 5.

The hydrocarbon group in formulas (35) and (36) is preferably a C1-C8 group, more preferably a C1-C4 group. The hydrocarbon group is preferably an alkyl group. $R^5$ is particularly preferably a tertiary butyl group.

Examples of the phosphazene base derivatives include a phosphazene base P2-t-Bu represented by formula (10).

The guanidine compounds are compounds having a structure represented by formula (42):

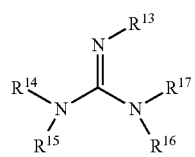

(42)

wherein $R^{13}$ to $R^{17}$ are the same as or different from each other and each represent a hydrogen atom or a hydrocarbon group, and two or more of $R^{13}$ to $R^{17}$ may be bonded to form a cyclic structure.

The guanidine compounds may be guanidine cyclic derivatives, for example. Examples of the guanidine cyclic derivatives include 7-methyl-1,5,7-triazabicyclo[4.4.0]deca-5-en (MTBD) represented by formula (11) and 1,5,7-triazabicyclo[4.4.0]deca-5-en (TBD) represented by formula (12).

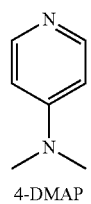

(3)

4-DMAP

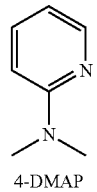

(4)

4-DMAP

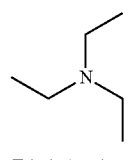

(5)

Triethyl amine

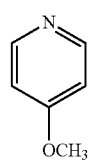

(6)

4-MeOP

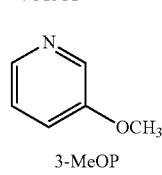

(7)

3-MeOP

(8)

DBN

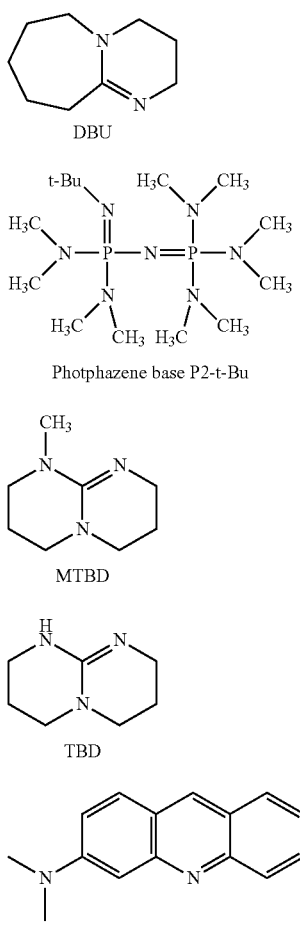

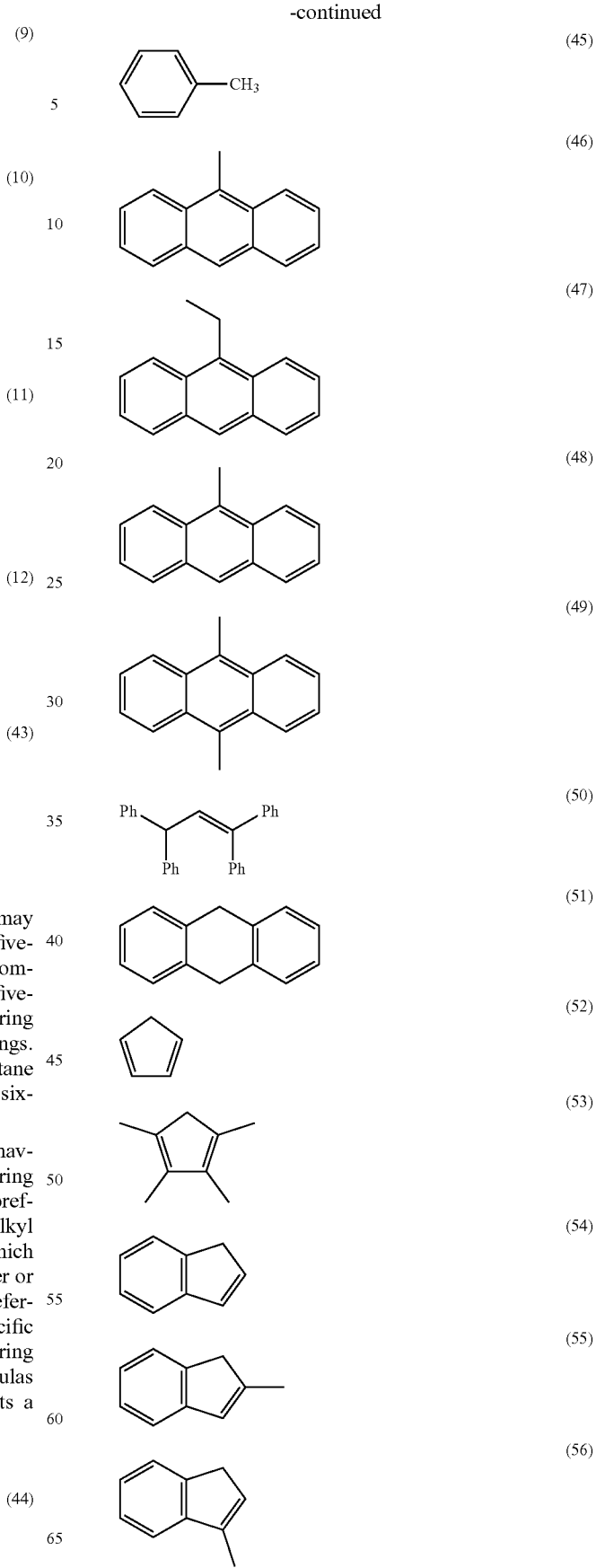

The hydrocarbon compounds having a ring structure may preferably be compounds having, as a ring structure, a five- or six-membered ring, and may also preferably be compounds having a fused ring structure formed from a five-membered ring and a six-membered ring or a fused ring structure formed from multiple six-membered rings. Examples of the five-membered ring include a cyclopentane ring and a cyclopentadiene ring, and examples of the six-membered ring include a benzene ring.

Preferred examples of the hydrocarbon compounds having a ring structure include compounds consisting of a ring structure, compounds in which a C1-C20 alkyl group, preferably a C1-C10 alkyl group, more preferably a C1-C5 alkyl group is bonded to a ring structure, and compounds in which multiple ring structures are directly bonded to each other or are bonded via a C1-C20, preferably C1-C10, more preferably C1-C5 hydrocarbon as a linking group. Specific examples of the hydrocarbon compounds having a ring structure include the compounds represented by formulas (44) to (57). In formulas (50) and (57), Ph represents a phenyl group.

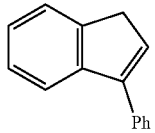

The ketone compounds are preferably C2-C30 ketones, and may have a cyclic structure. Specific examples of the ketone compounds include methyl ethyl ketone (MEK), acetone, diethyl ketone, methyl isobutyl ketone (MIBK), methyl isopropyl ketone (MIPK), diisobutyl ketone (DIBK), 3,5,5-trimethylcyclohexanone, diacetone alcohol, cyclopentanone, and cyclohexanone.

The first material may include one or two or more selected from tertiary amine derivatives, methoxypyridine derivatives, diazabicyclononene derivatives, diazabicycloundecene derivatives, phosphazene base derivatives, and guanidine cyclic derivatives.

The second material has only to be an electron transport material, and is preferably an organic material, more preferably an organic material having a lowest unoccupied molecular orbital (LUMO) level of 2.0 eV to 4.0 eV. Particularly preferred is an n-type organic semiconductor material having a LUMO level of 2.5 eV to 3.5 eV. For example, any of the below-described conventionally known materials may be used as a material of an electron transport layer of an organic EL device. In particular, materials satisfying the requirement of the above LUMO level are preferred.

Specific examples of the second material include phosphine oxide derivatives such as phenyl-dipyrenylphosphine oxide (POPy$_2$); pyridine derivatives such as tris-1,3,5-(3'-(pyridin-3"-yl)phenyl)benzene (TmPhPyB); quinoline derivatives such as (2-(3-(9-carbazolyl)phenyl) quinoline (mCQ)); pyrimidine derivatives such as 2-phenyl-4,6-bis(3,5-dipyridylphenyl)pyrimidine (BPyPPM); pyrazine derivatives; phenanthroline derivatives such as bathophenanthroline (BPhen); triazine derivatives such as 2,4-bis(4-biphenyl)-6-(4'-(2-pyridinyl)-4-biphenyl)-[1,3,5]triazine (MPT); triazole derivatives such as 3-phenyl-4-(1'-naphthyl)-5-phenyl-1,2,4-triazole (TAZ); oxazole derivatives; oxadiazole derivatives such as 2-(4-biphenyl)-5-(4-tert-butylphenyl-1,3,4-oxadiazole) (PBD); imidazole derivatives such as 2,2',2"-(1,3,5-benzenetriyl)-tris(1-phenyl-1-H-benzimidazole) (TPBI); aromatic ring tetracarboxylic anhydrides such as naphthalene and perylene; various metal complexes typified by bis[2-(2-hydroxyphenyl)benzothiazolato]zinc (Zn(BTZ)$_2$) and tris(8-hydroxyquinolinato)aluminum (Alq$_3$); organic silane derivatives typified by silole derivatives such as 2,5-bis(6'-(2',2"-bipyridyl))-1,1-dimethyl-3,4-diphenylsilole (PyPySPyPy); and boron-containing compounds disclosed in Japanese Patent Application No. 2012-228460, Japanese Patent Application No. 2015-503053, Japanese Patent Application No. 2015-053872, Japanese Patent Application No. 2015-081108, and Japanese Patent Application No. 2015-081109. Each of these may be used alone or two or more of these may be used.

Preferred among these examples of the second material are phosphine oxide derivatives such as POPy$_2$, boron-containing compounds, metal complexes such as Alq$_3$, and pyridine derivatives such as TmPhPyB. In particular, the second material is preferably any one of boron-containing compounds represented by formulas (1), (14-2), and (21-2) and the phosphine oxide derivative represented by formula (2).

Examples of the boron-containing compounds each used as the second material include a boron-containing compound represented by formula (14):

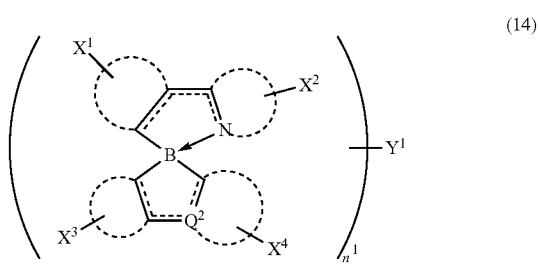

(14)

wherein the dotted arcs indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^1$ and $Q^2$ are the same as or different from each other and each represent a linking group in the backbone shown in the solid lines, at least part of the linking group forms a ring structure with a dotted arc portion and is optionally substituted; $X^1$, $X^2$, $X^3$, and $X^4$ are the same as or different from each other and each represent a hydrogen atom or a monovalent substituent as a substituent in the corresponding ring structure; each of the ring structures forming the dotted arc portions optionally contains multiple $X^1$s, multiple $X^2$s, multiple $X^3$s, or multiple $X^4$s; $n^1$ represents an integer of 2 to 10; and $Y^1$ represents a direct bond or an $n^1$-valent linking group and bonds to each of $n^1$ structural units other than $Y^1$ independently at any one site selected from the ring structures forming the dotted arc portions, $Q^1$, $Q^2$, $X^1$, $X^2$, $X^3$, and $X^4$.

In formula (14), the dotted arcs indicate that ring structures are formed with the backbone shown in the solid lines, specifically, with part of the backbone portions connecting the boron atom, $Q^1$, and the nitrogen atom or with part of the backbone portions connecting the boron atom and $Q^2$. This indicates that the compound represented by formula (14) has at least four ring structures, and these ring structures incorporate the backbone portions connecting the boron atom, $Q^1$, and the nitrogen atom and the backbone portions connecting the boron atom and $Q^2$ in formula (14). The backbone portion of a ring structure to which $X^1$ is bonded preferably consists of only carbon atoms.

In formula (14), the dotted line portions of the backbone shown in the solid lines, specifically, the dotted line portions of the backbone portions connecting the boron atom, $Q^1$, and the nitrogen atom and the dotted line portions of the backbone portions connecting the boron atom and $Q^2$ each indicate that a pair of atoms connected by the corresponding dotted line in the corresponding backbone portion may optionally be bonded by a double bond.

In formula (14), the arrow from the nitrogen atom to the boron atom indicates that the nitrogen atom is coordinated to the boron atom. The term "coordinated" as used herein means that the nitrogen atom acts as a ligand and chemically affects the boron atom. These atoms may or may not form a coordination bond (covalent bond). Preferably, these atoms form a coordination bond.

In formula (14), $Q^1$ and $Q^2$ are the same as or different from each other and each represent a linking group in the backbone shown in the solid lines, at least part of the linking group forms a ring structure with a dotted arc portion and is optionally substituted. This means that each ring structure incorporates $Q^1$ or $Q^2$.

In formula (14), $X^1$, $X^2$, $X^3$, and $X^4$ are the same as or different from each other and each represent a hydrogen atom or a monovalent substituent as a substituent in the corresponding ring structure; each of the ring structures forming the dotted arc portions optionally contains multiple $X^1$s, multiple $X^2$s, multiple $X^3$s, or multiple $X^4$s. Specifically, when $X^1$, $X^2$, $X^3$, and $X^4$ each represent a hydrogen atom, the four ring structures containing $X^1$, $X^2$, $X^3$, and $X^4$ have no substituent in the structure of the compound represented by formula (14); when at least one or all of $X^1$, $X^2$, $X^3$, and $X^4$ represent a monovalent substituent, at least one or all of these four ring structures have a substituent. In this case, the number of substituents in one ring structure may be one or two or more.

The term "substituent" as used herein encompasses carbon-containing organic groups and non-carbon-containing groups such as a halogen atom and a hydroxy group.

In formula (14), $n^1$ represents an integer of 2 to 10 and $Y^1$ represents a direct bond or an $n^1$-valent linking group. Specifically, in the compound represented by formula (14), $Y^1$ represents a direct bond and two structural units other than $Y^1$ are independently bonded together at any one site selected from the ring structures forming the dotted arc portions, $Q^1$, $Q^2$, $X^1$, $X^2$, $X^3$, and $X^4$, or $Y^1$ represents an $n^1$-valent linking group and multiple structural units other than $Y^1$ in formula (14) are present and bonded together via the linking group $Y^1$.

In formula (14), when $Y^1$ represents a direct bond, the direct bond is formed between any one site selected from the ring structures forming the dotted arc portions, $Q^1$, $Q^2$, $X^1$, $X^2$, $X^3$, and $X^4$ of one of the two structural units other than $Y^1$ and any one site selected from the ring structures forming the dotted arc portions, $Q^1$, $Q^2$, $X^1$, $X^2$, $X^3$, and $X^4$ of the other of the two structural units in formula (14). The binding position is not particularly limited, and a direct bond is preferably formed between a ring to which $X^1$ or $X^2$ is bonded in one of the two structural units other than $Y^1$ and a ring to which $X^1$ or $X^2$ is bonded in the other of the structural units. More preferably, a direct bond is formed between the ring to which $X^2$ is bonded in one of the structural units other than $Y^1$ and the ring to which $X^2$ is bonded in the other of the structural units. In this case, the structures of the two structural units other than $Y^1$ may be the same as or different from each other.

The structure represented by formula (14) in which $Y^1$ represents an $n^1$-valent linking group and multiple structural units other than $Y^1$ in formula (14) are present and bonded via $Y^1$ as a linking group is preferred because the structure can be more resistant to oxidation and improve the film-forming properties compared to a structure in which a direct bond is formed between the structural units other than $Y^1$.

When $Y^1$ represents an $n^1$-valent linking group, $Y^1$ bonds to each of $n^1$ structural units other than $Y^1$ independently at any one site selected from the ring structures forming the dotted arc portions, $Q^1$, $Q^2$, $X^1$, $X^2$, $X^3$, and $X^4$. This means that each of the structural units other than $Y^1$ has only to bond to $Y^1$ via any one site selected from the ring structures forming the dotted arc portions, $Q^1$, $Q^2$, $X^1$, $X^2$, $X^3$, and $X^4$. As for the binding sites of the structural units other than $Y^1$ to $Y^1$, the $n^1$ structural units other than $Y^1$ have the respective independent binding sites, and all or some binding sites may be the same as each other or all binding sites may be different from each other.

The binding position is not particularly limited. Yet, preferably, all of the $n^1$ structural units other than $Y^1$ are bonded to $Y^1$ via the ring to which $X^1$ or $X^2$ is bonded. More preferably, all of the $n^1$ structural units other than $Y^1$ are bonded to $Y^1$ via the ring to which $X^2$ is bonded.

In addition, all or some of the structures of the $n^1$ structural units other than $Y^1$ may be the same as each other or all of them may be different from each other.

When $Y^1$ in formula (14) represents an $n^1$-valent linking group, the linking group is exemplified by an optionally substituted linear, branched, or cyclic hydrocarbon group, an optionally substituted heteroatom-containing group, an optionally substituted aryl group, and an optionally substituted heterocyclic group. Preferred among these are groups having an aromatic ring, such as an optionally substituted aryl group and an optionally substituted heterocyclic group. Thus, it is another preferred embodiment of the present invention that $Y^1$ in formula (14) is a group containing an aromatic ring.

Further, $Y^1$ may represent a linking group having a structure in which a plurality of the linking groups is combined.

The linear, branched, or cyclic hydrocarbon group is preferably any of the groups represented by formulas, (2-1) to (2-8) below. More preferred among these are the groups represented by formulas (2-1) and (2-7) below.

The heteroatom-containing group is preferably any of the groups represented by formulas (2-9) to (2-13) below. More preferred among these are the groups represented by formulas (2-12) and (2-13) below.

The aryl group is preferably any of the groups represented by formulas (2-14) to (2-20) below. More preferred among these are the groups represented by formulas (2-14) and (2-20) below.

The heterocyclic group is preferably any of the groups represented by formulas (2-21) to (2-33) below. More preferred among these are the groups represented by formulas (2-23) and (2-24) below.

(2-1)

(2-2)

(2-3)

(2-4)

(2-5)

(2-6)

-continued
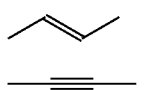 (2-7)
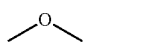 (2-8)
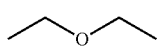 (2-9)
 (2-10)
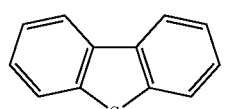 (2-11)
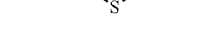 (2-12)
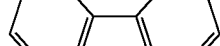 (2-13)
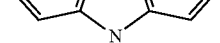 (2-14)
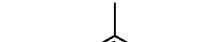 (2-15)
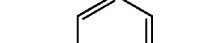 (2-16)
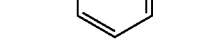 (2-17)
 (2-18)
 (2-19)
 (2-20)
 (2-21)
-continued
 (2-22)
 (2-23)
 (2-24)
 (2-25)
 (2-26)
 (2-27)
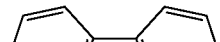 (2-28)
 (2-29)
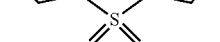 (2-30)
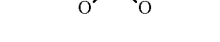 (2-31)

(2-32)

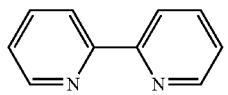

(2-33)

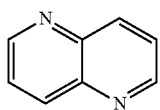

Examples of the substituents in the linear, branched, or cyclic hydrocarbon group, the heteroatom-containing group, the aryl group, and the heterocyclic group include halogen atoms such as fluorine, chlorine, bromine, and iodine atoms; haloalkyl groups such as fluoromethyl, difluoromethyl, and trifluoromethyl groups; C1-C20 linear or branched alkyl groups such as methyl, ethyl, propyl, isopropyl, butyl, isobutyl, and tert-butyl groups; C5-C7 cyclic alkyl groups such as cyclopentyl, cyclohexyl, and cycloheptyl groups; C1-C20 linear or branched alkoxy groups such as methoxy, ethoxy, propoxy, isopropoxy, butoxy, isobutoxy, tert-butoxy, pentyloxy, hexyloxy, heptyloxy, and octyloxy groups; a nitro group; a cyano group; C1-C10 alkyl-containing dialkylamino groups such as methylamino, ethylamino, dimethylamino, and diethylamino groups; diarylamino groups such as diphenylamino and carbazolyl groups; acyl groups such as acetyl, propionyl, and butyryl groups; C2-C30 alkenyl groups such as vinyl, 1-propenyl, allyl, and styryl groups; C2-C30 alkynyl groups such as ethynyl, 1-propynyl, and propargyl groups; aryl groups optionally substituted with a halogen atom or a group such as an alkyl, alkoxy, alkenyl, or alkynyl group; heterocyclic groups optionally substituted with a halogen atom or a group such as an alkyl, alkoxy, alkenyl, or alkynyl group; N,N-dialkylcarbamoyl groups such as N,N-dimethylcarbamoyl and N,N-diethylcarbamoyl groups; and dioxaborolanyl, stannyl, silyl, ester, formyl, thioether, epoxy, and isocyanate groups. These groups may be substituted with, for example, a halogen atom, a heteroatom, an alkyl group, or an aromatic ring.

Preferred among these substituents in the linear, branched, or cyclic hydrocarbon group, the heteroatom-containing group, the aryl group, and the heterocyclic group for $Y^1$ are a halogen atom, a C1-C20 linear or branched alkyl group, a C1-C20 linear or branched alkoxy group, an aryl group, a heterocyclic group, and a diarylamino group. More preferred are an alkyl group, an aryl group, an alkoxy group, and a diarylamino group.

When the linear, branched, or cyclic hydrocarbon group, the heteroatom-containing group, the aryl group, or the heterocyclic group for $Y^1$ is substituted, the binding position and the number of substituent are not particularly limited.

In formula (14), $n^1$ represents an integer of 2 to 10, preferably an integer of 2 to 6, more preferably an integer of 2 to 5, still more preferably an integer of 2 to 4. In terms of solubility in a solvent, $n^1$ particularly preferably represents 2 or 3, most preferably 2. That is, the boron-containing compound represented by formula (14) is most preferably a dimer.

In formula (14), $Q^1$ and $Q^2$ each represent any of the structures represented by formulas (3-1) to (3-8).

(3-1)

(3-2)

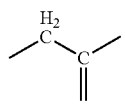

(3-3)

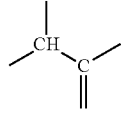

(3-4)

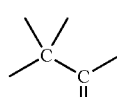

(3-5)

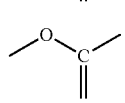

(3-6)

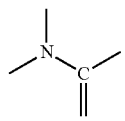

(3-7)

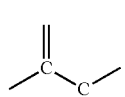

(3-8)

The structure represented by formula (3-2) consists of carbon atoms and two hydrogen atoms and three other atoms bonded to the carbon atoms. None of these three atoms bonded to the carbon atoms other than the hydrogen atoms are hydrogen atoms. Among these formulas (3-1) to (3-8), any of (3-1), (3-7), and (3-8) is preferred, and (3-1) is more preferred. Thus, it is another preferred embodiment of the present invention that $Q^1$ and $Q^2$ are the same as or different from each other and each represent a C1 linking group.

In formula (14), the ring structures formed by the dotted arcs and portions of the backbone shown in the solid lines are not particularly limited as long as the backbone of the ring structure to which $X^1$ is bonded consists of carbon atoms.

In formula (14), when $Y^1$ represents a direct bond and $n^1$ is 2, the ring to which $X^1$ is bonded is exemplified by benzene, naphthalene, anthracene, tetracene, pentacene, triphenylene, pyrene, fluorene, indene, thiophene, furan, pyrrole, benzothiophene, benzofuran, indole, dibenzothiophene, dibenzofuran, carbazole, thiazole, benzothiazole, oxazole, benzoxazole, imidazole, pyrazole, benzimidazole, pyridine, pyrimidine, pyrazine, pyridazine, quinoline, isoquinoline, quinoxaline, benzothiadiazole, phenanthridine, oxadiazole, and thiadiazole rings. These are represented by formulas (4-1) to (4-36) below.

Preferred among these are the ring structures having the backbone consisting only of carbon atoms, such as benzene, naphthalene, anthracene, tetracene, pentacene, triphenylene, pyrene, fluorene, and indene rings. More preferred are benzene, naphthalene, and fluorene rings. A benzene ring is still more preferred.

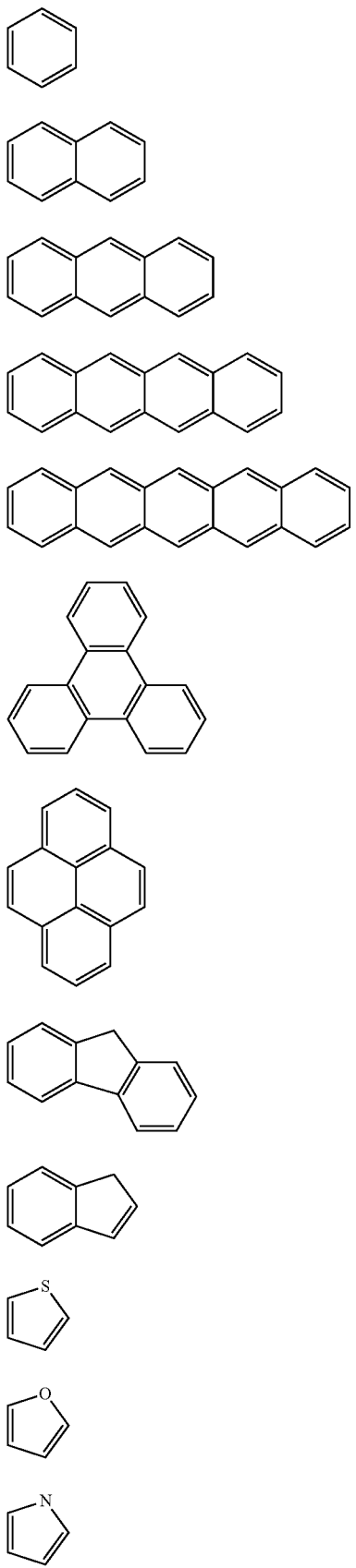
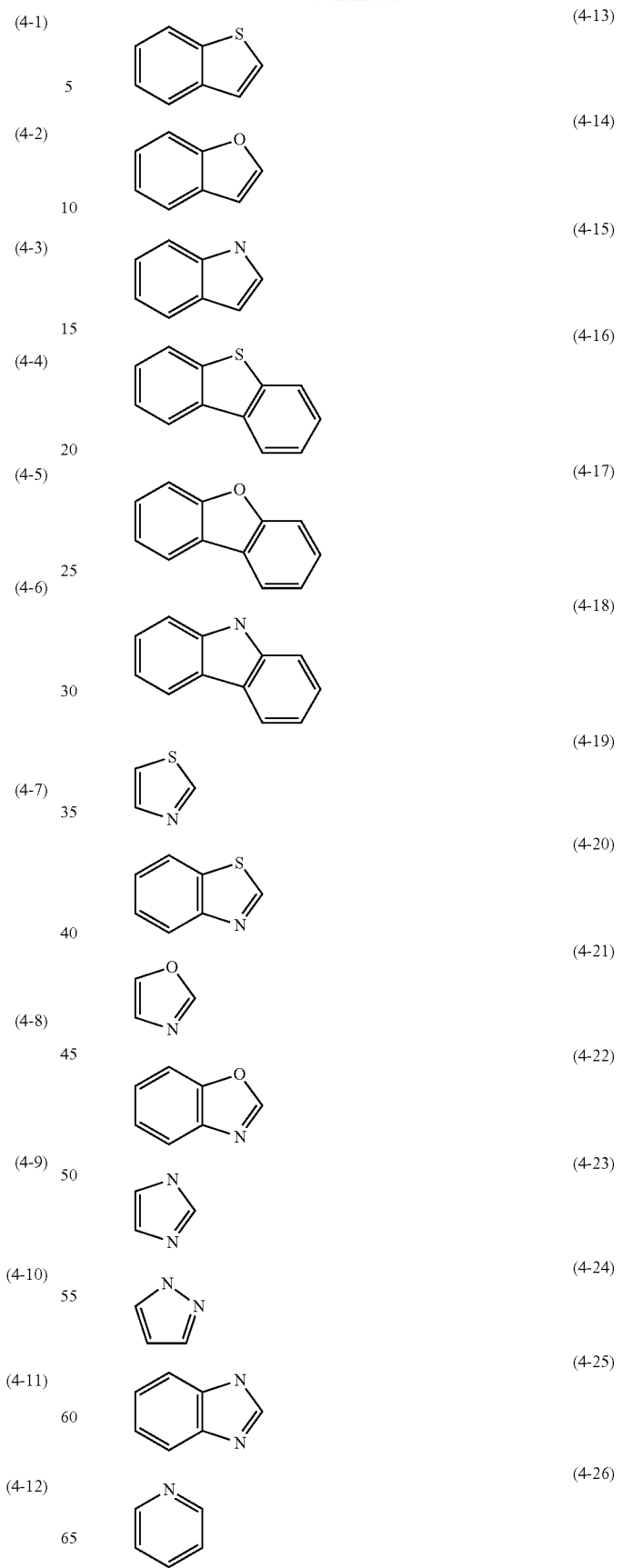

In formula (14), when $Y^1$ represents a direct bond and $n^1$ is 2, the ring to which $X^2$ is bonded is exemplified by imidazole, benzimidazole, pyridine, pyridazine, pyrazine, pyrimidine, quinoline, isoquinoline, phenanthridine, quinoxaline, benzothiadiazole, thiazole, benzothiazole, oxazole, benzoxazole, oxadiazole, and thiadiazole rings. These are represented by formulas (5-1) to (5-17) below.

The symbol "*" in formulas (5-1) to (5-17) indicates that the carbon atom that forms the ring to which $X^1$ is bonded and forms the backbone portion connecting the boron atom, $Q^1$, and the nitrogen atom in formula (14) is bonded to any one of the carbon atoms marked with "*". The ring may be fused with another ring structure at a site other than the carbon atoms marked with "*". Among the examples mentioned above, pyridine, pyrimidine, quinoline, and phenanthridine rings are preferred. Pyridine, pyrimidine, and quinoline rings are more preferred, and a pyridine ring is still more preferred.

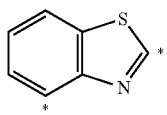
(5-13)

(5-14)

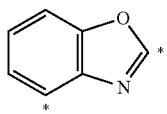
(5-15)

(5-16)

(5-17)

In formula (14), when $Y^1$ represents a direct bond and $n^1$ is 2, the ring to which $X^3$ is bonded and the ring to which $X^4$ is bonded are exemplified by the rings represented by formulas (4-1) to (4-33). Preferred among these are a benzene ring, a naphthalene ring, and a benzothiophene ring. A benzene ring is more preferred.

In formula (14), $X^1$, $X^2$, $X^3$, and $X^4$ are the same as or different from each other and each represent a hydrogen atom or a monovalent substituent as a substituent in the corresponding ring structure. The monovalent substituent is not particularly limited. Examples of $X^1$, $X^2$, $X^3$, and $X^4$ include a hydrogen atom, optionally substituted aryl groups, heterocyclic groups, alkyl groups, alkenyl groups, alkynyl groups, alkoxy groups, aryloxy groups, arylalkoxy groups, silyl groups, a hydroxy group, an amino group, alkylamino groups, aryl amino groups, halogen atoms, a carboxyl group, a thiol group, an epoxy group, acyl groups, optionally substituted oligoaryl groups, monovalent oligoheterocyclic groups, alkylthio groups, arylthio groups, arylalkyl groups, arylalkoxy groups, arylalkylthio groups, an azo group, a stannyl group, a phosphino group, optionally substituted arylphosphino groups, optionally substituted alkyl phosphino groups, arylphosphinyl groups, optionally substituted alkyl phosphinyl groups, a silyloxy group, optionally substituted aryloxycarbonyl groups, optionally substituted alkoxycarbonyl groups, an optionally substituted carbamoyl group, optionally substituted arylcarbonyl groups, optionally substituted alkylcarbonyl groups, optionally substituted arylsulfonyl groups, optionally substituted alkylsulfonyl groups, optionally substituted arylsulfinyl groups, optionally substituted alkylsulfinyl groups, a formyl group, a cyano group, a nitro group, arylsulfonyloxy groups, alkylsulfonyloxy groups, alkylsufonate groups such as methanesulfonate, ethanesulfonate, and trifluoromethanesulfonate group; arylsulfonate groups such as benzene sulfonate and p-toluenesulfonate groups; arylalkylsufonate groups such as a benzylsulfonate group; a boryl group, a sulfonium methyl group, a phosphonium methyl group, a phosphonate methyl group, arylsulfonate groups, an aldehyde group, and an acetonitrile group.

Examples of the substituents in $X^1$, $X^2$, $X^3$, and $X^4$ include halogen atoms such as fluorine, chlorine, bromine, and iodine atoms; haloalkyl groups such as methyl chloride, methyl bromide, methyl iodide, fluoromethyl, difluoromethyl, and trifluoromethyl groups; C1-C20 linear or branched alkyl groups such as methyl, ethyl, propyl, isopropyl, butyl, isobutyl, sec-butyl, and tert-butyl groups; C5-C7 cyclic alkyl groups such as cyclopentyl, cyclohexyl, and cycloheptyl groups; C1-C20 linear or branched alkoxy groups such as methoxy, ethoxy, propoxy, isopropoxy, butoxy, isobutoxy, tert-butoxy, pentyloxy, hexyloxy, heptyloxy, and octyloxy groups; a hydroxy group; a thiol group; a nitro group; a cyano group; an amino group; an azo group; C1-C40 alkyl-containing mono or dialkylamino groups such as methylamino, ethylamino, dimethylamino, and diethylamino groups; amino groups such as diphenylamino and carbazolyl groups; acyl groups such as acetyl, propionyl, and butyryl groups; C2-C20 alkenyl groups such as vinyl, 1-propenyl, allyl, butenyl, and styryl groups; C2-C20 alkynyl groups such as, ethynyl, 1-propynyl, propargyl, and phenyl acetinyl groups; alkenyloxy groups such as vinyloxy and allyloxy groups; alkynyloxy groups such as ethynyloxy and phenylacetyloxy groups; aryloxy groups such as phenoxy, naphthoxy, biphenyloxy, and pyrenyloxy groups; perfluoro groups and longer chain perfluoro groups such as trifluoromethyl, trifluoromethoxy, pentafluoroethoxy, and perfluorophenyl groups; boryl groups such as diphenylboryl, dimesitylboryl, bis(perfluorophenyl)boryl, and 4,4,5,5-tetramethyl-1,3,2-dioxaborolanyl groups; carbonyl groups such as acetyl and benzoyl groups; carbonyloxy groups such as acetoxy and benzoyloxy groups; alkoxycarbonyl groups such as methoxycarbonyl, ethoxycarbonyl, and phenoxycarbonyl groups; sulfinyl groups such as methylsulfinyl and phenylsulfinyl groups; sulfonyl groups such as methylsulfonyl and phenylsulfonyl groups; alkylsulfonyloxy groups; arylsulfonyloxy groups; a phosphino groups; phosphinyl groups such as diethylphosphinyl and diphenylphosphinyl groups; silyl groups such as trimethylsilyl, triisopropylsilyl, dimethyl-tert-butylsilyl, trimethoxysilyl, and triphenylsilyl groups; a silyloxy group; a stannyl group; aryl groups (optionally substituted aromatic hydrocarbon ring groups) such as phenyl, 2,6-xylyl, and mesityl, duryl, biphenyl, terphenyl, naphthyl, anthryl, pyrenyl, toluyl, anisyl, fluorophenyl, diphenylaminophenyl, dimethylaminophenyl, diethylaminophenyl, and phenanthrenyl groups, which may be optionally substituted with, for example, a halogen atom, an alkyl group, or an alkoxy group; heterocyclic groups (optionally substituted aromatic heterocyclic groups) such as thienyl, furyl, silacyclopentadienyl, oxazolyl, oxadiazolyl, thiazolyl, thiadiazolyl, acridinyl, quinolyl, quinoxaloyl, phenanthrolyl, benzothienyl, benzothiazolyl, indolyl, carbazolyl, pyridyl, pyrrolyl, benzoxazolyl, pyrimidyl, and imidazolyl groups, which may be optionally substituted with, for example, a halogen atom, an alkyl group, or an alkoxy group; a carboxyl group; a carboxylic acid ester; an epoxy group; an isocyano group; a cyanate group; an isocyanate group; a thiocyanate group; an isothiocyanate group; a carbamoyl group; N,N-dialkylcarbamoyl groups such as N,N-dimethylcarbamoyl and N,N-diethylcarbamoyl groups; a formyl group; a nitroso group; and a formyloxy group.

These groups may optionally be substituted with, for example, a halogen atom, an alkyl group, or an aryl group. Further, these groups may also be bonded together at any position to form a ring.

Preferred among these for $X^1$, $X^2$, $X^3$, and $X^4$ are any of a hydrogen atom; reactive groups such as halogen atoms and carboxyl, hydroxy, thiol, epoxy, amino, azo, acyl, allyl, nitro, alkoxycarbonyl, formyl, cyano, silyl, stannyl, boryl, phosphino, silyloxy, arylsulfonyloxy, and alkylsulfonyloxy groups; C1-C20 linear or branched alkyl groups; C1-C20 linear or branched alkyl groups substituted with a C1-C8 linear or branched alkyl, C1-C8 linear or branched alkoxy, aryl, C2-C8 alkenyl, or C2-C8 alkynyl group, or any of the reactive groups; C1-C20 linear or branched alkoxy groups; C1-C20 linear or branched alkoxy groups substituted with a C1-C8 linear or branched alkyl, C1-C8 linear or branched alkoxy, aryl, C2-C8 alkenyl, or C2-C8 alkynyl group, or any of the reactive groups; aryl groups; aryl groups substituted with a C1-C8 linear or branched alkyl, C1-C8 linear or branched alkoxy, aryl, heterocyclic, C2-C8 alkenyl, or C2-C8 alkynyl group, or any of the reactive groups; oligoaryl groups; oligoaryl groups substituted with a C1-C8 linear or branched alkyl, C1-C8 linear or branched alkoxy, aryl, heterocyclic, C2-C8 alkenyl, or C2-C8 alkynyl group, or any of the reactive groups; monovalent heterocyclic groups; monovalent heterocyclic groups substituted with a C1-C8 linear or branched alkyl, C1-C8 linear or branched alkoxy, aryl, heterocyclic, C2-C8 alkenyl, or C2-C8 alkynyl group, or any of the reactive groups; monovalent oligoheterocyclic groups; monovalent oligoheterocyclic groups substituted with a C1-C8 linear or branched alkyl, C1-C8 linear or branched alkoxy, aryl, heterocyclic, C2-C8 alkenyl, or C2-C8 alkynyl group, or any of the reactive groups; alkylthio groups; aryloxy groups; arylthio groups; arylalkyl groups; arylalkoxy groups; arylalkylthio groups; alkenyl groups; alkenyl groups substituted with a C1-C8 linear or branched alkyl, C1-C8 linear or branched alkoxy, aryl, heterocyclic, C2-C8 alkenyl, or C2-C8 alkynyl group, or any of the reactive groups; alkynyl groups; alkynyl groups substituted with a C1-C8 linear or branched alkyl, C1-C8 linear or branched alkoxy, aryl, heterocyclic, C2-C8 alkenyl, or C2-C8 alkynyl group, or any of the reactive groups; alkylamino groups; alkylamino groups substituted with a C1-C8 linear or branched alkyl, C1-C8 linear or branched alkoxy, aryl, heterocyclic, C2-C8 alkenyl, or C2-C8 alkynyl group, or any of the reactive groups; arylamino groups; arylamino groups substituted with a C1-C8 linear or branched alkyl, C1-C8 linear or branched alkoxy, aryl, heterocyclic, C2-C8 alkenyl, or C2-C8 alkynyl group, or any of the reactive groups; arylphosphino groups; arylphosphino groups substituted with a C1-C8 linear or branched alkyl, C1-C8 linear or branched alkoxy, aryl, heterocyclic, C2-C8 alkenyl, or C2-C8 alkynyl group, or any of the reactive groups; arylphosphinyl groups; arylphosphinyl groups substituted with a C1-C8 linear or branched alkyl, C1-C8 linear or branched alkoxy, aryl, heterocyclic, C2-C8 alkenyl, or C2-C8 alkynyl group, or any of the reactive groups; arylsulfonyl groups; and arylsulfonyl groups substituted with a C1-C8 linear or branched alkyl, C1-C8 linear or branched alkoxy, aryl, heterocyclic, C2-C8 alkenyl, or C2-C8 alkynyl group, or any of the reactive groups.

More preferred are a hydrogen atom, a bromine atom, an iodine atom, an amino group, a boryl group, alkynyl groups, alkenyl groups, a formyl group, a silyl group, a stannyl group, a phosphino group, aryl groups substituted with any of the reactive groups, oligoaryl groups substituted with any of the reactive groups, monovalent heterocyclic groups, monovalent heterocyclic groups substituted with any of the reactive groups, monovalent oligoheterocyclic groups substituted with any of the reactive groups, alkenyl groups, alkenyl groups substituted with any of the reactive groups, alkynyl groups, and alkynyl groups substituted with any of the reactive groups.

Still more preferred for $X^1$ and $X^2$ are a hydrogen atom and functional groups that are resistant to reduction such as alkyl, aryl, nitrogen-containing heteroaromatic, alkenyl, alkoxy, aryloxy, and silyl groups. Particularly preferred are a hydrogen atom and aryl group and nitrogen-containing heteroaromatic groups.

Still more preferred for $X^3$ and $X^4$ are a hydrogen atom and functional groups that are resistant to oxidation such as carbazolyl, triphenylamino, thienyl, furanyl, alkyl, aryl, and indolyl groups. Particularly preferred are a hydrogen atom and carbazolyl, triphenylamino, and thienyl groups.

The boron-containing compound containing reduction-resistant functional groups as $X^1$ and $X^2$ and oxidation-resistant functional groups as $X^3$ and $X^4$ is considered to be a compound having higher resistance to reduction and oxidation as a whole.

A heterocyclic ring forming the heterocyclic group as $X^1$ to $X^4$ and the substituents in $X^1$ to $X^4$ may be exemplified by the rings (4-10) to (4-36). An oligoheterocyclic ring forming the oligoheterocyclic group and a nitrogen-containing heteroaromatic ring forming the nitrogen-containing heteroaromatic group may be exemplified by those corresponding to the oligoheterocyclic ring or the nitrogen-containing heteroaromatic ring among the rings (4-10) to (4-36).

In formula (14), when $X^1$, $X^2$, $X^3$, and $X^4$ each represent a monovalent substituent, the binding positions and the number of substituents of $X^1$, $X^2$, $X^3$, and $X^4$ to the ring structures are not particularly limited.

In formula (14), when $Y^1$ represents an $n^1$-valent linking group and $n^1$ is 2 to 10, the ring to which $X^1$ is bonded is exemplified by those mentioned as the ring to which $X^1$ is bonded when $Y^1$ represents a direct bond and $n^1$ is 2 in formula (14). In particular, a benzene ring, a naphthalene ring, and a benzothiophene ring are preferred. A benzene ring is more preferred.

In formula (14), when $Y^1$ represents an $n^1$-valent linking group and $n^1$ is 2 to 10, the ring to which $X^2$ is bonded, the ring to which $X^3$ is bonded, and the ring to which $X^4$ is bonded are exemplified by those mentioned as the ring to which $X^2$ is bonded, the examples of the ring to which $X^3$ is bonded, and the examples of the ring to which $X^4$ is bonded, respectively, when $Y^1$ represents a direct bond and $n^1$ is 2 in formula (14), and the same applies to preferred structures thereof.

Thus, it is a preferred embodiment of the present invention that the boron-containing compound represented by formula (14) is a boron-containing compound represented by formula (15) below either in the case where $Y^1$ represents a direct bond and $n^1$ is 2 or in the case where $Y^1$ represents an $n^1$-valent linking group and $n^1$ is 2 to 10 in formula (14).

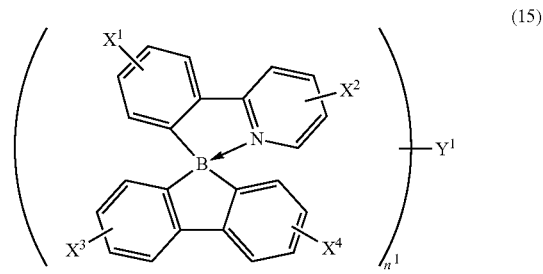

(15)

In formula (15), the arrow from the nitrogen atom to the boron atom, $X^1$, $X^2$, $X^3$, $X^4$, $n^1$, and $Y^1$ are as defined above for formula (14).

The boron-containing compound used as the second material is also preferably a boron-containing compound represented by formula (37):

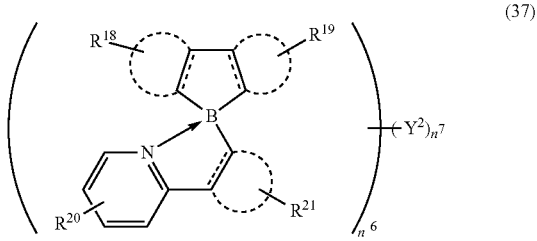

(37)

wherein the dotted arcs are the same as or different from each other and indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $R^{18}$ to $R^{21}$ are the same as or different from each other and each represent a hydrogen atom, a monovalent substituent as a substituent in the corresponding ring structure, a divalent group, or a direct bond; each of the ring structures forming the dotted arc portions optionally contains multiple $R^{18}$s, multiple $R^{19}$s, or multiple $R^{21}$s; the pyridine ring structure optionally contains multiple $R^{20}$s; the ring to which $R^{21}$ is bonded is an aromatic heterocyclic ring; $n^6$ is an integer of 1 to 4; $n^7$ is 0 or 1; when $n^7$ is 1, $Y^2$ represents an $n^6$-valent linking group or a direct bond and bonds to each of $n^6$ structural units other than $Y^2$ independently at any one site selected from $R^{18}$, $R^{19}$, $R^{20}$, and $R^{21}$; and when $n^7$ is 0, $n^6$ is 1 and at least one of $R^{18}$ to $R^{21}$ represents a monovalent substituent as a substituent in the corresponding ring structure.

The boron-containing compound represented by formula (37) is highly stable because it has a structure in which the nitrogen atom is coordinated to the boron atom and has a rigid ring structure as represented by formula (37). The boron-containing compound represented by formula (37) is well soluble in a variety of solvents and easily formed into a good coat by, for example, application. Further, since the boron-containing compound in the present invention has a specific ring structure as a substituent which bonds to the boron atom, the compound is considered to have a reduced LUMO energy level and lead to excellent performance as an organic EL device.

First, the structural units other than $Y^2$ in formula (37) will be described.

In formula (37), the dotted arcs indicate that ring structures are formed with the backbone shown in the solid lines. Ring-forming portions of the backbone shown in the solid lines are indicated by dotted lines drawn along the solid lines. There are three ring structures, and herein, these ring structures are referred to as the ring to which $R^{18}$ is bonded, the ring to which $R^{19}$ is bonded, and the ring to which $R^{21}$ is bonded.

The dotted line portions of the backbone shown in the solid lines and the arrow from the nitrogen atom to the boron atom in formula (37) are as defined above for formula (14).

In formula (37), the ring to which $R^{21}$ is bonded is an aromatic heterocyclic ring. The aromatic heterocyclic ring has at least one heteroatom in the ring. The heteroatom is preferably a nitrogen atom, a sulfur atom, or an oxygen atom, more preferably a nitrogen atom or a sulfur atom.

The aromatic heterocyclic ring may be a monocyclic or fused ring.

Examples of the aromatic heterocyclic ring include a thiophene ring, a furan ring, a pyrrole ring, a benzothiophene ring, a benzofuran ring, an indole ring, a dibenzothiophene ring, a dibenzofuran ring, a carbazole ring, a thiazole ring, a benzothiazole ring, an oxazole ring, a benzoxazole ring, an imidazole ring, a pyrazole ring, a benzimidazole ring, a pyridine ring, a pyrimidine ring, a pyrazine ring, a pyridazine ring, a quinoline ring, an isoquinoline ring, a quinoxaline ring, a benzothiadiazole ring, a phenanthridine ring, an oxadiazole ring, and a thiadiazole ring. These are represented by formulas (4-10) to (4-36).

It is a preferred embodiment of the boron-containing compound represented by formula (37) that the aromatic heterocyclic ring is a monocyclic ring (monocyclic aromatic heterocyclic ring). The monocyclic aromatic heterocyclic ring preferably represents five- to seven-membered rings, more preferably represents a five- or a six-membered ring. Examples of the monocyclic aromatic heterocyclic ring include a thiophene ring, a furan ring, a pyrrole ring, a thiazole ring, an oxazole ring, an imidazole ring, a pyridine ring, a pyrimidine ring, a pyrazine ring, a pyridazine ring, an oxadiazole ring, and a thiadiazole ring. These are represented by formulas (4-10) to (4-12), (4-19), (4-21), (4-23), (4-26) to (4-29), (4-35), and (4-36). Preferred among these are a thiophene ring, a pyridine ring, and a pyrimidine ring. More preferred are a thiophene ring and a pyridine ring.

In formula (37), the ring to which $R^{18}$ is bonded and the ring to which R″ is bonded may be non-aromatic rings, but in order to stabilize the boron-containing compound in the present invention, these rings are preferably aromatic rings such as an aromatic hydrocarbon ring and an aromatic heterocyclic ring. Examples of the aromatic rings include those mentioned for the ring to which $X^1$ is bonded when $Y^1$ represents a direct bond and $n^1$ is 2 in formula (14).

In formula (37), $R^{18}$ to $R^{21}$ are the same as or different from each other and each represent a hydrogen atom, a monovalent substituent as a substituent in the corresponding ring structure, a divalent group, or a direct bond. Examples of the monovalent substituent include, but are not particularly limited to, those mentioned as the specific examples of the monovalent substituents for $X^1$, $X^2$, $X^3$, and $X^4$ in formula (14).

Among these, preferred as $R^{18}$ to $R^{21}$ are the preferred groups for $X^1$, $X^2$, $X^3$, and $X^4$ in formula (14).

$R^{18}$ to $R^{21}$ each more preferably represent any of a hydrogen atom; halogen atoms such as fluorine, chlorine, bromine, and iodine atoms; a silyl group; an alkylamino group; an aryl amino group; a boryl group; a stannyl group; a C1-C8 linear or branched alkyl group; an aryl group; an oligoaryl group; a monovalent heterocyclic group; a monovalent oligoheterocyclic group; an arylphosphinyl group; and an arylsulfonyl group.

Examples of the divalent group include groups prepared by removing one hydrogen atom from the monovalent substituent as a substituent in the corresponding ring structure.

$R^{18}$, $R^{19}$, and $R^{21}$ are the same as or different from each other, and each of the ring structures forming the dotted arc portions optionally contains multiple $R^{18}$s, multiple $R^{19}$s, or multiple $R^{21}$s. $R^{20}$s are the same as or different from each other, and the pyridine ring structure optionally contains multiple $R^{20}$s. The binding positions of the monovalent substituents to the ring structures are not particularly limited.

In formula (37), $R^{20}$ and $R^{21}$ are the same as or different from each other and each represent a hydrogen atom, a monovalent substituent as a substituent in the corresponding ring structure, a divalent group, or a direct bond. In particular, at least one of $R^{20}$ or $R^{21}$ preferably represent(s) a monovalent substituent having electron transporting property as a substituent in the corresponding ring structure. The presence of substituents having electron transporting property for $R^{20}$ and $R^{21}$ allows the boron-containing compound represented by formula (37) to be a material having excellent electron transporting property.

The monovalent substituent having electron transporting property preferably contains an aromatic ring. Examples of the aromatic ring-containing monovalent substituent having electron transporting property include monovalent groups derived from a nitrogen-containing heterocyclic ring in which a carbon-nitrogen double bond (C=N) is present in the ring, such as an imidazole ring, a thiazole ring, an oxazole ring, an oxadiazole ring, a triazole ring, a pyrazole ring, a pyridine ring, a pyrimidine ring, a pyrazine ring, a triazine ring, a benzimidazole ring, a benzothiazole ring, a quinoline ring, an isoquinoline ring, a quinoxaline ring, or a benzothiadiazole ring; monovalent groups derived from an aromatic hydrocarbon ring or an aromatic heterocyclic ring in which no carbon-nitrogen double bond is present in the ring, such as a benzene ring, a naphthalene ring, a fluorene ring, a thiophene ring, a benzothiophene ring, or a carbazole ring, each having at least one electron-withdrawing substituent; and a dibenzothiophene dioxide ring, a dibenzophosphole oxide ring, and a silole ring.

Examples of the electron-withdrawing substituent include —CN, —COR, —COOR, —CHO, —CF$_3$, —SO$_2$Ph, and —PO(Ph)$_2$. Herein, R represents a hydrogen atom or a monovalent hydrocarbon group. The monovalent substituent having electron transporting property preferably contains an aromatic heterocyclic ring, like a monovalent group derived from a nitrogen-containing heterocyclic ring in which a carbon-nitrogen double bond is present in the ring or a monovalent group derived from an aromatic heterocyclic ring in which no carbon-nitrogen double bond is present in the ring.

In particular, the monovalent substituent having electron transporting property preferably has a nitrogen-containing aromatic heterocyclic ring in which a carbon-nitrogen double bond is present in the ring. The nitrogen-containing aromatic heterocyclic ring in which a carbon-nitrogen double bond is present in the ring is preferably a pyridine ring, a pyrimidine ring, or a quinoline ring, more preferably a pyridine ring.

It is also a preferred embodiment of the present invention that at least one of $R^{20}$ or $R^{21}$ represent(s) a silyl group such as a trimethylsilyl group, a triisopropylsilyl group, a dimethyl-tert-butylsilyl group, a trimethoxysilyl group, or a triphenylsilyl group.

Examples of the substituents for $R^{18}$ to $R^{21}$ include those mentioned as substituents for $X^1$, $X^2$, $X^3$, and $X^4$ in formula (14).

In particular, preferred substituents for $R^{18}$ to $R^{21}$ are aromatic ring-containing groups such as aromatic hydrocarbon ring groups and aromatic heterocyclic groups.

For example, at least one of $R^{18}$ to $R^{21}$ in formula (37) preferably further contains an aromatic ring bonded to one of the carbon atoms of the aromatic heterocyclic ring. Examples of the aromatic ring bonded to one of the carbon atoms of the aromatic heterocyclic ring include aromatic hydrocarbon ring groups and aromatic heterocyclic groups. Preferred aromatic hydrocarbon ring groups are a phenyl group, a naphthyl group, an anthracenyl group, a pyrenyl group, and a fluorenyl group. Preferred aromatic heterocyclic groups are a pyridyl group, a quinolyl group, a pyrimidyl group, a thiazole group, and an imidazole group.

Such substituents described above may further be substituted with, for example, a halogen atom, an alkyl group, or an aryl group, and are preferably substituted with, for example, a C1-C8 linear or branched alkyl group. Further, these substituents may also be bonded together at any position to form a ring.

The following describes $Y^2$, $n^6$, and $n^7$ in formula (37).

In the formula, $n^6$ is an integer of 1 to 4 and $n^7$ is 0 or 1. When $n^7$ is 1, $Y^2$ represents an $n^6$-valent linking group or a direct bond and bonds to each of $n^6$ structural units other than $Y^2$ independently at any one site selected from $R^{18}$, $R^{19}$, $R^{20}$, and $R^{21}$.

When $n^6$ is 1 in formula (37), $n^7$ is 0 and the compound represented by formula (37) consists of only the structural unit other than $Y^2$. In this case, at least one of $R^{18}$ to $R^{21}$ represents a monovalent substituent as a substituent in the corresponding ring structure. In particular, at least one of $R^{20}$ or $R^{21}$ preferably represent(s) a monovalent substituent having electron transporting property as a substituent in the corresponding ring structure.

When $n^6$ is 2 in formula (37), two structural units other than $Y^2$ are present in formula (37). When $Y^2$ represents a divalent linking group, the two structural units other than $Y^2$ are bonded together via the divalent linking group $Y^2$. When $Y^2$ represents a direct bond, the two structural units other than $Y^2$ are directly bonded.

When $n^6$ is 3 or greater in formula (37), $Y^2$ represents an $n^6$-valent linking group and $n^6$ structural units other than $Y^2$ in formula (37) are present and bonded together via the linking group $Y^2$.

In formula (37), $n^6$ is preferably 1 to 3, more preferably 1 or 2. That is, the boron-containing compound in the present invention is more preferably a monomer or a dimer.

When $Y^2$ represents an $n^6$-valent linking group, $Y^2$ bonds to each of $n^6$ structural units other than $Y^2$ independently at any one site selected from $R^{18}$, $R^{19}$, $R^{20}$, and $R^{21}$. This means that as for the binding sites of the structural units other than $Y^2$ to $Y^2$, the $n^6$ structural units other than $Y^2$ have the respective independent binding sites, and all or some binding sites may be the same as each other or all binding sites may be different from each other. The binding position is not particularly limited. All of the $n^6$ structural units other than $Y^2$ are preferably bonded via $R^{20}$ or $R^{21}$.

In addition, all or some of the structures of the $n^6$ structural units other than $Y^2$ may be the same as each other or all of them may be different from each other.

When $Y^2$ in formula (37) represents an $n^6$-valent linking group, the linking group is exemplified by an optionally substituted linear, branched, or cyclic hydrocarbon group, an optionally substituted heteroatom-containing group, an optionally substituted aromatic hydrocarbon ring group, and an optionally substituted aromatic heterocyclic group. Preferred among these are aromatic ring-containing groups such as an optionally substituted aromatic hydrocarbon ring group and an optionally substituted aromatic heterocyclic group. Thus, it is another preferred embodiment of the present invention that $Y^2$ in formula (37) contains an aromatic ring.

Further, $Y^2$ may represent a linking group having a structure in which a plurality of the above-described linking groups is combined.

The linear, branched, or cyclic hydrocarbon group is preferably any of the groups represented by formulas (2-1) to (2-8) described above. More preferred among these are the groups represented by formulas (2-1) and (2-7).

The heteroatom-containing group is preferably any of the groups represented by formulas (2-9) to (2-13) described above. More preferred among these are the groups represented by formulas (2-12) and (2-13).

The aromatic hydrocarbon ring group is preferably any of the groups represented by formulas (2-14) to (2-20) described above. More preferred among these are the groups represented by formulas (2-14), (2-19), and (2-20).

The aromatic heterocyclic group is preferably any of the groups represented by formulas (2-21) to (2-33) described above. More preferred among these are the groups represented by formulas (2-24) and (2-32).

Examples of the substituents in the linear, branched, or cyclic hydrocarbon group, the heteroatom-containing group, the aromatic hydrocarbon ring group, and the aromatic heterocyclic group include those mentioned as substituents optionally contained in $R^{18}$, $R^{19}$, $R^{20}$, and $R^{21}$ in formula (37).

In particular, preferred substituents in the linear, branched, or cyclic hydrocarbon group, the heteroatom-containing group, the aromatic hydrocarbon ring group, and the aromatic heterocyclic group for $Y^2$ are a halogen atom, a C1-C20 linear or branched alkyl group, a C1-C20 linear or branched alkoxy group, an aromatic hydrocarbon ring group, an aromatic heterocyclic group, and a diarylamino group. More preferred are an alkyl group, an aromatic hydrocarbon ring group, an aromatic heterocyclic group, and a diarylamino group.

When the linear, branched, or cyclic hydrocarbon group, the heteroatom-containing group, the aromatic hydrocarbon ring group, or the aromatic heterocyclic group for $Y^2$ is substituted, the binding positions and the number of substituents are not particularly limited.

The boron-containing compounds represented by formulas (14) and (37) can be synthesized by any of commonly used reactions such as the Suzuki coupling reaction. These compounds can also be synthesized by the method disclosed in Journal of the American Chemical Society, 2009, Vol. 131, No. 40, pp. 14549-14559.

The reaction schemes (I) to (III) represent examples of the synthesis of the boron-containing compounds represented by formulas (14-1) and (14-2) as examples of the synthesis of the boron-containing compounds represented by formulas (14) and (37). The boron-containing compounds represented by formulas (14) and (37) may be produced by any other methods than these synthesis processes. In the reaction schemes (I) to (III), THF represents tetrahydrofuran. In the reaction scheme (III), n-BuLi represents n-butyllithium.

The reaction scheme (I) shows an example of the synthesis of the boron-containing compound represented by formula (14-1) which corresponds to the boron-containing compound represented by formula (14) where $Y^1$ represents a direct bond and $n^1$ is 2 and the boron-containing compound represented by formula (37) where $Y^2$ represents a direct bond, $n^6$ is 2, and $n^7$ is 1.

The reaction scheme (II) shows an example of the synthesis of the boron-containing compound (2,7-bis(3-dibenzoborolyl-4-pyridylphenyl)-9,9'-spirofluorene) represented by formula (14-2) which corresponds to the boron-containing compound represented by formula (14) where $Y^1$ represents an $n^1$-valent linking group and $n^1$ is 2 and the boron-containing compound represented by formula (37) where $Y^2$ represents a divalent linking group, $n^6$ is 2, and $n^7$ is 1.

Here, 2-(dibenzoborolylphenyl)-5-bromopyridine represented by formula (a) used as a raw material in the reaction schemes (I) to (III) can be synthesized by the method described in Journal of Organic Chemistry, 2010, Vol. 75, No. 24, pp. 8709-8712. The compound represented by formula (b) used as a raw material in the reaction scheme (I) can be synthesized by borylation reaction of 2-(dibenzoborolylphenyl)-5-bromopyridine represented by formula (a) as shown in the reaction scheme (III).

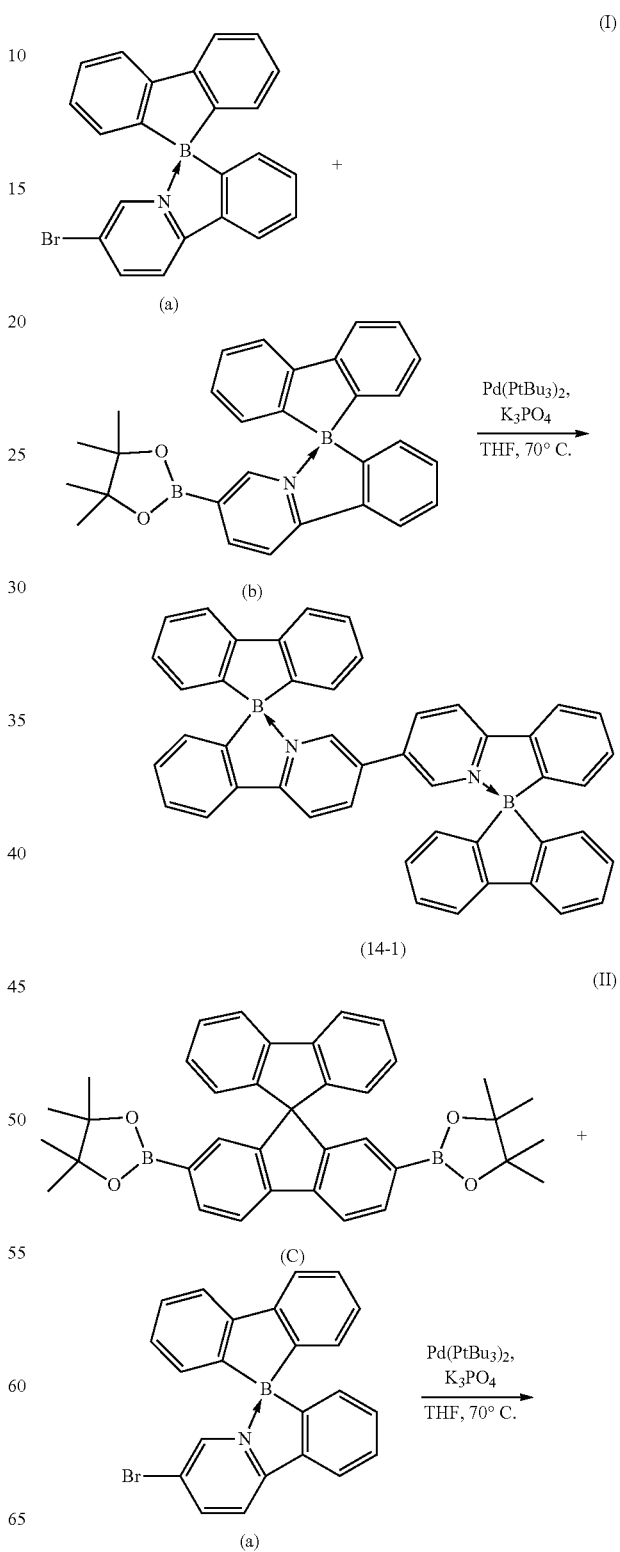

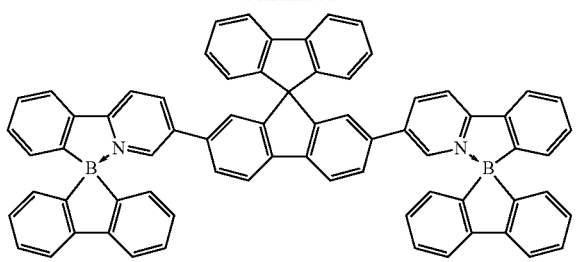

(14-2)

(III)

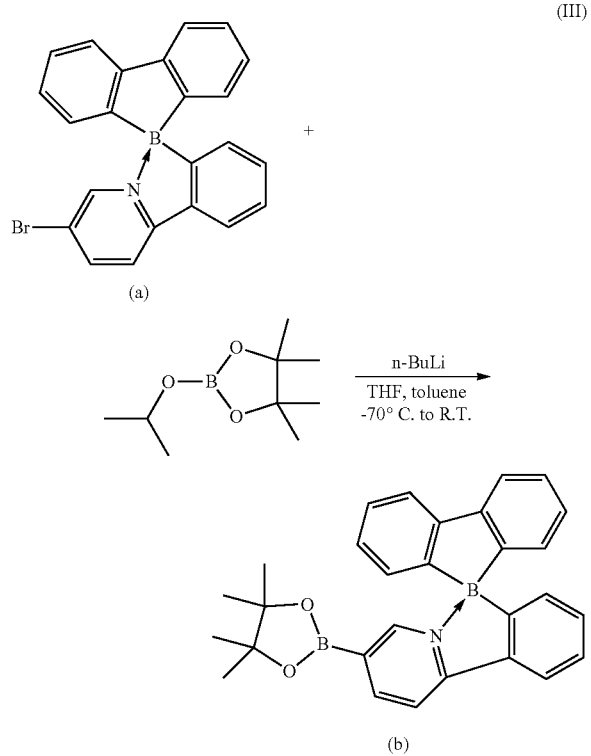

(a)

(b)

The boron-containing compound represented by formula (14) is particularly preferably the boron-containing compound represented by formula (14-1) or (14-2), most preferably the boron-containing compound represented by formula (14-2).

Further, it is another preferred embodiment of the present invention that the boron-containing compound represented by formula (37) is a boron-containing compound represented by formula (38-1) or (38-2):

(38-1)

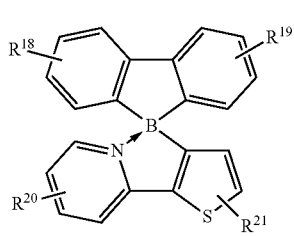

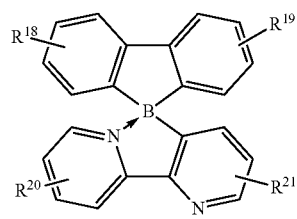

(38-2)

wherein the arrow from the nitrogen atom to the boron atom, $R^{18}$, $R^{19}$, $R^{20}$, and $R^{21}$ are as defined above for formula (37).

The boron-containing compound used as the second material is also preferably a boron-containing compound represented by formula (39):

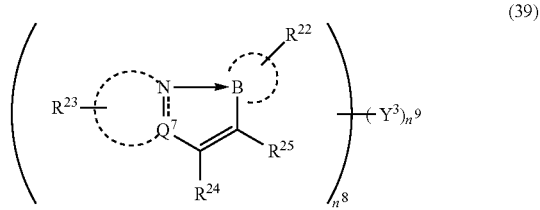

(39)

wherein the dotted arcs indicate that ring structures are formed with the boron atom or the backbone shown in the solid lines; the ring structures are the same as or different from each other and are each optionally a monocyclic structure constituted by one ring or a fused ring structure constituted by multiple rings; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^7$ represents a linking group in the backbone shown in the solid lines, at least part of the linking group forms a ring structure with a dotted arc portion and is optionally substituted; $R^{22}$ and $R^{23}$ are the same as or different from each other and each represent a hydrogen atom, a monovalent substituent as a substituent in the corresponding ring structure, a divalent group, or a direct bond; each of the ring structures forming the dotted arc portions optionally contains multiple $R^{22}$s or multiple $R^{23}$s; $R^{24}$ and $R^{25}$ are the same as or different from each other and each represent a hydrogen atom, a monovalent substituent, a divalent group, or a direct bond; $R^{24}$ and $R^{25}$ are not bonded to each other and do not form a ring structure with the backbone portion shown in the double line; $n^8$ is an integer of 1 to 4; $n^9$ is 0 or 1; when $n^9$ is 1, $Y^3$ represents an $n^8$-valent linking group or a direct bond and bonds to each of $n^8$ structural units other than $Y^3$ independently at any one site selected from $R^{22}$, $R^{23}$, $R^{24}$, and $R^{25}$.

The boron-containing compound represented by formula (39) is highly stable because it has a structure in which the nitrogen atom is coordinated to the boron atom and has a rigid ring structure as represented by formula (39). The boron-containing compound represented by formula (39) is well soluble in a variety of solvents and easily formed into a good coat by, for example, application. Further, since the boron-containing compound in the present invention has a specific ring structure as a substituent which bonds to the boron atom, the compound is considered to provide an organic EL device having reduced LUMO energy level and excellent performance.

First, the structural units other than $Y^3$ in formula (39) will be described.

In formula (39), the dotted arcs, the dotted line portions of the backbone shown in the solid lines, and the arrow from the nitrogen atom to the boron atom are as defined above for formula (37). In formula (39), there are two ring structures formed by the dotted arcs and the boron atom or the backbone shown in the solid lines, and herein, these ring structures are referred to as the ring to which $R^{22}$ is bonded and the ring to which $R^{23}$ is bonded.

In formula (39), $Q^7$ represents a linking group in the backbone shown in the solid lines, at least part of the linking group forms a ring structure with a dotted arc portion and is optionally substituted. This means that the ring structure incorporates $Q^7$.

In formula (39), $Q^7$ is represented by any of the structures of formulas (3-1) to (3-8), preferably represented by any of the structures of formulas (3-1), (3-7), and (3-8), more preferably represented by the structure of formula (3-1). Thus, it is another preferred embodiment of the present invention that $Q^7$ represents a C1 linking group.

In formula (39), the ring to which $R^{22}$ is bonded may be a non-aromatic ring, but preferably be an aromatic ring. The ring to which $R^{22}$ is bonded may have a monocyclic structure consisting of one ring, but preferably has a fused ring structure constituted by multiple rings. For example, the ring to which $R^{22}$ is bonded more preferably has a fused ring structure constituted by at least three rings, like a boron-containing compound represented by formula (40) below. Further, the ring to which $R^{22}$ is bonded may or may not have a heteroatom other than the boron atom in the ring.

In formula (39), the ring to which $R^{23}$ is bonded may be a non-aromatic nitrogen-containing heterocyclic ring, but in order to stabilize the boron-containing compound in the present invention and to obtain excellent performance as an organic electroluminescent device material, the ring is preferably a nitrogen-containing aromatic heterocyclic ring. Examples of the nitrogen-containing aromatic heterocyclic ring include imidazole, benzimidazole, pyridine, pyridazine, pyrazine, pyrimidine, quinoline, isoquinoline, phenanthridine, quinoxaline, benzothiadiazole, thiazole, benzothiazole, oxazole, benzoxazole, oxadiazole, and thiadiazole rings. These are represented by formulas (5-1) to (5-17) above. The symbol "*" in formulas (5-1) to (5-17) indicates that the carbon atom to which $R^{24}$ is bonded is bonded to any one of the carbon atoms marked with "*". The rings represented by formulas (5-1) to (5-17) may be fused with another ring structure at a site other than the carbon atoms marked with "*". Among the examples mentioned above, nitrogen-containing heteroaromatic rings containing a six-membered ring, such as pyridine ring, pyrazine, pyrimidine, quinoline, and phenanthridine rings. The ring to which $R^{23}$ is bonded is more preferably a pyridine ring, a pyrazine ring, a pyrimidine ring, or a quinoline ring, still more preferably a pyridine ring.

In formula (39), $R^{22}$ and $R^{23}$ are the same as or different from each other and each represent a hydrogen atom, a monovalent substituent as a substituent in the corresponding ring structure, a divalent group, or a direct bond. $R^{24}$ and $R^{25}$ are the same as or different from each other and each represent a hydrogen atom, a monovalent substituent, a divalent group, or a direct bond. Examples of the monovalent substituent as a substituent in the corresponding ring structure for $R^{22}$ or $R^{23}$ and the monovalent substituent for $R^{24}$ or $R^{25}$ include, but are not particularly limited to, those mentioned as the specific examples in the case where $X^1$, $X^2$, $X^3$, and $X^4$ in formula (14) are the monovalent substituents as substituents in the corresponding ring structures. Preferred substituents are also the same as the preferred substituents for $X^1$, $X^2$, $X^3$, and $X^4$.

In formula (39), $R^{24}$ and $R^{25}$ are not bonded to each other and do not form a ring structure with the backbone portion shown in the double line. The ring structure includes those having a coordination bond in the backbone.

For $R^{24}$, the atom directly bonding to the carbon atom of the backbone portion shown in a double line in formula (39) is still more preferably an atom other than an oxygen atom.

In particular, $R^{22}$, $R^{23}$, $R^{24}$, and $R^{25}$ each preferably represent any of a hydrogen atom; halogen atoms such as fluorine, chlorine, bromine, and iodine atoms; a silyl group; an alkylamino group; an aryl amino group; a boryl group; a stannyl group; a C1-C8 linear or branched alkyl group; an aryl group; an oligoaryl group; a monovalent heterocyclic group; a monovalent oligoheterocyclic group; an aryiphosphinyl group; and an arylsulfonyl group.

Examples of the divalent groups for $R^{22}$, $R^{23}$, $R^{24}$, and $R^{25}$ include groups prepared by removing one hydrogen atom from the monovalent substituents described above.

$R^{22}$ and $R^{23}$ are the same as or different from each other, and each of the ring structures forming the dotted arc portions optionally contains multiple $R^{22}$s or multiple $R^{23}$s. The binding positions of the monovalent substituents to the ring structures are not particularly limited.

In formula (39), at least one of $R^{23}$, $R^{24}$, and $R^{25}$ preferably represents a monovalent substituent having electron transporting property as a substituent in the corresponding ring structure. The presence of substituents having electron transporting property for $R^{23}$, $R^{24}$, or $R^{25}$ allows the boron-containing compound in the present invention to be a material having excellent electron transporting property. In particular, it is preferred that R25 represents a substituent having electron transporting property.

The monovalent substituent having electron transporting property preferably contains an aromatic ring. For example, $R^{25}$ preferably represents an aromatic ring-containing monovalent substituent. Examples of the aromatic ring-containing monovalent substituent include monovalent groups derived from a nitrogen-containing heterocyclic ring in which a carbon-nitrogen double bond (C=N) is present in the ring, such as an imidazole ring, a thiazole ring, an oxazole ring, an oxadiazole ring, a triazole ring, a pyrazole ring, a pyridine ring, a pyrimidine ring, a pyrazine ring, a triazine ring, a benzimidazole ring, a benzothiazole ring, a quinoline ring, an isoquinoline ring, a quinoxaline ring, or a benzothiadiazole ring; monovalent groups derived from an aromatic hydrocarbon ring or an aromatic heterocyclic ring in which no carbon-nitrogen double bond is present in the ring, such as a benzene ring, a naphthalene ring, a fluorene ring, a thiophene ring, a benzothiophene ring, or a carbazole ring, each having at least one electron-withdrawing substituent; and a dibenzothiophene dioxide ring, a dibenzophosphole oxide ring, a diarylphosphine oxide group, and a silole ring.

Examples of the electron-withdrawing substituent include —CN, —COR, —COOR, —CHO, —CF$_3$, —SO$_2$Ph, and —PO(Ph)$_2$. Herein, R represents a hydrogen atom or a monovalent hydrocarbon group. The monovalent substituent having electron transporting property preferably contains an aromatic heterocyclic ring, like a monovalent group derived from a nitrogen-containing heterocyclic ring in which a carbon-nitrogen double bond is present in the ring or a monovalent group derived from an aromatic heterocyclic ring in which no carbon-nitrogen double bond is present in the ring.

In particular, the monovalent substituent having electron transporting property preferably has a nitrogen-containing aromatic heterocyclic ring in which a carbon-nitrogen double bond is present in the ring. The nitrogen-containing aromatic heterocyclic ring in which a carbon-nitrogen double bond is present in the ring is preferably a pyridine ring, a pyrimidine ring, or a quinoline ring, more preferably a pyridine ring.

In order to increase the electron mobility of the boron-containing compound in the present invention, it is particularly preferred that in formula (39), the ring to which $R^{23}$ is bonded is a nitrogen-containing aromatic heterocyclic ring and $R^{25}$ is a monovalent substituent having an aromatic ring. Most preferably, the ring to which $R^{23}$ is bonded is a pyridine ring and $R^{25}$ represents a benzene ring.

Examples of the substituents for $R^{22}$, $R^{23}$, $R^{24}$, and $R^{25}$ include those mentioned as substituents for $X^1$, $X^2$, $X^3$, and $X^4$ in formula (14).

In particular, preferred substituents for $R^{23}$, $R^{24}$, and $R^{25}$ are aromatic ring-containing groups such as aromatic hydrocarbon ring groups and aromatic heterocyclic groups.

For example, at least one of $R^{23}$, $R^{24}$, and $R^{25}$ in formula (39) preferably further contains an aromatic ring bonded to one of the carbon atoms of the aromatic heterocyclic ring. Examples of the aromatic ring bonded to one of the carbon atoms of the aromatic heterocyclic ring include aromatic hydrocarbon ring groups and aromatic heterocyclic groups. Preferred aromatic hydrocarbon ring groups are a phenyl group, a naphthyl group, an anthracenyl group, a pyrenyl group, and a fluorenyl group. Preferred aromatic heterocyclic groups are a pyridyl group, a pyrrolyl group, a quinolyl group, a pyrimidyl group, a thiazole group, and an imidazole group. Specifically, in order to improve the electron-injection property, it is a preferred example that at least one of $R^{23}$, $R^{24}$, and $R^{25}$ is bipyridine. These substituents described above may further be substituted with, for example, a halogen atom, an alkyl group, or an aryl group, and are preferably substituted with, for example, a C1-C8 linear or branched alkyl group. Further, these substituents may also be bonded together at any position to form a ring.

The following describes $Y^3$, $n^8$, and $n^9$ in formula (39). In the formula, $n^8$ is an integer of 1 to 4 and $n^9$ is 0 or 1. When $n^9$ is 1, $Y^3$ represents an $n^8$-valent linking group or a direct bond and bonds to each of $n^8$ structural units other than $Y^3$ independently at any one site selected from $R^{22}$, $R^{23}$, $R^{24}$, and $R^{25}$.

When $n^8$ is 1 in formula (39), $n^9$ is 0 and the compound represented by formula (39) consists of only the structural unit other than $Y^3$.

In order to improve thermal stability of the boron-containing compound in the present invention, it is preferred that $n^8$ is an integer of 2 to 4 and $n^9$ is 1 in formula (39).

When $n^8$ is 2 in formula (39), two structural units other than $Y^3$ are present in formula (39). When $Y^3$ represents a divalent linking group, the two structural units other than $Y^3$ are bonded together via the divalent linking group $Y^3$. When $Y^3$ represents a direct bond, the two structural units other than $Y^3$ are directly bonded.

Since when $n^8$ is 3 or greater, $Y^3$ represents an $n^8$-valent linking group in the compound represented by formula (39), $n^8$ structural units other than $Y^3$ in formula (39) are present and bonded together via the linking group $Y^3$.

When $Y^3$ represents an $n^8$-valent linking group, $Y^3$ bonds to each of $n^8$ structural units other than $Y^3$ independently at any one site selected from $R^{22}$, $R^{23}$, $R^{24}$, and $R^{25}$. This means that as for the binding sites of the structural units other than $Y^3$ to $Y^3$, the $n^8$ structural units other than $Y^3$ have the respective independent binding sites, and all or some binding sites may be the same as each other or all binding sites may be different from each other. The binding position is not particularly limited. All of the $n^8$ structural units other than $Y^3$ are preferably bonded via $R^{23}$, $R^{24}$, or $R^{25}$.

In addition, all or some of the structures of the $n^8$ structural units other than $Y^3$ may be the same as each other or all of them may be different from each other.

When $Y^3$ in formula (39) represents an $n^8$-valent linking group, the linking group is exemplified by an optionally substituted linear, branched, or cyclic hydrocarbon group, an optionally substituted heteroatom-containing group, an optionally substituted aromatic hydrocarbon ring group, and an optionally substituted aromatic heterocyclic group. Preferred among these are aromatic ring-containing groups such as an optionally substituted aromatic hydrocarbon ring group and an optionally substituted aromatic heterocyclic group. Thus, it is another preferred embodiment of the present invention that $Y^3$ in formula (39) represents an $n^8$-valent linking group having an aromatic ring.

Further, $Y^3$ may represent a linking group having a structure in which a plurality of the above-described linking groups is combined.

The linear, branched, or cyclic hydrocarbon group is preferably any of the groups represented by formulas (2-1) to (2-8) described above. More preferred among these are groups represented by formulas (2-1) and (2-7).

The heteroatom-containing group is preferably any of the groups represented by formulas (2-9) to (2-13) described above. More preferred among these are groups represented by formulas (2-12) and (2-13).

The aromatic hydrocarbon ring group is preferably any of the groups represented by formulas (2-14) to (2-20) described above. More preferred among these are groups represented by formulas (2-14), (2-19), and (2-20).

The aromatic heterocyclic group is preferably any of the groups represented by formulas (2-21) to (2-33) described above. Preferred among these are groups represented by formulas (2-24) and (2-32).

Examples of the substituents in the linear, branched, or cyclic hydrocarbon group, the heteroatom-containing group, the aromatic hydrocarbon ring group, and the aromatic heterocyclic group include those mentioned as substituents optionally contained in $R^{23}$, $R^{24}$, and $R^{25}$ in formula (39).

In particular, preferred substituents in the linear, branched, or cyclic hydrocarbon group, the heteroatom-containing group, the aromatic hydrocarbon ring group, and the aromatic heterocyclic group for $Y^3$ are a halogen atom, a C1-C20 linear or branched alkyl group, a C1-C20 linear or branched alkoxy group, an aromatic hydrocarbon ring group, an aromatic heterocyclic group, and a diarylamino group. More preferred are an alkyl group, an aromatic hydrocarbon ring group, an aromatic heterocyclic group, and a diarylamino group.

When the linear, branched, or cyclic hydrocarbon group, the heteroatom-containing group, the aromatic hydrocarbon ring group, or the aromatic heterocyclic group for $Y^3$ is substituted, the binding positions and the number of substituents are not particularly limited.

As described above, in formula (39), the ring to which $R^{22}$ is bonded more preferably has a fused ring structure constituted by at least three rings. That is, the boron-containing compound in the present invention is more preferably represented by formula (40):

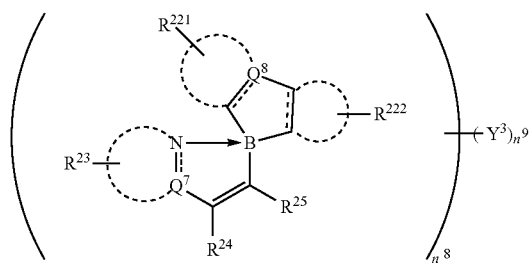

(40)

wherein the dotted arcs are the same as or different from each other and indicate that ring structures are formed with the backbone shown in the solid lines; $Q^8$ represents a linking group in the backbone shown in the solid lines, at least part of the linking group forms a ring structure with a dotted arc portion and is optionally substituted; $R^{221}$ and $R^{222}$ are the same as or different from each other and each represent a hydrogen atom, a monovalent substituent as a substituent in the corresponding ring structure, a divalent group, or a direct bond; each of the ring structures forming the dotted arc portions optionally contains multiple $R^{221}$s or multiple $R^{222}$s; when $n^9$ is 1, $Y^3$ represents an $n^8$-valent linking group or a direct bond and bonds to each of $n^8$ structural units other than $Y^3$ independently at any one site selected from $R^{221}$, $R^{222}$, $R^{23}$, $R^{24}$, and $R^{25}$; the dotted line portions of the backbone shown in the solid lines, the arrow from the nitrogen atom to the boron atom, $Q^7$, $R^{23}$, $R^{24}$, $R^{25}$, $n^8$, and $n^9$ are as defined above for formula (39).

In formula (40), the dotted arcs indicate that ring structures are formed with the backbone shown in the solid lines. Ring-forming portions of the backbone shown in the solid lines are indicated by dotted lines drawn along the solid lines. There are three ring structures, and herein, these ring structures are referred to as the ring to which $R^{221}$ is bonded, the ring to which $R^{222}$ is bonded, and the ring to which $R^{23}$ is bonded.

In formula (40), the dotted line portions of the backbone shown in the solid lines each indicate that a pair of atoms connected by the corresponding dotted line is optionally bonded by a double bond.

In formula (40), the ring to which $R^{221}$ is bonded and the ring to which $R^{222}$ is bonded may be non-aromatic rings, but in order to stabilize the boron-containing compound in the present invention, these rings are preferably aromatic rings such as an aromatic hydrocarbon ring and an aromatic heterocyclic ring. Examples of the aromatic rings include a benzene ring, a naphthalene ring, an anthracene ring, a tetracene ring, a pentacene ring, a triphenylene ring, a pyrene ring, a fluorene ring, an indene ring, a thiophene ring, a furan ring, a pyrrole ring, a benzothiophene ring, a benzofuran ring, an indole ring, a dibenzothiophene ring, a dibenzofuran ring, a carbazole ring, a thiazole ring, a benzothiazole ring, an oxazole ring, a benzoxazole ring, an imidazole ring, a pyrazole ring, a benzimidazole ring, a pyridine ring, a pyrimidine ring, a pyrazine ring, a pyridazine ring, a quinoline ring, an isoquinoline ring, a quinoxaline ring, a benzothiadiazole ring, a phenanthridine ring, an oxadiazole ring, and a thiadiazole ring. These are represented by formulas (4-1) to (4-36) described above. Preferred among these are a benzene ring, a naphthalene ring, and a benzothiophene ring. A benzene ring is more preferred.

The ring to which $R^{23}$ is bonded in formula (40) is similar to the ring to which $R^{23}$ is bonded in formula (39) described above.

$R^{221}$ and $R^{222}$ in formula (40) are similar to $R^{22}$ in formula (39) described above.

$Q^8$ in formula (40) similar to $Q^7$ in formula (39) described above. For example, at least one of $Q^7$ or $Q^8$ preferably represent(s) a C1 linking group.

When $Y^3$ represents an $n^8$-valent linking group in formula (40), $Y^3$ bonds to each of $n^8$ structural units other than $Y^3$ independently at any one site selected from $R^{221}$, $R^{222}$, $R^{23}$, $R^{24}$, and $R^{25}$. This means that as for the binding sites of the structural units other than $Y^3$ to $Y^3$, the $n^8$ structural units other than $Y^3$ have the respective independent binding sites, and all or some binding sites may be the same as each other or all binding sites may be different from each other. The binding position is not particularly limited. All of the $n^8$ structural units other than $Y^3$ are preferably bonded via $R^{23}$, $R^{24}$, or $R^{25}$.

In addition, all or some of the structures of the $n^8$ structural units other than $Y^3$ may be the same as each other or all of them may be different from each other.

It is another preferred embodiment of the present invention that the boron-containing compound in the present invention is represented by any one of formulas (41-1) to (41-3):

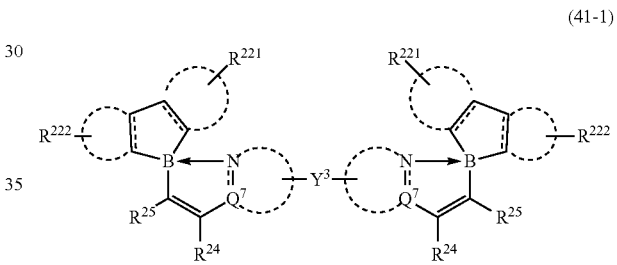

(41-1)

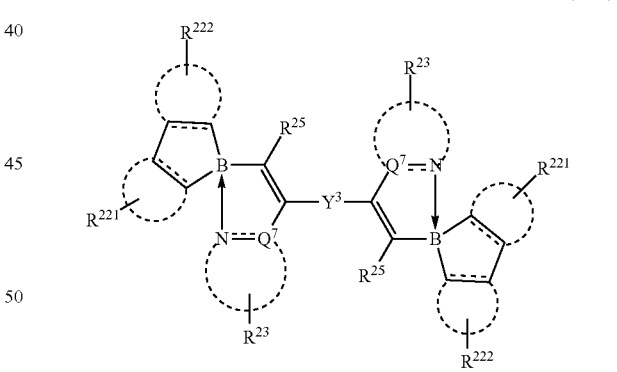

(41-2)

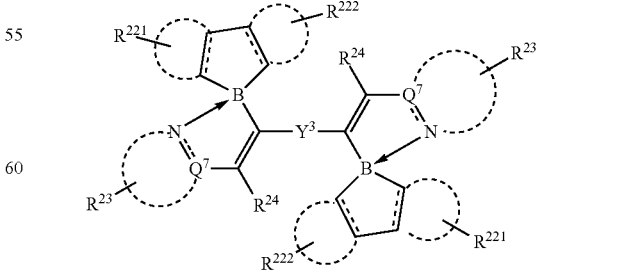

(41-3)

wherein the arrow from the nitrogen atom to the boron atom, the dotted arcs, the dotted line portions of the backbone shown in the solid lines, $Q^7$, $R^{221}$, $R^{222}$, $R^{23}$, $R^{24}$, $R^{25}$, and $Y^3$ are as defined above for formula (40). Thus, the thermal stability is improved. In particular, the boron-containing compound in the present invention is more preferably represented by formula (41-2).

The boron-containing compound represented by formula (39) can be produced, for example, according to the method disclosed in JP 5553149 B. Specifically, as shown by the reaction schemes below, an alkyne compound represented by formula (I) as a starting material is reacted with a halogenated boron compound $BX_3$ to produce an alkene compound represented by formula (II), and the alkene compound is reacted with a magnesium-containing compound represented by formula (i) or (ia) to produce a compound represented by formula (III) or (IIIa). This cyclizing reaction is performed by the same method as in Japanese Patent Application No. 2013-202578. The halogen atom X in the compound represented by formula (III) or (IIIa) is replaced with a hydrogen atom or a monovalent substituent by halogen-lithium exchange using a lithiating agent such as t-BuLi and reaction with an electrophile or replaced with a hydrogen atom or a monovalent substituent as disclosed in JP 5553149 B. Thus, the boron-containing compound represented by formula (39) or (40) can be obtained. In the following reaction schemes, Xs are the same as or different from each other and each represent an iodine atom, a bromine atom, or a chlorine atom. The dotted arcs in the compounds other than the magnesium-containing compound represented by formula (i) are as defined above for formula (39). The dotted arc in the magnesium-containing compound represented by formula (i) corresponds to the structural moiety of the dotted arc forming a ring structure with the boron atom in the compound represented by formula (III).

The two MgXs at the ends to be bonded to the structural moiety are not bonded to each other and do not form a ring structure, and are replaced by the boron atom in the compound represented by formula (III). The dotted line portions of the backbone shown in the solid lines, the arrow from the nitrogen atom to the boron atom, $Q^7$, $R^{22}$, $R^{23}$, $R^{24}$, $R^{25}$, $Y^3$, $n^8$, and $n^9$ are as defined above for formula (39). Also, $Q^8$, $R^{221}$, and $R^{222}$ are as defined above for formula (40).

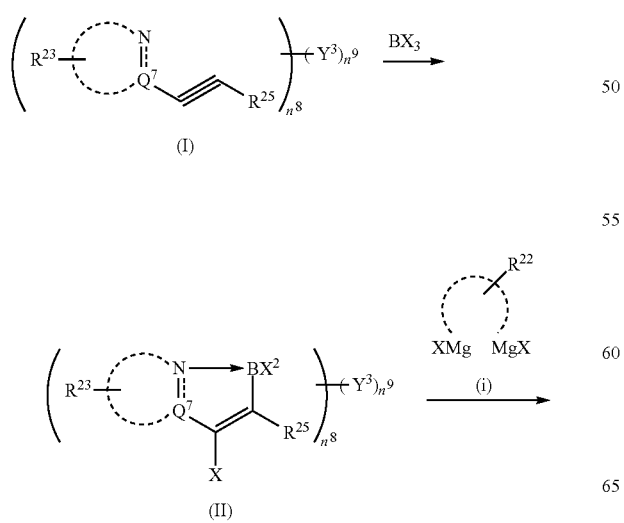

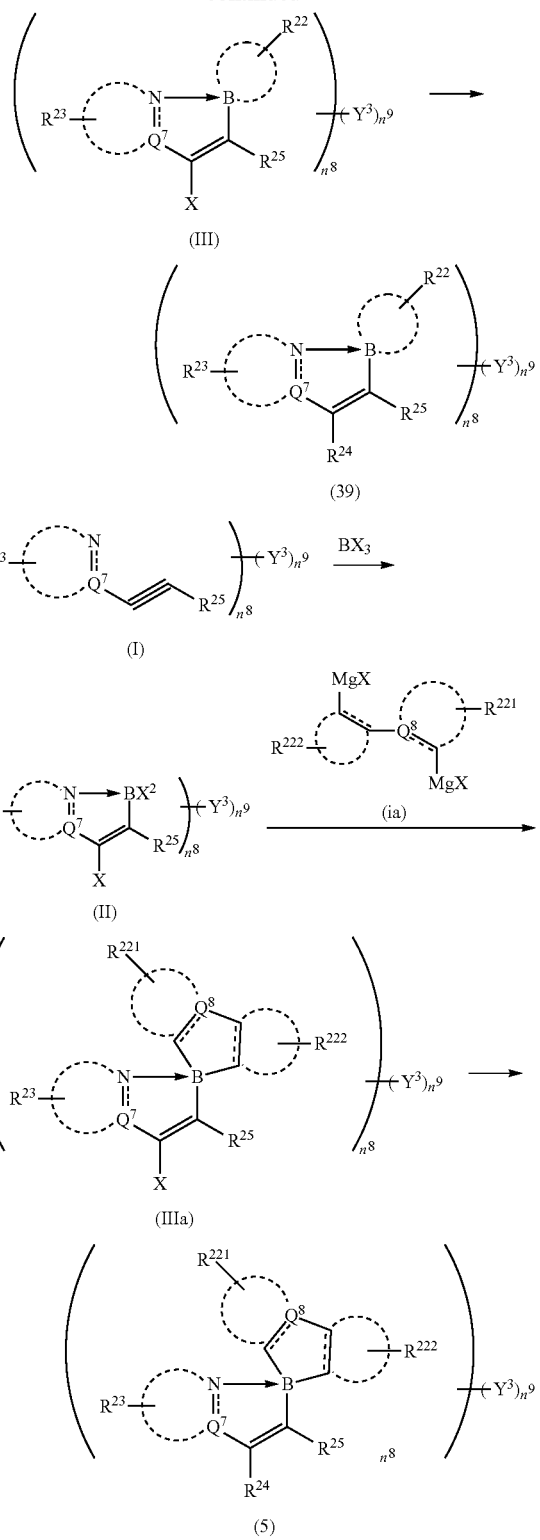

Further, the boron-containing compound represented by formula (39) can be produced by dimerization of monomers each of which is the compound represented by formula (III) or (IIIa) in which $n^8$ is 1 and $n^9$ is 0. For example, the boron-containing compound represented by formula (39) can be obtained by the following reaction scheme:

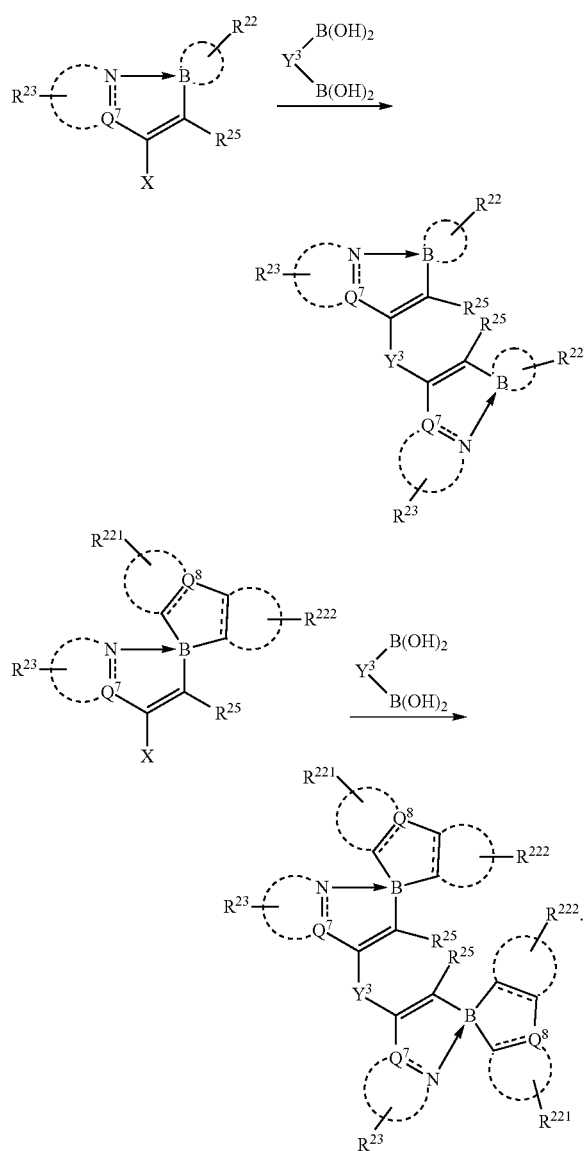

The boron-containing compound used as the second material is also preferably a boron-containing compound represented by formula (16):

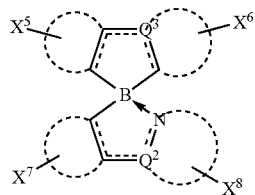

(16)

wherein the dotted arcs indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^3$ and $Q^4$ are the same as or different from each other and each represent a linking group in the backbone shown in the solid lines, at least part of the linking group forms a ring structure with a dotted arc portion and is optionally substituted; $X^5$ and $X^6$ are the same as or different from each other and each represent a hydrogen atom or a monovalent substituent as a substituent in the corresponding ring structure; $X^7$ and $X^8$ are the same as or different from each other and each represent a monovalent substituent having electron transporting property as a substituent in the corresponding ring structure; and each of the ring structures forming the dotted arc portions optionally contains multiple $X^5$s, multiple $X^6$s, multiple $X^7$s, or multiple $X^8$s.

In formula (16), the dotted arcs indicate that ring structures are formed with the backbone shown in the solid lines, specifically, with part of the backbone portions connecting the boron atom and $Q^3$ or part of the backbone portions connecting the boron atom, $Q^4$, and the nitrogen atom. This indicates that the compound represented by formula (16) has at least four ring structures in the structure and these ring structures incorporate the backbone portions connecting the boron atom and $Q^3$ and the backbone portions connecting the boron atom, $Q^4$, and the nitrogen atom in formula (16).

In formula (16), the dotted line portions of the backbone shown in the solid lines, specifically, the dotted line portions of part of the backbone portions connecting the boron atom and $Q^3$ and the dotted line portions of part of the backbone portions connecting the boron atom, $Q^4$, and the nitrogen atom each indicate that a pair of atoms connected by the corresponding dotted line in the corresponding backbone portion may optionally be bonded by a double bond.

In formula (16), the arrow from the nitrogen atom to the boron atom indicates that the nitrogen atom is coordinated to the boron atom. The term "coordinated" as used herein means that the nitrogen atom acts as a ligand and chemically affects the boron atom.

In formula (16), $Q^3$ and $Q^4$ are the same as or different from each other and each represent a linking group in the backbone shown in the solid lines, at least part of the linking group forms a ring structure with a dotted arc portion and is optionally substituted. This means that each ring structure incorporates $Q^3$ and $Q^4$.

Examples of $Q^3$ and $Q^4$ in formula (16) include the structures represented by formulas (3-1) to (3-8). The structure represented by formula (3-2) consists of carbon atoms and two hydrogen atoms and three other atoms bonded to the carbon atoms. None of these three atoms bonded to the carbon atoms other than the hydrogen atoms are hydrogen atoms. Among these structures represented by formulas (3-1) to (3-8), any of the structures represented by formulas (3-1), (3-7), and (3-8) is preferred. More preferred is the structure represented by formula (3-1). Thus, it is another preferred embodiment of the present invention that $Q^3$ and $Q^4$ are the same as or different from each other and each represent a C1 linking group.

In formula (16), the rings to each of which one of $X^5$ to $X^7$ is bonded are exemplified by those mentioned as the specific examples of the ring to which $X^1$ is bonded in formula (14) when $Y^1$ represents a direct bond and $n^1$ is 2. In particular, a benzene ring, a naphthalene ring, a thiophene ring, and a benzothiophene ring are preferred. A benzene ring and a thiophene ring are more preferred.

In formula (16), the ring to which $X^8$ is bonded is exemplified by those mentioned as the specific examples of the ring to which $X^2$ is bonded in formula (14) when $Y^1$ represents a direct bond and $n^1$ is 2, and the same applies to preferred ring structures thereof. The symbol "*" in formulas (5-1) to (5-17) indicates that the carbon atom that forms the ring to which $X^7$ is bonded and forms the backbone portion connecting the boron atom, $Q^4$, and the nitrogen atom in formula (16) is bonded to any one of the carbon atoms marked with "*". These rings may be fused with another ring structure at a site other than the carbon atoms marked with "*".

Thus, it is another preferred embodiment of the present invention that the boron-containing compound represented by formula (16) is a boron-containing compound represented by formula (17):

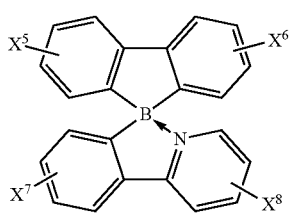

(17)

wherein the arrow from the nitrogen atom to the boron atom, $X^5$, $X^6$, $X^7$, and $X^8$ are as defined above for formula (16).

In the boron-containing compound represented by formula (17), the rings to which $X^5$, $X^6$, $X^7$, and $X^8$ are bonded consist only of carbon atoms, except for the nitrogen atom coordinated to the boron atom. Thus, compared to a compound containing a heteroatom such as S in the ring, the molecular orbital of the boron-containing compound is less spread, which, in general terms, allows the compound to maintain a wide energy gap between HOMO and LUMO. Thus, the compound in the present invention can be suitably used, for example, for an electron injection layer of an organic EL device.

In formula (16), $X^5$ and $X^6$ are the same as or different from each other and each represent a hydrogen atom or a monovalent substituent as a substituent in the corresponding ring structure. Examples of the monovalent substituent include, but are not particularly limited to, those mentioned as the specific examples of the monovalent substituents for $X^1$, $X^2$, $X^3$, and $X^4$ in formula (14). The same applies to preferred substituents thereof, except that an oligoaryl group, a monovalent heterocyclic group, and a monovalent oligoheterocyclic group are also included as more preferred substituents.

In formula (16), when $X^5$, $X^6$, $X^7$, and $X^8$ each represent a monovalent substituent, the binding positions and the number of substituents of $X^5$, $X^6$, $X^7$, and $X^8$ to the ring structures are not particularly limited.

In formula (16), $X^7$ and $X^8$ are the same as or different from each other and each represent a monovalent substituent having electron transporting property as a substituent in the corresponding ring structure. The presence of substituents having electron transporting property for $X^7$ and $X^8$ allows the boron-containing compound represented by formula (16) to be a material having excellent electron transporting property.

Examples of the monovalent substituent having electron transporting property include monovalent groups derived from a nitrogen-containing heterocyclic ring in which a carbon-nitrogen double bond (C=N) is present in the ring, such as an imidazole ring, a thiazole ring, an oxazole ring, an oxadiazole ring, a triazole ring, a pyrazole ring, a pyridine ring, a pyrazine ring, a triazine ring, a benzimidazole ring, a benzothiazole ring, a quinoline ring, an isoquinoline ring, a quinoxaline ring, or a benzothiadiazole ring; monovalent groups derived from an aromatic hydrocarbon ring or an aromatic heterocyclic ring in which no carbon-nitrogen double bond is present in the ring, such as a benzene ring, a naphthalene ring, a fluorene ring, a thiophene ring, a benzothiophene ring, or a carbazole ring, each having at least one electron-withdrawing substituent; and a dibenzothiophene dioxide ring, a dibenzophosphole oxide ring, and a silole ring.

Examples of the electron-withdrawing substituent include —CN, —COR, —COOR, —CHO, —CF$_3$, —SO$_2$Ph, and —PO(Ph)$_2$. Here, R represents a hydrogen atom or a monovalent hydrocarbon group.

Among these, the monovalent substituent having electron transporting property is preferably derived from a nitrogen-containing heterocyclic ring in which a carbon-nitrogen double bond (C=N) is present in the ring.

The monovalent substituent having electron transporting property is more preferably any of monovalent groups derived from a heteroaromatic ring compound having a carbon-nitrogen double bond in the ring.

Examples of the substituents for $X^5$, $X^6$, $X^7$, and $X^8$ include those mentioned as substituents for $X^1$, $X^2$, $X^3$, and $X^4$ in formula (14).

The boron-containing compound represented by formula (16) can be synthesized by, for example, the synthesis method including the first and second steps below. In the following reaction scheme, $Z^1$ represents a bromine atom or an iodine atom and $Z^2$ represents a chlorine atom, a bromine atom, or an iodine atom.

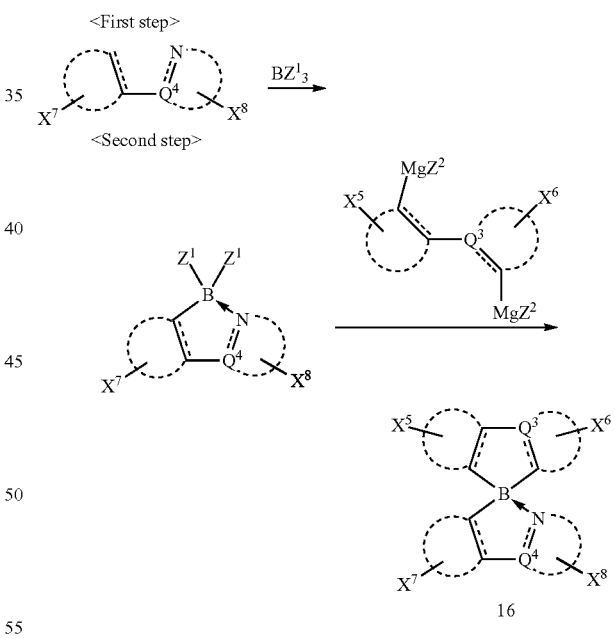

Examples of a solvent used in the first step in the method of synthesizing the boron-containing compound represented by formula (16) include, but are not particularly limited to, hexane, heptane, benzene, toluene, diethyl ether, diisopropyl ether, dibutyl ether, and cyclopentyl methyl ether. Each of these may be used alone or two or more of these may be used in combination.

The first step in the method of synthesizing the boron-containing compound represented by formula (16) can be carried out by referring to the disclosure of JP 2011-184430 A.

The reaction temperature of the second step is preferably in the range of 0° C. to 40° C. The reaction may be carried out under any of normal, reduced, or increased pressure.

The reaction time of the second step is preferably 3 to 48 hours.

The method of synthesizing the boron-containing compound represented by formula (16) may further include one or more steps of replacing any one or more of the substituents represented by $X^5$ to $X^8$ by other substituent(s) after the second step. For example, when any of $X^5$ to $X^8$ is a halogen atom, the halogen atom can be replaced by a substituent X by reaction such as the Still cross-coupling reaction, the Suzuki-Miyaura cross-coupling reaction, the Sonogashira cross-coupling reaction, the Heck cross-coupling reaction, the Hiyama coupling reaction, or the Negishi coupling reaction.

The above coupling reactions can be carried out appropriately under the reaction conditions commonly used for the respective coupling reactions.

The boron-containing compound represented by formula (16) is most preferably the boron-containing compound represented by formula (1).

The boron-containing compound used as the second material is also preferably a boron-containing compound represented by formula (18):

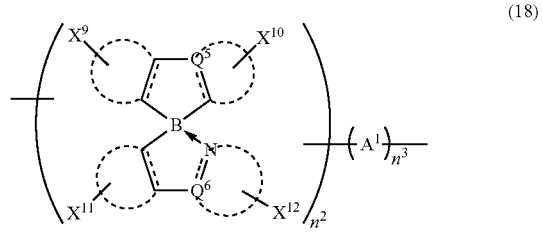

(18)

wherein the dotted arcs indicate that ring structures are formed with the backbone shown in the solid lines; the dotted line portions of the backbone shown in the solid lines each indicate that a pair of atoms connected by the corresponding dotted line is optionally bonded by a double bond; the arrow from the nitrogen atom to the boron atom indicates that the nitrogen atom is coordinated to the boron atom; $Q^5$ and $Q^6$ are the same as or different from each other and each represent a linking group in the backbone shown in the solid lines, at least part of the linking group forms a ring structure with a dotted arc portion and is optionally substituted; $X^9$, $X^{10}$, $X^{11}$, and $X^{12}$ are the same as or different from each other and each represent a hydrogen atom, a monovalent substituent as a substituent in the corresponding ring structure, or a direct bond; each of the ring structures forming the dotted arc portions optionally contains multiple $X^9$s, multiple $X^{10}$s, multiple $X^{11}$s, or multiple $X^{12}$s; $A^1$s are the same as or different from each other and each represent a divalent group; the structural unit in a parenthesis marked with $n^2$ bonds to its adjacent structural units via any two of $X^9$, $X^{10}$, $X^{11}$, and $X^{12}$; and $n^2$ and $n^3$ are the same as or different from each other and each independently represent 1 or greater.

In formula (18), $Q^5$ and $Q^6$ are the same as $Q^3$ and $Q^4$ in formula (16), respectively, and the same applies to preferred embodiments thereof. Specifically, $Q^5$ and $Q^6$ are the same as or different from each other, and each preferably represent a C1 linking group.

In formula (18), the dotted arcs, the dotted line portions of the backbone shown in the solid lines, and the arrow from the nitrogen atom to the boron atom are as defined above for formula (16), and preferred structures of the dotted arcs are also as mentioned above for formula (16). That is, the boron-containing compound represented by formula (18) is preferably a boron-containing compound represented by formula (19):

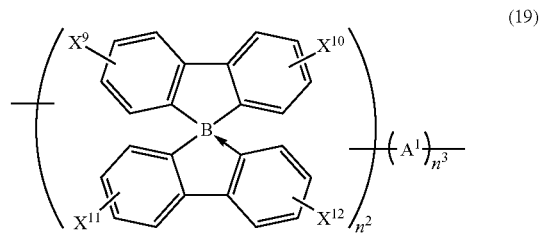

(19)

wherein the arrow from the nitrogen atom to the boron atom, $X^9$, $X^{10}$, $X^{11}$, $X^{12}$, $A^1$, $n^2$, and $n^3$ are as defined above for formula (18), and the bond between the structural unit in the parenthesis marked with $n^2$ and its adjacent structural unit is also as defined above for formula (18).

In formula (18), $n^2$ represents the number of structural units in the parenthesis marked with $n^2$ and is 1 or greater, $n^3$ represents the number of structural units in the parenthesis marked with $n^3$ and is 1 or greater, and $n^2$ and $n^3$ are independently the same as or different from each other and are each 1 or greater. This means that $n^2$ and $n^3$ are independent of each other, and may thus be the same as or different from each other.

The boron-containing compound represented by formula (18) may have one or more of the repeating unit structures represented by formula (18). When the boron-containing compound has multiple repeating unit structures represented by formula (18), $n^2$ and $n^3$ in one structure may be the same as or different from $n^2$ and $n^3$ in its adjacent structure, respectively.

Thus, the boron-containing compound represented by formula (18) may be any of an alternating copolymer (which has two or more repeating unit structures represented by formula (18) wherein $n^2$s are the same as each other and $n^3$s are the same as each other among all the repeating unit structures represented by formula (18)); a block copolymer (which has one repeating unit structure represented by formula (18) wherein at least one of $n^2$ or $n^3$ represent(s) 2 or greater); and a random copolymer (which has two or more repeating unit structures represented by formula (18) wherein either or both of $n^2$ and $n^3$ in at least one of the repeating unit structures represented by formula (18) are different from $n^2$ and $n^3$ in other structure(s)).

The boron-containing compound represented by formula (18) is preferably an alternating copolymer among these copolymers.

In formula (18), $X^9$, $X^{10}$, $X^{11}$, and $X^{12}$ are the same as or different from each other and each represent a hydrogen atom, a monovalent substituent as a substituent in the corresponding ring structure, or a direct bond.

In formula (18), any two of $X^9$, $X^{10}$, $X^{11}$, and $X^{12}$ form a bond as a portion of the main chain of the polymer. Among $X^9$ to $X^{12}$, those that form a bond as a portion of the main chain of the polymer represent direct bonds. Among $X^9$, $X^{10}$, $X^{11}$, and $X^{12}$, those that are not involved in polymerization represent hydrogen atoms or monovalent substituents.

Among $X^9$, $X^{10}$, $X^{11}$, and $X^{12}$, specific examples and preferred examples of the monovalent groups that are not involved in polymerization include those mentioned as the specific examples and preferred examples of $X^5$ and $X^6$ of the boron-containing compound represented by formula (16).

In the boron-containing compound represented by formula (18), any of $X^9$, $X^{10}$, $X^{11}$, and $X^{12}$ may represent a direct bond, but it is preferred that $X^9$ and $X^{10}$ each represent a direct bond or $X^{11}$ and $X^{12}$ each represent a direct bond. In this case, the boron-containing compound represented by formula (18) is a polymer having a repeating unit structure represented by formula (20) or (21):

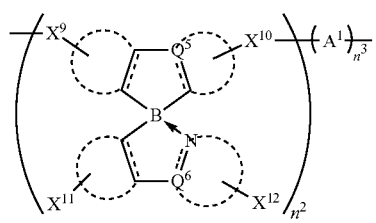
(20)

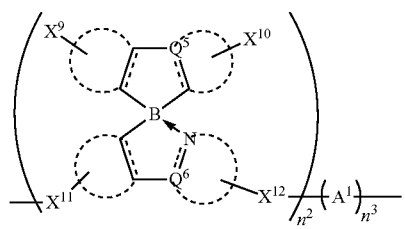
(21)

wherein the dotted arcs, the dotted line portions of the backbone shown in the solid lines, the arrow from the nitrogen atom to the boron atom, $Q^5$, $Q^6$, $A^1$, $n^2$, and $n^3$ are as defined above for formula (18). In formula (20), $X^9$ and $X^{10}$ each represent a direct bond and $X^{11}$ and $X^{12}$ each represent a hydrogen atom or a monovalent substituent; and in formula (21), $X^{11}$ and $X^{12}$ each represent a direct bond and $X^9$ and $X^{10}$ each represent a hydrogen atom or a monovalent substituent.

When the boron-containing compound used as the second material is a polymer, the weight average molecular weight thereof is preferably 5,000 to 1,000,000. The coating composition containing the second material with an average molecular weight falling within such a range and the first material can be easily formed into an organic thin film with a small thickness by application. The weight average molecular weight is more preferably 10,000 to 500,000, still more preferably 30,000 to 200,000.

The weight average molecular weight can be measured by gel permeation chromatography (GPC) using polystyrene standards with the following apparatus under the following measurement conditions.
High-speed GPC apparatus: HLC-8220GPC (produced by Tosoh Corporation)
Developing solvent: chloroform
Column: two TSK-gel GMHXL columns
Eluent flow rate: 1 ml/min
Column temperature: 40° C.

In formula (18), $A^1$ is not particularly limited as long as it is a divalent group, and is preferably any of an alkenyl group, an arylene group, and a divalent aromatic heterocyclic group.

The arylene group is an atomic group obtained by removing two hydrogen atoms from an aromatic hydrocarbon, and typically contains about 6 to 60 carbon atoms constituting the ring(s), preferably 6 to 20 carbon atoms. Examples of the aromatic hydrocarbon also include those having a fused ring and those having two or more rings, which are selected from an independent benzene ring and a fused ring, bonded together directly or via a group such as vinylene.

Examples of the arylene group include groups represented by formulas (15-1) to (15-23) below. Preferred among these are a phenylene group, a biphenylene group, a fluorene-diyl group, and a stilbene-diyl group.

In formulas (15-1) to (15-23), Rs may be the same as or different from each other and each represent a hydrogen atom, a halogen atom, an alkyl group, an alkyloxy group, an alkylthio group, an alkylamino group, an aryl group, an aryloxy group, an arylthio group, an arylalkyl group, an arylalkyloxy group, an arylalkylthio group, an acyl group, an acyloxy group, an amide group, an imide group, an imine residue, an amino group, a substituted amino group, a substituted silyl group, a substituted silyloxy group, a substituted silylthio group, a substituted silylamino group, a monovalent heterocyclic group, a heteroaryloxy group, a heteroarylthio group, an arylalkenyl group, an arylethynyl group, a carboxyl group, an alkyloxycarbonyl group, an aryloxycarbonyl group, an arylalkyloxycarbonyl group, a heteroaryloxycarbonyl group, or a cyano group.

In formulas (15-1) to (15-23), lines each crossing a ring structure such as one shown by "x-y" in formula (15-1) indicates that the ring structure is directly bonded to an atom in a binding site to which the ring structure is bonded. Specifically, in formula (15-1), it means that one of the carbon atoms forming the ring with the line "x-y" is directly bonded to an atom in a binding site to which the ring structure is bonded, and the binding position in the ring structure is not particularly limited.

In formulas (15-1) to (15-23), lines each at a corner of a ring structure such as one shown by "z-" in formula (15-10) indicates that the ring structure is directly bonded at this position to an atom in a binding site to which the ring structure is bonded.

In addition, lines with "R" each crossing a ring structure indicates that one or more Rs may be bonded to the ring structure, and the binding position is also not limited.

Further, in formulas (15-1) to (15-10) and (15-15) to (15-20), a carbon atom may be replaced by a nitrogen atom, and a hydrogen atom may be replaced by a fluorine atom.

(15-1)

(15-2)

(15-3)

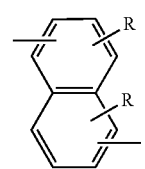

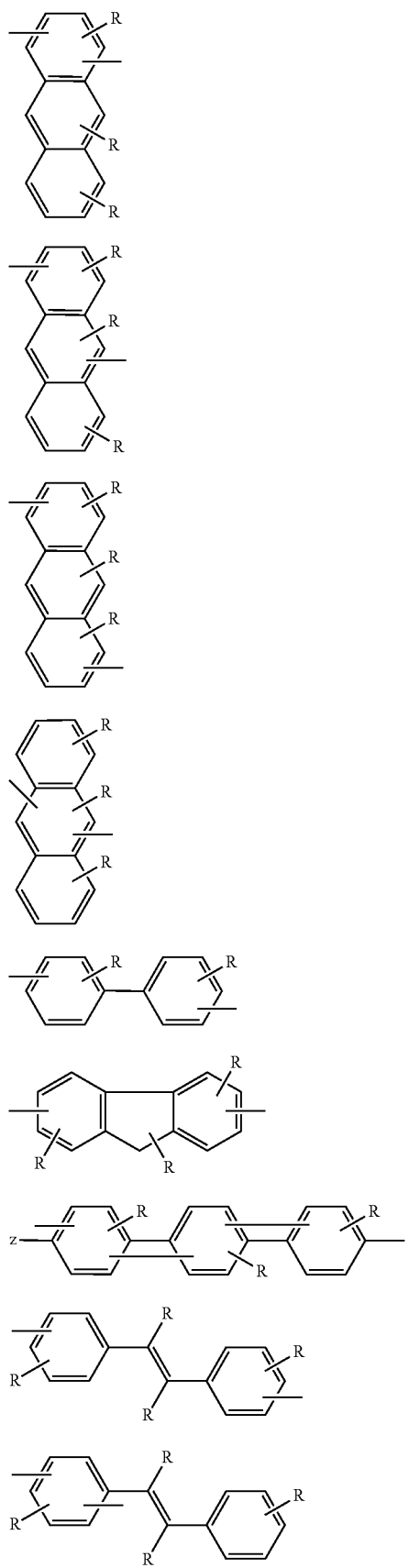
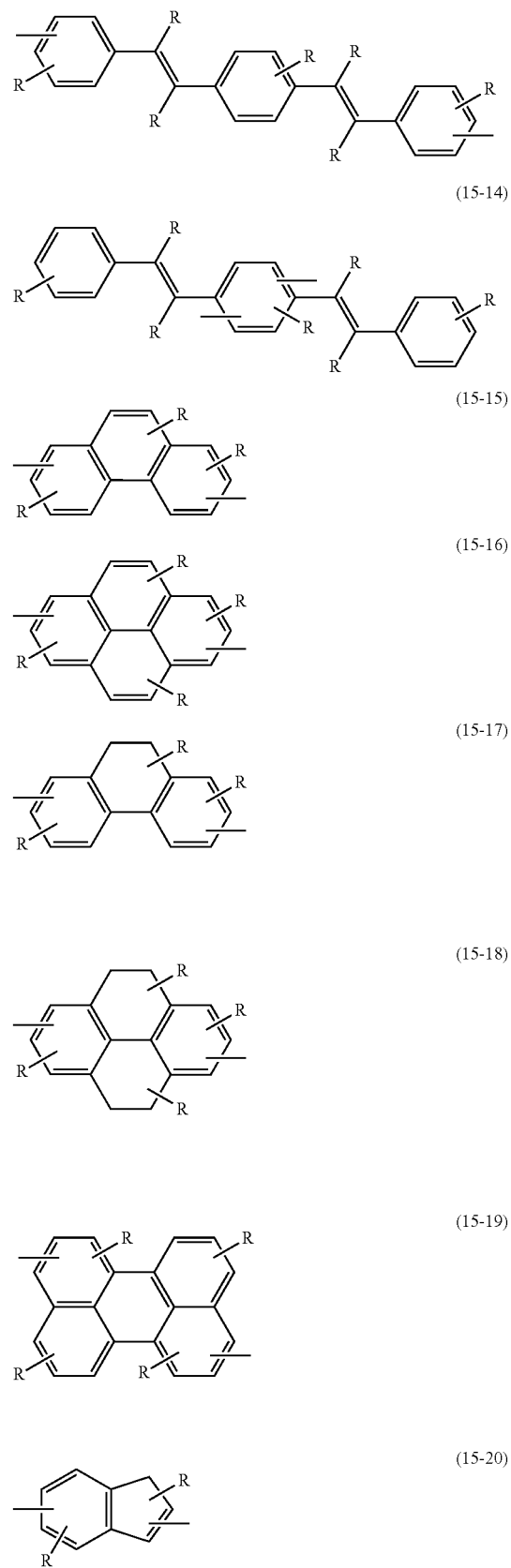

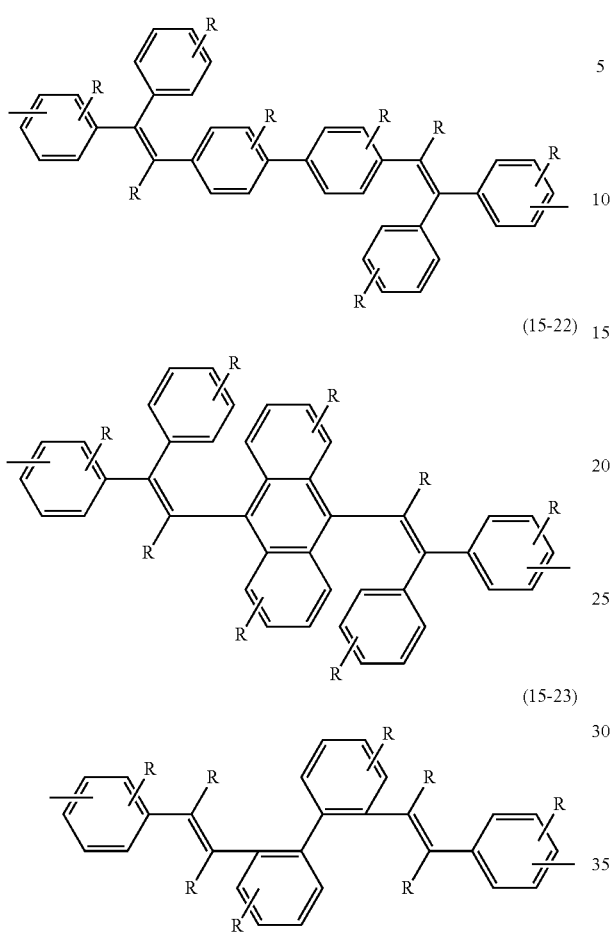

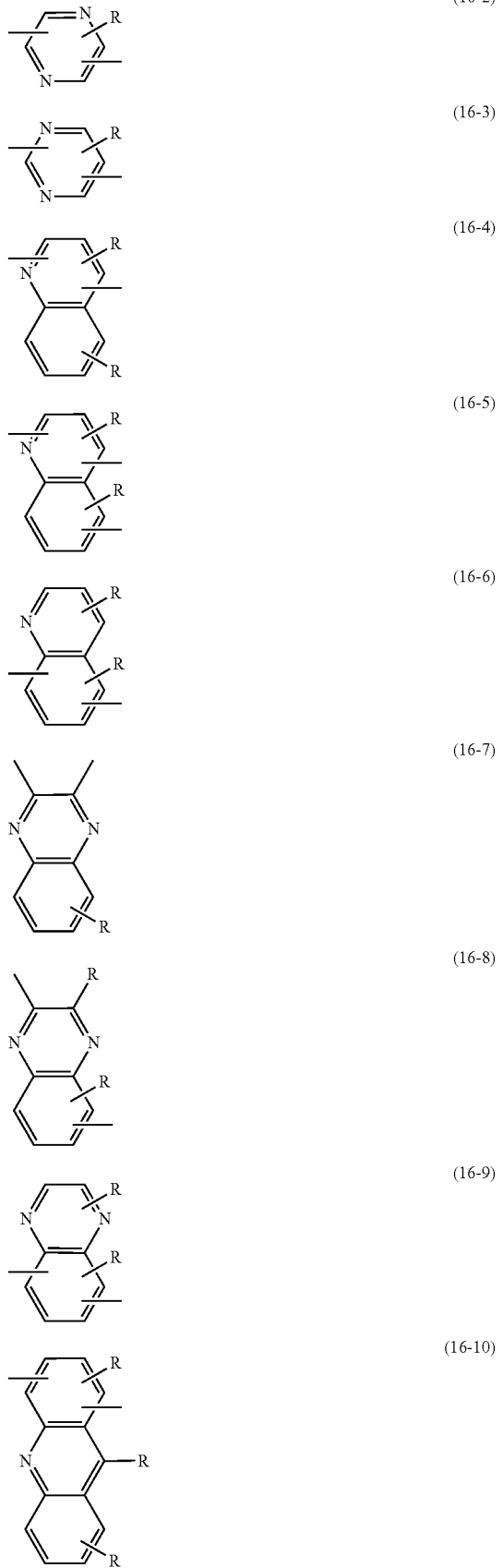

The divalent aromatic heterocyclic group is an atomic group obtained by removing two hydrogen atoms from an aromatic heterocyclic compound, and typically contains about 3 to 60 carbon atoms constituting the ring(s). Examples of the aromatic heterocyclic compound include aromatic organic compounds having a cyclic structure consisting only of carbon atoms and aromatic organic compounds having a cyclic structure containing a heteroatom such as oxygen, sulfur, nitrogen, phosphorus, boron, or arsenic.

Examples of the divalent aromatic heterocyclic group include heterocyclic groups represented by formulas (16-1) to (16-38) below.

In formulas (16-1) to (16-38), R is the same as R in the arylene group. Y represents O, S, SO, $SO_2$, Se, or Te. Lines each crossing a ring structure, lines each at a corner of a ring structure, and lines with "R" each crossing a ring structure are as defined above for formulas (15-1) to (15-23).

In addition, in formulas (16-1) to (16-38), a carbon atom may be replaced by a nitrogen atom, and a hydrogen atom may be replaced by a fluorine atom.

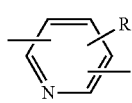

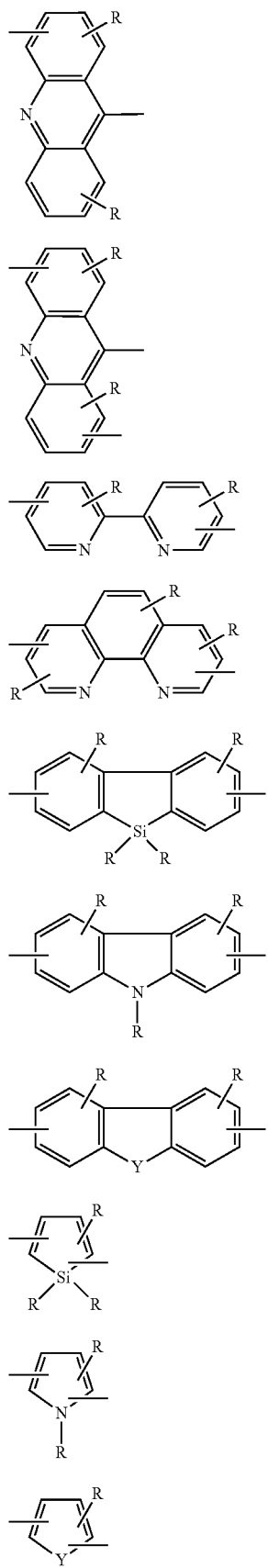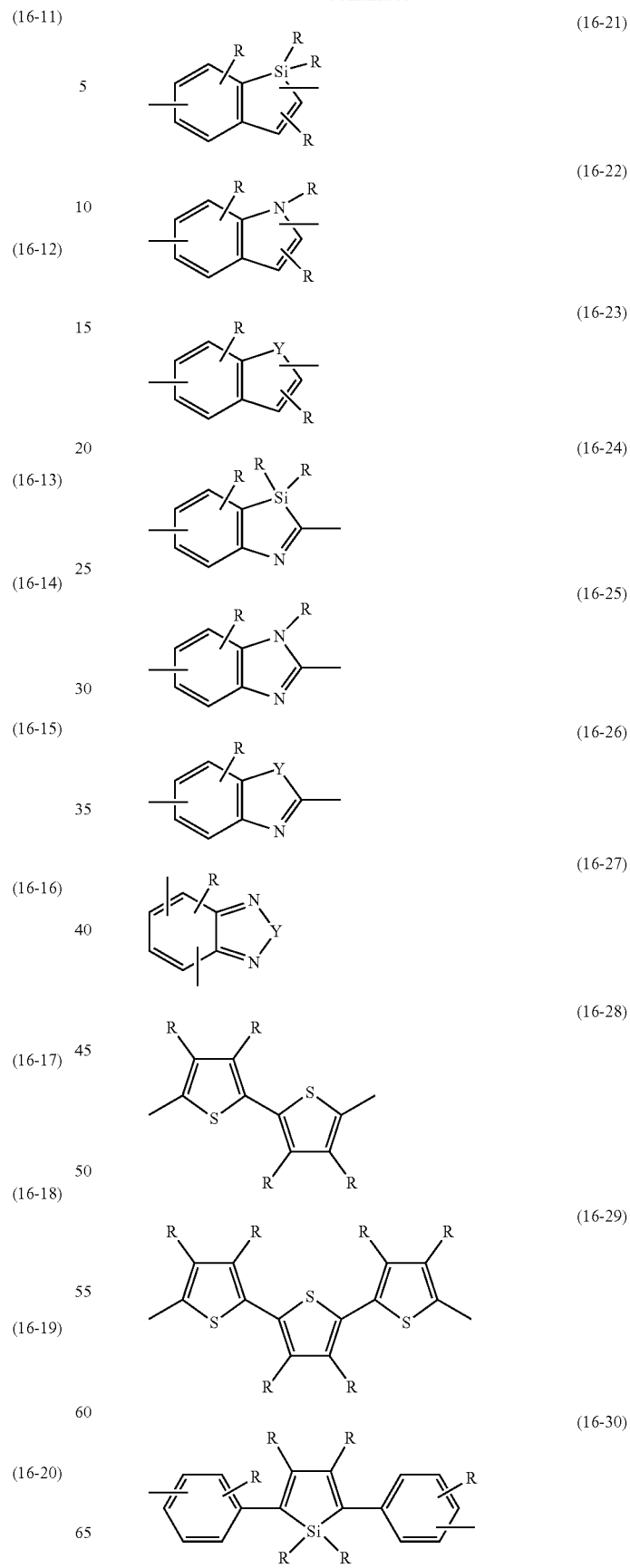

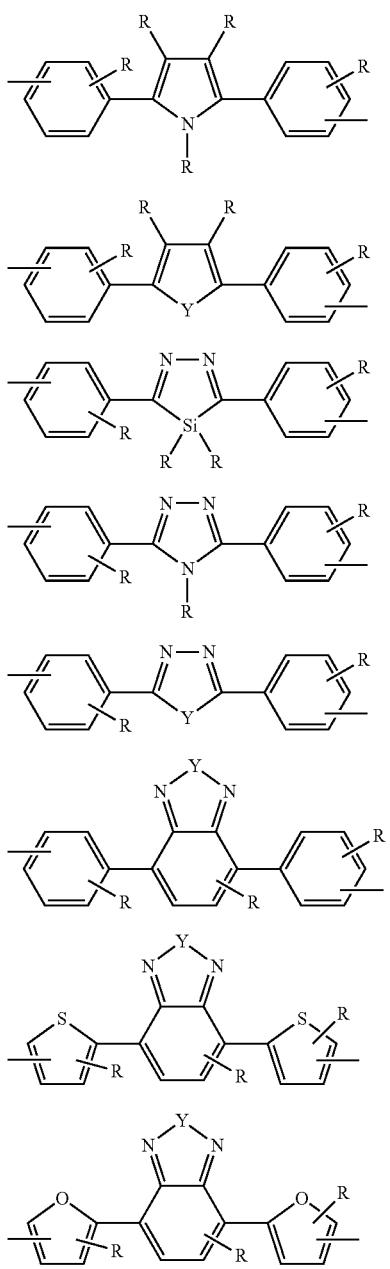

(16-31)
(16-32)
(16-33)
(16-34)
(16-35)
(16-36)
(16-37)
(16-38)

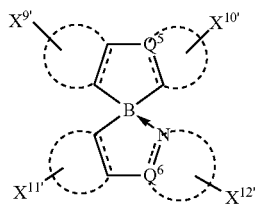

(22)

In formula (22), the dotted arcs, the dotted line portions of the backbone shown in the solid lines, the arrow from the nitrogen atom to the boron atom, and $Q^5$ and $Q^6$ are as defined above for formula (18); and $X^{9'}$, $X^{10'}$, $X^{11'}$, and $X^{12'}$ are the same as or different from each other and each represent a hydrogen atom or a monovalent substituent as a substituent in the corresponding ring structure, and at least two of $X^{9'}$, $X^{10'}$, $X^{11'}$, and $X^{12'}$ are reactive groups reactive with $X^{13}$ or $X^{14}$ in formula (23):

$$X^{13}\text{-}A^1\text{-}X^{14} \qquad (23)$$

wherein $A^1$ is as defined above for formula (18), and $X^{13}$ and $X^{14}$ each represent a reactive group.

The boron-containing polymer represented by formula (18) is synthesized by polycondensation of the boron-containing compound represented by formula (22) and the compound represented by formula (23).

The monovalent substituents for $X^{9'}$ to $X^{12'}$ are the same as the monovalent substituents for $X^9$ to $X^{12}$ in formula (18), excluding the reactive groups reactive with $X^{13}$ or $X^{14}$ in formula (23).

Preferred combinations of the reactive groups that can undergo polycondensation are listed below. It is preferred that the boron-containing compound represented by formula (22) and the compound represented by formula (23) undergo polycondensation by any of the following combinations of the reactive groups that can undergo polycondensation.

Such combinations are as follows: boryl group and halogen atom, stannyl group and halogen atom, aldehyde group and phosphonium methyl group, vinyl group and halogen atom, aldehyde group and phosphonate methyl group, halogen atom and halogenated magnesium, halogen atom and halogen atom, halogen atom and silyl group, and halogen atom and hydrogen atom.

The monomer component for producing the boron-containing compound represented by formula (18) may contain an additional monomer as long as the monomer component contains the boron-containing compound represented by formula (22) and the compound represented by formula (23).

When the monomer component contains an additional monomer, the total amount of the boron-containing compound represented by formula (22) and the compound represented by formula (23) is preferably 90 mol % or more, more preferably 95 mol % or more, most preferably 100 mol %, based on 100 mol % of the entire monomer component. That is, the monomer component most preferably consists of only the boron-containing compound represented by formula (22) and the compound represented by formula (23).

Examples of the additional monomer include compounds having a reactive group reactive with the boron-containing compound represented by formula (22) or the compound represented by formula (23). The monomer component may contain one or more boron-containing compounds represented by formula (22) and one or more compounds represented by formula (23).

Among these, the groups represented by formulas (15-1), (15-9), (16-1), (16-9), (16-16), and (16-17) are preferred as $A^1$ in formula (18). More preferred are the groups represented by formulas (15-1) and (15-9). In such cases, the coating composition containing the first material and the boron-containing compound represented by formula (18) as the second material can be formed into an organic thin film with excellent film-forming properties by application.

The boron-containing compound represented by formula (18) may be produced by any method, such as the production method disclosed in JP 2011-184430 A.

The boron-containing compound represented by formula (18) is preferably produced, for example, by reacting a monomer component containing a boron-containing compound represented by formula (22) below having a reactive group and a compound represented by formula (23) below.

The molar ratio between the boron-containing compound represented by formula (22) and the compound represented by formula (23) in the monomer component is preferably 100/0 to 10/90, more preferably 70/30 to 30/70, most preferably 50/50.

In addition, the solid concentration of the monomer component in the polymerization is preferably appropriately set in the range of 0.01% by mass to the maximum concentration at which the monomer component can be dissolved in a solvent. If the solid concentration is too low, the reaction efficiency may be poor, while if the solid concentration is too high, the reaction may be difficult to control. Thus, the solid concentration is preferably 0.05% to 10% by mass.

The boron-containing compound represented by formula (18) is most preferably a boron-containing compound represented by formula (21-1) or (21-2). The boron-containing compound represented by formula (18) is particularly preferably the boron-containing compound represented by formula (21-2) which easily dissolves in a solvent and can easily provide a coating composition containing the first material and the second material.

In formula (21-1), $n^5$ represents 1 or greater.
In formula (21-2), $n^4$ represents 1 or greater.

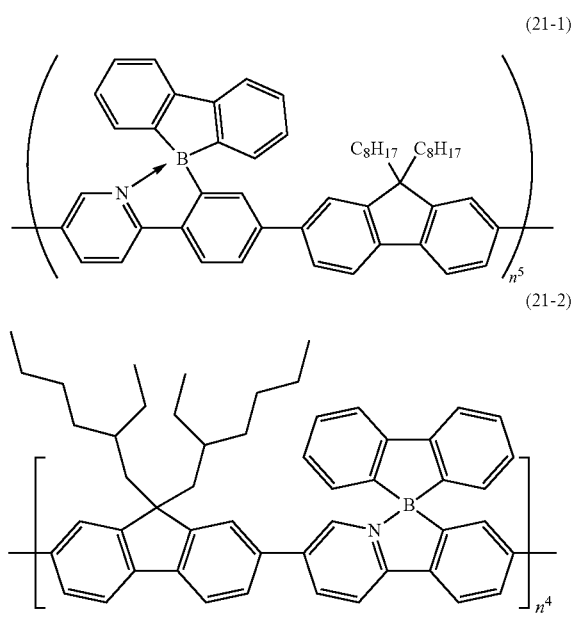

Consequently, when the boron-containing compound represented by formula (14), (16), or (18) is used as the second material having electron transporting property, a uniform organic thin film is easily obtained by application of the coating composition containing the first material and the second material.

The boron-containing compounds represented by formulas (14), (16), and (18) are suitable for a material of an electron injection layer of an organic EL device owing to their deep unoccupied molecular orbital (LUMO) levels. Therefore, an organic thin film containing any of these boron-containing compounds as the second material is suitable particularly as an electron injection layer of an organic EL device.

The first material and the second material may be combined in the organic thin film of the present embodiment at any ratio appropriately depending on the types of compounds used as the first material and the second material. The first material and the second material are preferably combined at the mass ratio (first material:second material) of 0.01:99.9 to 10:1. For example, when dimethylaminopyridine (DMAP) is used as the first material and the boron-containing compound represented by formula (1) is used as the second material, the first material and the second material are preferably combined at the mass ratio (first material:second material) of 0.5:1 to 40:1, more preferably 2:1 to 20:1. Within the above mass ratio, the electron transporting property and the electron injection property are remarkably improved owing to the presence of the first material and the second material in the organic thin film.

The organic thin film of the present embodiment may consist of only the first material and the second material, or may contain an additional material other than the first material and the second material as long as the effects of the present invention are obtained. When the organic thin film contains an additional material other than the first material and the second material, the amount (% by mass) of the additional material is preferably not more than the amount (% by mass) of the second material, for example.

The additional material other than the first material and the second material is preferably an electron transport material. The electron transport material may be any material known as a material of an electron transport layer of an organic EL device, for example. Specific examples thereof include phosphine oxide derivatives such as phenyl-dipyrenylphosphine oxide (POPy$_2$); pyridine derivatives such as tris-1,3,5-(3'-(pyridin-3"-yl)phenyl)benzene (TmPyPhB); quinoline derivatives such as (2-(3-(9-carbazolyl)phenyl)quinoline (mCQ)); pyrimidine derivatives such as 2-phenyl-4,6-bis(3,5-dipyridylphenyl)pyrimidine (BPyPPM); pyrazine derivatives; phenanthroline derivatives such as bathophenanthroline (BPhen); triazine derivatives such as 2,4-bis(4-biphenyl)-6-(4'-(2-pyridinyl)-4-biphenyl)-[1,3,5] triazine (MPT); triazole derivatives such as 3-phenyl-4-(1'-naphthyl)-5-phenyl-1,2,4-triazole (TAZ); oxazole derivatives; oxadiazole derivatives such as 2-(4-biphenyl)-5-(4-tert-butylphenyl-1,3,4-oxadiazole) (PBD); imidazole derivatives such as 2,2',2"-(1,3,5-benzenetriyl-tris(1-phenyl-1-H-benzimidazole) (TPBI); aromatic ring tetracarboxylic anhydrides such as naphthalene and perylene; various metal complexes typified by bis[2-(2-hydroxyphenyl)benzothiazolato]zinc (Zn(BTZ)$_2$) and tris(8-hydroxyquinolinato)aluminum (Alq$_3$); organic silane derivatives typified by silole derivatives such as 2,5-bis(6'-(2',2"-bipyridyl))-1,1-dimethyl-3,4-diphenylsilole (PyPySPyPy); and boron-containing compounds.

The first material in the organic thin film of the present embodiment includes one or two or more selected from the group consisting of tertiary amines, phosphazene compounds, guanidine compounds, heterocyclic compounds containing an amidine structure, and ketone compounds. When any of the above additional materials is used as the first material, the resulting organic thin film may possibly be unfavorable as an electron injection layer of an organic EL device.

For example, when polyethyleneimine, the molecule of which contains a primary amine and a secondary amine unstable for electrical stimulation, is used as the first material, it promotes a decrease in luminance, and thus the resulting organic thin film may be unfavorable as an electron injection layer of an organic EL device.

"Method for Producing Organic Thin Film"

Next, a method for producing the organic thin film of the present embodiment will be described as an example.

In the present embodiment, a coating composition containing the first material which is an organic material having a pKa of 1 or greater and the second material which transports an electron is prepared. The resulting coating composition is applied to the surface on which an organic thin film is to be formed.

The coating composition is obtained by stirring and dissolving predetermined amounts of the first material and the second material in a solvent in a container, for example.

Examples of the solvent to dissolve the first material and the second material include inorganic solvents, organic solvents, and solvent mixtures containing these solvents.

Examples of the inorganic solvents include nitric acid, sulfuric acid, ammonia, hydrogen peroxide, water, carbon disulfide, carbon tetrachloride, and ethylene carbonate.

Examples of the organic solvents include ketone-based solvents such as methyl ethyl ketone (MEK), acetone, diethyl ketone, methyl isobutyl ketone (MIBK), methyl isopropyl ketone (MIPK), diisobutyl ketone, 3,5,5-trimethylcyclohexanone, diacetone alcohol, cyclopentanone, and cyclohexanone; alcohol-type solvents such as methanol, ethanol, isopropanol, ethylene glycol, diethylene glycol (DEG), and glycerine; ether-based solvents such as diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (carbitol); cellosolve-based solvents such as methyl cellosolve, ethyl cellosolve, and phenyl cellosolve; aliphatic hydrocarbon-based solvents such as hexane, pentane, heptane, and cyclohexane; aromatic hydrocarbon-based solvents such as toluene, xylene, and benzene; aromatic heterocyclic compound-based solvents such as pyridine, pyrazine, furan, pyrrole, thiophene, and methylpyrrolidone; amide-based solvents such as N,N-dimethylformamide (DMF) and N,N-dimethylacetamide (DMA); halogenated compound-based solvents such as chlorobenzene, dichloromethane, chloroform, and 1,2-dichloroethane; ester-based solvents such as ethyl acetate, methyl acetate, and ethyl formate; sulfur compound-based solvents such as dimethyl sulfoxide (DMSO) and sulfolane; nitrile-based solvents such as acetonitrile, propionitrile, and acrylonitrile; and organic acid-based solvents such as formic acid, acetic acid, trichloroacetic acid, and trifluoroacetic acid. Preferred among these are ketone-based solvents such as methyl ethyl ketone (MEK), acetone, diethyl ketone, methyl isobutyl ketone (MIBK), methyl isopropyl ketone (MIPK), diisobutyl ketone, 3,5,5-trimethylcyclohexanone, diacetone alcohol, and cyclopentanone.

Various methods can be used to apply the coating composition containing the first material and the second material, and examples thereof include a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, and an inkjet printing method.

After the application of the coating composition by such a method, the coating composition is preferably annealed at 70° C. to 200° C. for 0.1 to 5 hours in a nitrogen atmosphere or in the air atmosphere. Such annealing can evaporate the solvents, and thus can form an organic thin film.

"Organic EL Device"

The organic EL device of the present invention will be described in detail below as an example.

FIG. 1 is an explanatory cross-sectional view schematically showing an example of the organic EL device of the present invention. An organic EL device 1 of the present embodiment shown in FIG. 1 includes an emitting layer 6 between a cathode 3 and an anode 9. The organic EL device 1 shown in FIG. 1 includes an electron injection layer 5 formed from the organic thin film between the cathode 3 and the emitting layer 6.

The organic EL device 1 of the present embodiment has a multi-layer structure in which the following layers are formed on a substrate 2 in the stated order: the cathode 3, an inorganic oxide layer 4, the electron injection layer 5, an electron transport layer 10, the emitting layer 6, a hole transport layer 7, a hole injection layer 8, and the anode 9.

The organic EL device 1 shown in FIG. 1 is an inverted organic EL device (iOLED device) including the cathode 3 between the substrate 2 and the emitting layer 6. Also, the organic EL device 1 shown in FIG. 1 is an organic-inorganic hybrid organic electroluminescent device (ROILED device) in which part of the layers that constitute the organic EL device (at least the inorganic oxide layer 4) is formed from an inorganic compound.

The organic EL device 1 shown in FIG. 1 may be a top emission device in which light is extracted from the side opposite to the substrate 2, or may be a bottom emission device in which light is extracted from the substrate 2 side.

In the present embodiment, the inverted organic EL device will be described as an example, but the organic EL device of the present invention may be a conventional organic EL device in which an anode is fabricated between a substrate and an emitting layer. When the organic EL device of the present invention is a conventional organic EL device, it also has the organic thin film between a cathode and an emitting layer similarly to an inverted organic EL device. In an inverted organic EL device, the electron injection layer may be also referred to as an organic buffer layer.

"Substrate"

The substrate 2 is made of, for example, a resin material or a glass material.

Examples of the resin material of the substrate 2 include polyethylene terephthalate, polyethylene naphthalate, polypropylene, cycloolefin polymers, polyamides, polyethersulfone, polymethylmethacrylate, polycarbonate, and polyarylate. The substrate 2 made of a resin material is preferred because the organic EL device 1 obtains excellent flexibility.

Examples of the glass material of the substrate 2 include silica glass and soda glass.

When the organic EL device 1 is a bottom emission device, a transparent substrate may be used as the material of the substrate 2.

When the organic EL device 1 is a top emission device, not only a transparent substrate but also an opaque substrate may also be used as the material of the substrate 2. Examples of the opaque substrate include a substrate made of a ceramic material such as alumina, a substrate in which an oxide film (insulating film) is formed on the surface of a metal plate such as stainless steel, and a substrate made of a resin material.

The average thickness of the substrate 2 may be determined according to, for example, the material of the substrate 2, and is preferably 0.1 to 30 mm, more preferably 0.1 to 10 mm. The average thickness of the substrate 2 can be measured with a digital multimeter or a caliper.

"Cathode"

The cathode 3 is formed in direct contact with the substrate 2.

Examples of the material of the cathode 3 include conductive oxide materials such as indium tin oxide (ITO), indium zinc oxide (IZO), fluorine tin oxide (FTO), $In_2O_3$, $SnO_2$, Sb-containing $SnO_2$, and Al-containing ZnO. Preferred among these are ITO, IZO, and FTO.

The average thickness of the cathode 3 is not particularly limited, and is preferably 10 to 500 nm, more preferably 100 to 200 nm.

The average thickness of the cathode 3 can be measured with a stylus profiler or a spectroscopic ellipsometer.

"Oxide Layer"

The inorganic oxide layer 4 functions as an electron injection layer and/or a cathode. The oxide layer 4 is a layer including a thin semiconductor film and/or a thin insulating film. Specifically, the oxide layer 4 may be a layer consisting of a single metal oxide; a laminate of layers each consisting of a combination of two or more different metal oxides, a laminate of layers each consisting of a single metal oxide, or a laminate of a layer(s) each consisting of a combination of two or more different metal oxides and a layer(s) consisting of a single metal oxide; or a layer consisting of a combination of two or more different metal oxides.

Examples of a metal element of the metal oxide that forms the oxide layer 4 include magnesium, calcium, strontium, barium, titanium, zirconium, hafnium, vanadium, niobium, tantalum, chromium, molybdenum, tungsten, manganese, indium, gallium, iron, cobalt, nickel, copper, zinc, cadmium, aluminum, and silicon.

When the oxide layer 4 has a layer consisting of a combination of two or more different metal oxides, at least one of the metal elements of the metal oxides is preferably magnesium, aluminum, calcium, zirconium, hafnium, silicon, titanium, or zinc.

When the oxide layer 4 is a layer consisting of a single metal oxide, the metal oxide is preferably selected from the group consisting of magnesium oxide, aluminum oxide, zirconium oxide, hafnium oxide, silicon oxide, titanium oxide, and zinc oxide.

When the oxide layer 4 is a laminate of layers each consisting of a combination of two or more different metal oxides, a laminate of layers each consisting of a single metal oxide, a laminate of a layer(s) each consisting of a combination of two or more different metal oxides and a layer(s) consisting of a single metal oxide, or a layer consisting of a combination of two or more different metal oxides, two different metal oxides may be laminated and/or combined selected as a combination from, for example, titanium oxide/zinc oxide, titanium oxide/magnesium oxide, titanium oxide/zirconium oxide, titanium oxide/aluminum oxide, titanium oxide/hafnium oxide, titanium oxide/silicon oxide, zinc oxide/magnesium oxide, zinc oxide/zirconium oxide, zinc oxide/hafnium oxide, zinc oxide/silicon oxide, and calcium oxide/aluminum oxide; and three different metal oxides may be laminated and/or combined selected as a combination from, for example, titanium oxide/zinc oxide/magnesium oxide, titanium oxide/zinc oxide/zirconium oxide, titanium oxide/zinc oxide/aluminum oxide, titanium oxide/zinc oxide/hafnium oxide, titanium oxide/zinc oxide/silicon oxide, and indium oxide/gallium oxide/zinc oxide.

The oxide layer 4 may optionally contain indium gallium zinc oxide (IGZO) which is an oxide semiconductor with a particular composition and favorable characteristics and/or a $12CaO.7Al_2O_3$ electride.

The average thickness of the oxide layer 4 is not particularly limited, and is preferably 1 to 1000 nm, more preferably 2 to 100 nm.

The average thickness of the oxide layer 4 can be measured with a stylus profiler or a spectroscopic ellipsometer.

"Electron Injection Layer"

The electron injection layer 5 improves the injection rate of electrons from the cathode to the emitting layer 6 and the electron transporting property. The electron injection layer 5 is formed from the organic thin film.

The average thickness of the electron injection layer 5 is preferably 5 to 100 nm, more preferably 10 to 50 nm. When the electron injection layer 5 has an average thickness of 5 nm or greater, the layer can be formed by applying the coating composition containing the first material and the second material or by separately forming the first material and the second material into layers and laminating the layers, and the resulting electron injection layer 5 has a smooth surface and sufficiently prevents leakage caused in the production of the organic EL device 1. Also, when the electron injection layer 5 has an average thickness of 100 nm or less, an increase in the voltage for driving the organic EL device 1 due to the formation of such an electron injection layer 5 can be sufficiently suppressed.

When the first material and the second material are separately formed into layers and laminating the layers, the entire layers may constitute an electron injection layer. When the second material is contained in a layer adjacent to the electron injection layer such as an electron transport layer or an emitting layer, the second material layer may constitute a layer other than an electron injection layer. For example, it is an embodiment of the present invention that the first material forms an electron injection layer and the second material is contained in an electron transport layer and that the organic EL device has no electron transport layer, the first material forms an electron injection layer, and the second material layer is contained in an emitting layer.

The average thickness of the electron injection layer 5 can be measured, for example, with a stylus profiler or a spectroscopic ellipsometer.

As described above, the first material which is an organic material having a pKa of 1 or greater is capable of extracting a proton ($H^+$) from another material. Thus, in order to sufficiently promote injection of electrons from the oxide layer 4, a larger amount of the first material is preferably located on the oxide layer 4 side of the electron injection layer 5. Therefore, the electron injection layer 5 preferably has concentration distribution such that the concentration of the first material diminishes from the oxide layer 4 side to the electron transport layer 10 side.

The electron injection layer having such concentration distribution may be formed, for example, by applying a solution containing the first material to the oxide layer 4 to form a coat and applying a solution containing the second material to the coat of the first material, but may be formed by any other method that can provide the above concentration distribution.

The concentration distribution may be measured by time-of-flight secondary ion mass spectrometry (TOF-SIMS).

The first material which is an organic material having a pKa of 1 or greater is capable of extracting a proton ($H^+$) from another material as described above, and is suitably placed at a defective portion of an inorganic compound (oxide) to prevent reaction at the interface of the compound with oxygen or water entering from the outside. Therefore, in order to sufficiently exert the effects of the organic thin film of the present invention, the organic thin film of the present invention preferably includes a layer on the oxide layer. The thus obtained film having a laminate structure, that is, a laminate film including an oxide layer and the organic thin film of the present invention formed on the oxide layer is also another aspect of the present invention.

When the organic EL device includes an oxide layer and the organic thin film of the present invention formed on the oxide layer in the laminate structure, the organic EL device can be said to include the laminate film of the present invention. Such an organic EL device including the laminate film of the present invention is also another aspect of the present invention.

"Electron Transport Material"

The material of the electron-transport layer 10 can be any material that can be commonly used as a material of an electron-transport layer.

Specific examples of the material of the electron-transport layer 10 include phosphine oxide derivatives such as phenyl-dipyrenylphosphine oxide (POPy$_2$); pyridine derivatives such as tris-1,3,5-(3'-(pyridin-3"-yl)phenyl)benzene (TmPhPyB); quinoline derivatives such as (2-(3-(9-carbazolyl)phenyl)quinoline (mCQ)); pyrimidine derivatives such as 2-phenyl-4,6-bis(3,5-dipyridylphenyl)pyrimidine (BPyPPM); pyrazine derivatives; phenanthroline derivatives such as bathophenanthroline (BPhen); triazine derivatives such as 2,4-bis(4-biphenyl)-6-(4'-(2-pyridinyl)-4-biphenyl)-[1,3,5]triazine (MPT); triazole derivatives such as 3-phenyl-4-(1'-naphthyl)-5-phenyl-1,2,4-triazole (TAZ); oxazole derivatives; oxadiazole derivatives such as 2-(4-biphenyl)-5-(4-tert-butylphenyl-1,3,4-oxadiazole) (PBD); imidazole derivatives such as 2,2',2"-(1,3,5-benzenetriyl)-tris(1-phenyl-1-H-benzimidazole) (TPBI); aromatic ring tetracarboxylic anhydrides such as naphthalene and perylene; various metal complexes typified by bis[2-(2-hydroxyphenyl)benzothiazolato]zinc (Zn(BTZ)$_2$) and tris(8-hydroxyquinolinato) aluminum (Alq$_3$); organic silane derivatives typified by silole derivatives such as 2,5-bis(6'-(2',2"-bipyridyl))-1,1-dimethyl-3,4-diphenylsilole (PyPySPyPy); and boron-containing compounds disclosed in Japanese Patent Application No. 2012-228460, Japanese Patent Application No. 2015-503053, Japanese Patent Application No. 2015-053872, Japanese Patent Application No. 2015-081108, and Japanese Patent Application No. 2015-081109. One or two or more of these may be used.

Particularly preferred among the materials of the electron transport layer 10 are phosphine oxide derivatives such as POPy$_2$, metal complexes such as Alq$_3$, and pyridine derivatives such as TmPhPyB.

The average thickness of the electron transport layer 10 is not particularly limited, and is preferably 10 to 150 nm, more preferably 20 to 100 nm.

The average thickness of the electron transport layer 10 can be measured with a stylus profiler or a spectroscopic ellipsometer.

"Emitting Layer"

The material of the emitting layer 6 can be any material that can be commonly used as a material of the emitting layer 6. A mixture of these materials can also be used. Specifically, for example, the emitting layer 6 can contain bis[2-(2-benzothiazolyl)phenolato]zinc (II) (Zn(BTZ)$_2$) and tris[1-phenylisoquinoline]iridium (III) (Ir(piq)$_3$).

The material of the emitting layer 6 may be a low-molecular compound or a high-molecular compound. The term "low-molecular material" as used herein refers to a material that is not a high-molecular material (polymer), and does not necessarily refer to a low molecular weight organic compound.

Examples of the high-molecular material of the emitting layer 6 include polyacetylene-based compounds such as trans-polyacetylene, cis-polyacetylene, poly(di-phenylacetylene) (PDPA), and poly(alkylphenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly(para-phenylenevinylene) (CN-PPV), poly(2-dimethyloctylsilyl-para-phenylenevinylene) (DMOS-PPV), and poly(2-methoxy-5-(2'-ethylhexoxy)-para-phenylenevinylene) (MEH-PPV); polythiophene-based compounds such as poly(3-alkylthiophene) (PAT) and poly(oxypropylene) triol (POPT); polyfluorene-based compounds such as poly (9,9-dialkylfluorene) (PDAF), poly(dioctylfluorene-alt-benzothiadiazole) (F8BT), α,ω-bis[N,N'-di(methylphenyl) aminophenyl]-poly[9,9-bis(2-ethylhexyl)fluorene-2,7-diyl] (PF2/6am4), and poly(9,9-dioctyl-2,7-divinylenefluorenyl-ortho-co(anthracene-9,10-diyl); polyparaphenylene-based compounds such as poly(para-phenylene) (PPP) and poly(1,5-dialkoxy-para-phenylene) (RO-PPP); polycarbazole-based compounds such as poly(N-vinylcarbazole) (PVK); polysilane-based compounds such as poly(methylphenylsilane) (PMPS), poly(naphthylphenylsilane) (PNPS), and poly (biphenylylphenylsilane) (PEPS); and boron compound-based high-molecular materials disclosed in Japanese Patent Application No. 2010-230995 and Japanese Patent Application No. 2011-6457.

Examples of the low-molecular material of the emitting layer 6 include various metal complexes such as tridentate iridium complex having 2,2'-bipyridine-4,4'-dicarboxylic acid as a ligand, tris(2-phenylpyridine) iridium (Ir(ppy)$_3$), 8-hydroxyquinoline aluminum (Alq$_3$), tris(4-methyl-8-quinolinolato)aluminum (III) (Almq$_3$), 8-hydroxyquinoline zinc (Znq$_2$), (1,10-phenanthroline)-tris-(4,4,4-trifluoro-1-(2-thienyl)-butane-1,3-dionate)europium (III) (Eu(TTA)$_3$ (phen)), and 2,3,7,8,12,13,17,18-octaethyl-21H,23H-porphinplatinum (II); benzene-based compounds such as distyrylbenzene (DSB) and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-di-carboxyimide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzoxazolethiophene; benzoxazole-based compounds such as benzoxazole; benzimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine (H$_2$Pc) and copper phthalocyanine; and boron compound materials disclosed in JP 2009-155325 A, JP 2011-184430 A, and Japanese Patent Application No. 2011-6458.

The average thickness of the emitting layer 6 is not particularly limited, and is preferably 10 to 150 nm, more preferably 20 to 100 nm.

The average thickness of the emitting layer 6 may be measured with a stylus profiler, or may be measured during formation of the emitting layer 6 with a quartz crystal film thickness monitor.

"Hole Transport Layer"

As the hole transport organic material of the hole transport layer 7, each of p-type polymer materials (organic polymers) and p-type low-molecular materials may be used alone or these may be used in combination.

Specific examples of the material of the hole transport layer 7 include N,N'-di(1-naphthyl)-N,N'-diphenyl-1,1'-biphenyl-4,4'-diamine (α-NPD), N4,N4'-bis(dibenzo[b,d]thiophen-4-yl)-N4,N4'-diphenylbiphenyl-4,4'-diamine (DBTPB), polyarylamine, fluorene-arylamine copolymers, fluorene-bithiophene copolymers, poly(N-vinylcarbazole), polyvinylpyrene, polyvinylanthracene, polythiophene, polyalkylthiophene, polyhexylthiophene, poly(p-phenylenevinylene), polythienylenevinylene, pyreneformaldehyde resin, ethylcarbazole formaldehyde resin, and derivatives thereof. Each of these materials of the hole transport layer 7 may be used as a mixture with other compounds. Examples of the mixture include mixtures containing polythiophene which is used as a material of the hole transport layer 7, such as poly(3,4-ethylenedioxythiophene/styrenesulfonate) (PEDOT/PSS).

The average thickness of the hole transport layer 7 is not particularly limited, and is preferably 10 to 150 nm, more preferably 20 to 100 nm.

The average thickness of the hole transport layer 7, for example, can be measured with a stylus profiler or a spectroscopic ellipsometer.

"Hole Injection Layer"

The hole injection layer 8 may be formed from an inorganic material or an organic material. Since an inorganic material is more stable than an organic material, the use of an inorganic material imparts higher resistance to oxygen and water than the use of an organic material.

The inorganic material is not particularly limited, and one or two or more of metal oxides such as vanadium oxide ($V_2O_5$), molybdenum oxide ($MoO_3$), and ruthenium oxide ($RuO_2$) may be used, for example.

The organic material may be, for example, dipyrazino[2,3-f:2',3'-h]quinoxaline-2,3,6,7,10,11-hexacarbonitrile (HAT-CN) or 2,3,5,6-tetrafluoro-7,7,8,8-tetracyano-quinodimethane (F4-TCNQ).

The average thickness of the hole injection layer 8 is not particularly limited, and is preferably 1 to 1000 nm, more preferably 5 to 50 nm.

The average thickness of the hole injection layer 8 can be measured with a quartz crystal film thickness monitor during film formation.

"Anode"

Examples of the material of the anode 9 include ITO, IZO, Au, Pt, Ag, Cu, Al, and alloys containing these. Preferred among these materials of the anode 9 are ITO, IZO, Au, Ag, and Al.

The average thickness of the anode 9 is not particularly limited, and is preferably 10 to 1000 nm, more preferably 30 to 150 nm. Even if the anode 9 is made of a opaque material, it can be used as a transparent anode for the top emission organic EL device when the average thickness thereof is about 10 to 30 nm.

The average thickness of the anode 9 can be measured with a quartz crystal film thickness monitor during formation of the anode 9.

"Sealing"

The organic EL device 1 shown in FIG. 1 may be sealed, if needed.

For example, the organic EL device 1 shown in FIG. 1 may be sealed in a sealing container (not shown in the figure) having a concave space for containing the organic EL device 1 by bonding with an adhesive between the edge of the sealing container and the substrate 2. Alternatively, the organic EL device 1 may be sealed in a sealing container by filling the container containing the organic EL device 1 with a sealing material made from, for example, an ultraviolet (UV) curable resin. Also, for example, the organic EL device 1 shown in FIG. 1 may be sealed using a sealing member including a plate member (not shown in the figure) placed on the anode 9 and a frame member (not shown in the figure) placed along the anode 9-side edge of the plate member and an adhesive by bonding between the plate member and the frame member and between the frame member and the substrate 2.

When the organic EL device 1 is sealed using a sealing container or a sealing member, a desiccant to absorb moisture may be placed in the sealing container or the inner side of the sealing member. Also, the sealing container or the sealing member may be made of a moisture absorbing material. There may be a space in the sealing container or the inner side of the sealing member after sealing.

Examples of the material of the sealing container or the sealing member used to seal the organic EL device 1 shown in FIG. 1 include a resin material and a glass material. Examples of the resin material and glass material of the sealing container or sealing member include those mentioned as the materials of the substrate 2.

When the organic EL device 1 of the present embodiment includes, as an organic thin film, an electron injection layer formed from the first material including one or two or more selected from the group consisting of tertiary amines, phosphazene compounds, guanidine compounds, heterocyclic compounds containing an amidine structure, and ketone compounds and the second material including a boron-containing compound represented by formula (1) or a phosphine oxide derivative represented by formula (2), the organic EL device 1 has better durability than an organic EL device including an electron injection layer formed from an alkali metal, which is unstable in the air. Accordingly, a sealing container or sealing member having a water vapor transmission rate of about $10^{-3}$ to $10^{-4}$ $g/m^2/day$ can sufficiently suppress degradation of the organic EL device 1. Therefore, a resin material having a water vapor transmission rate of about $10^{-4}$ $g/m^2/day$ or less can be used as the material of the sealing container or sealing member. Thus, the organic EL device 1 with excellent flexibility can be obtained.

"Method for Producing Organic EL Device"

Next, a method for producing the organic EL device 1 shown in FIG. 1 will be described as an example of the method for producing an organic EL device of the present invention.

In order to produce the organic EL device 1 shown in FIG. 1, first, the cathode 3 is formed on the substrate 2.

The cathode 3 may be formed by, for example, a sputtering method, a vacuum deposition method, a sol-gel method, a spray pyrolysis deposition (SPD) method, an atomic layer deposition (ALD) method, a vapor deposition method, or a liquid phase deposition method. The cathode 3 may be formed by bonding metal foil.

Next, the inorganic oxide layer 4 is formed on the cathode 3.

The oxide layer 4 is formed by, for example, a spray pyrolysis deposition method, a sol-gel method, a sputtering method, or a vacuum deposition method. The resulting oxide layer 4 sometimes has an irregular surface, not a smooth surface.

Next, the electron injection layer 5 is formed on the oxide layer 4.

The electron injection layer 5 can be formed by the above described method for producing an organic thin film.

Next, the following layers, the electron transport layer 10, the emitting layer 6, and the hole transport layer 7, are formed on the electron injection layer 5 in the stated order.

The electron transport layer 10, the emitting layer 6, and the hole transport layer 7 may be formed by any method, and any of known various forming methods can be appropriately used depending on the properties of the materials of the electron transport layer 10, the emitting layer 6, and the hole transport layer 7.

Specific examples of the method for forming the electron transport layer 10, the emitting layer 6, and the hole transport layer 7 include application of a solution of an organic compound that forms the electron transport layer 10, a solution of an organic compound that forms the emitting layer 6, and a solution of an organic compound that forms the hole transport layer 7; vacuum deposition; and evaporative spray deposition from ultra-dilute solution (ESDUS). In particular, the electron transport layer 10, the emitting layer 6, and the hole transport layer 7 are preferably formed by application. When the organic compound that forms the electron transport layer 10, the emitting layer 6, or the hole transport layer 7 is less soluble in a solvent, vacuum deposition or ESDUS is preferably used.

When the electron transport layer 10, the emitting layer 6, and the hole transport layer 7 are formed by application, the organic compound that forms the electron transport layer 10, the organic compound that forms the emitting layer 6, and the organic compound that forms the hole transport layer 7 are each dissolved in a solvent to prepare a solution of the organic compound that forms the electron transport layer 10, a solution of the organic compound that forms the emitting layer 6, and a solution of the organic compound that forms the hole transport layer 7.

Preferred examples of the solvent used to dissolve the organic compound that forms the electron transport layer 10, the solvent used to dissolve the organic compound that forms the emitting layer 6, and the solvent used to dissolve the organic compound that forms the hole transport layer 7 include aromatic hydrocarbon solvents such as xylene, toluene, cyclohexylbenzene, dihydrobenzofuran, trimethylbenzene, and tetramethylbenzene; aromatic heterocyclic compound solvents such as pyridine, pyrazine, furan, pyrrole, thiophene, and methylpyrrolidone; and aliphatic hydrocarbon solvents such as hexane, pentane, heptane, and cyclohexane. Each of these may be used alone or these may be used as a mixture.

Examples of the method for applying the solution containing the organic compound that forms the electron transport layer 10, the emitting layer 6, or the hole transport layer 7 include various application methods such as a spin coating method, a casting method, a micro gravure coating method, a gravure coating method, a bar coating method, a roll coating method, a wire bar coating method, a dip coating method, a spray coating method, a screen printing method, a flexographic printing method, an offset printing method, and an inkjet printing method. Preferred among these methods are a spin coating method and a slit coating method because the film thickness can be easily controlled by these methods.

Next, the hole injection layer 8 is formed on the hole transport layer 7, and the anode 9 is formed on the layer 8.

When the hole injection layer 8 is formed from an inorganic material, it can be formed, for example, in the same manner as for the oxide layer 4.

When the hole transport layer 9 is formed from an organic material, the hole injection layer 8 can be formed, for example, in the same manner as for the electron transport layer 10, the emitting layer 6, and the hole transport layer 7.

The anode 9 can be formed, for example, in the same manner as for the cathode 3.

The organic EL device 1 shown in FIG. 1 is obtained through the above steps.

"Sealing Method"

The organic EL device 1 shown in FIG. 1 can be sealed by the method commonly used to seal organic EL devices.

Since the organic EL device 1 of the present embodiment has the electron injection layer 5 including an organic thin film that contains the first material which is an organic material having a pKa of 1 or greater and the second material which transports an electron, the first material extracts a proton ($H^+$) from the second material, so that a negative charge is generated and an excellent electron injection property is obtained. Therefore, in the organic EL device 1, an electron is injected and transported from the cathode 3 to the emitting layer 6 at high speed, and Devices 1 is driven at a low voltage.

As described above, the organic EL device 1 in which the organic thin film containing the first material which is an organic material having a pKa of 1 or greater and the second material which transports an electron is a laminate film and a layer formed from the second material is different from an electron injection layer formed from the first material is also another embodiment of the organic EL device of the present invention. Also in such an organic EL device 1 of the present embodiment, an electron is injected and transported from the cathode 3 to the emitting layer 6 at high speed, and Devices 1 is driven at a low voltage.

Other Examples

The organic EL device of the present invention is not particularly limited to the organic EL devices described in the above embodiments.

Specifically, in the above embodiments, the case in which an organic thin film serves as an electron injection layer is described as an example. However, the organic EL device of the present invention has only to include an organic thin film between a cathode and an emitting layer. Therefore, the organic thin film may not be an electron injection layer, and may be formed as a layer serving as both an electron injection layer and an electron transport layer or may be formed as an electron transport layer.

In the organic EL device 1 shown in FIG. 1, the inorganic oxide layer 4, the electron transport layer 10, the hole transport layer 7, and the hole injection layer 8 have only to be formed if necessary, and may not be formed.

The cathode 3, the oxide layer 4, the electron injection layer 5, the electron transport layer 10, the emitting layer 6, the hole transport layer 7, the hole injection layer 8, and the anode 9 may be each a single layer or a laminate of two or more layers.

The organic EL device 1 shown in FIG. 1 may include other layer(s) between any two of the layers shown in FIG. 1. Specifically, for example, in order to enhance the performance of the organic EL device, the device may include other layer(s) such as an electron blocking layer, if needed.

In the above embodiments, the inverted organic EL device (iOLED device) including the cathode 3 between the substrate 2 and the emitting layer 6 is described as an example. However, the organic EL device may be a conventional organic EL device including an anode between a substrate and an emitting layer.

The organic EL device of the present invention is capable of changing the color of the light by suitably selecting a material of the emitting layer, and is also capable of providing a desired color of the light by using, for example, a color filter together therewith. Thus, the organic EL device of the present invention can be suitably used as an emitting portion of a display device or a lighting system.

The display device of the present invention includes the organic EL device of the present invention that has an organic thin film between a cathode and an emitting layer, is produced with excellent efficiency, and is driven at a low voltage. Accordingly, the display device of the present invention is a preferred display device.

The lighting system of the present invention includes the organic EL device of the present invention that is produced with excellent efficiency and is driven at a low voltage. Accordingly, the lighting system of the present invention is a preferred lighting system.

The present invention is not limited to the above described embodiments, and the organic thin film of the present invention can be used, for example, for devices such as organic thin-film solar cells and thin-film transistors.

The organic thin-film solar cell of the present invention includes an organic thin film. For example, when the organic thin film is used as an electron injection layer in the organic thin-film solar cell, the first material extracts a proton ($H^+$) from the second material in the organic thin film, so that a negative charge is generated. Thus, an electron is transported at high speed, and the power generation efficiency is increased. Accordingly, the organic thin-film solar cell of the present invention is a preferred organic thin-film solar cell.

The thin-film transistor of the present invention includes an organic thin film. For example, when a channel layer of a thin-film transistor is formed from the organic thin film, the channel layer has high electron mobility.

When the organic thin film is formed on an electrode, a reduction in contact resistance can be expected.

EXAMPLES

Example 1

(Preparation of Organic EL Device)

Organic EL devices 1 shown in FIG. 1 were each produced by the following method and evaluated.

[Step 1]

A 3 mm-wide patterned electrode made of ITO (cathode 3) was formed on a commercially available transparent glass substrate with an average thickness of 0.7 mm to prepare a substrate 2.

The substrate 2 having the cathode 3 was ultrasonically washed in acetone and isopropanol each for 10 minutes and then boiled in isopropanol for 5 minutes. Thereafter, the substrate 2 having the cathode 3 was taken out from isopropanol, dried by blowing nitrogen, and washed with UV ozone for 20 minutes.

[Step 2]

The substrate 2 having the cathode 3 washed in [Step 1] was fixed to a substrate holder of a mirrortron sputtering apparatus having a zinc metal target. The pressure in the chamber of the sputtering apparatus was reduced to about $1\times10^{-4}$ Pa, and then the substrate 2 was subjected to sputtering with argon and oxygen introduced therein to form a zinc oxide layer (oxide layer 4) having a thickness of about 7 nm on the cathode 3 of the substrate 2. Upon the preparation of the zinc oxide layer, the zinc oxide film was not formed on part of the ITO electrode (cathode 3) in order to maintain the contact with the electrode. The oxide layer 4 on the substrate 2 was annealed in the air atmosphere at 400° C. for one hour.

[Step 3]

Next, an organic thin film containing the first material and the second material according to the proportions shown in Table 1 was formed on the oxide layer 4 as an electron injection layer 5 by the following method.

The boron compound in Table 1 was the boron compound A represented by formula (1), which was produced according to the following (Synthesis Example 1) to (Synthesis Example 3).

Synthesis Example 1

The boron-containing compound represented by formula (31) was synthesized by the following method.

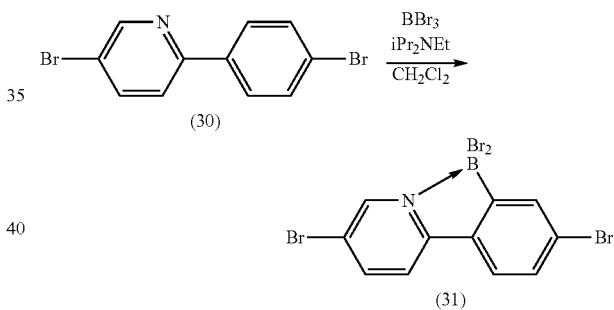

Under an argon atmosphere, ethyldiisopropylamine (39 mg, 0.30 mmol) was added to a dichloromethane solution (0.3 mL) containing 5-bromo-2-(4-bromophenyl)pyridine (94 mg, 0.30 mmol) represented by formula (30). Thereafter, boron tribromide (1.0 M dichloromethane solution, 0.9 mL, 0.9 mmol) was added thereto at 0° C., and the solution was allowed to react with stirring for nine hours at room temperature. The reaction solution was cooled down to 0° C., and an aqueous solution of saturated potassium carbonate was added to the reaction solution, followed by extraction with chloroform. The organic layer was washed with saturated saline solution, dried over magnesium sulfate, and filtered. The filtrate was concentrated with a rotary evaporator, and the resulting white solid was filtered off and then washed with hexane. Thus, a boron-containing compound (40 mg, 0.082 mmol) represented by formula (31) was obtained in a yield of 28%.

The resulting boron-containing compound was identified by $^1$H-NMR.

$^1$H-NMR (CDCl$_3$): 7.57-7.59 (m, 2H), 7.80 (dd, J=8.4, 0.6 Hz, 1H), 7.99 (s, 1H), 8.27 (dd, J=8.4, 2.1 Hz, 1H), 9.01 (d, J=1.5 Hz, 1H).

Synthesis Example 2

The boron-containing compound represented by formula (16-40) was synthesized by the following method using the boron-containing compound represented by formula (31).

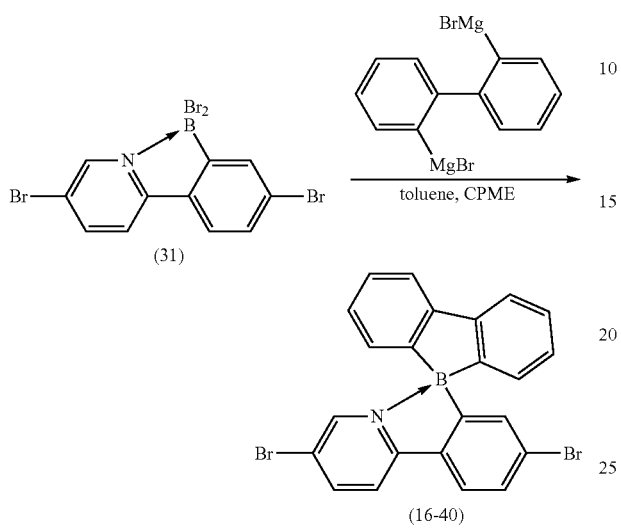

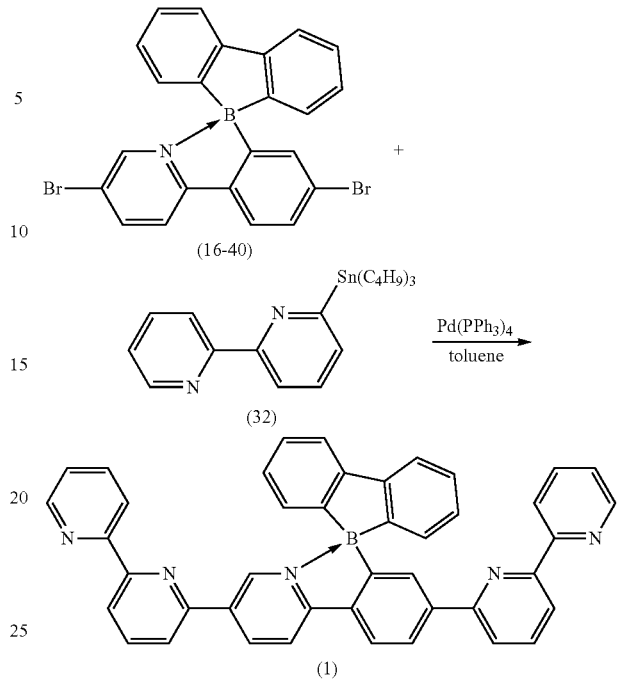

Magnesium (561 mg, 23.1 mmol) was placed in a 50-mL two-necked flask, which was then purged with nitrogen. Subsequently, cyclopentyl methyl ether (CPME) (10 mL) was placed in the reaction vessel and a small portion of iodine was placed therein, followed by stirring until the color disappeared. A solution (9 mL) of 2,2'-dibromobiphenyl (3.0 g, 9.6 mmol) in cyclopentyl methyl ether was added dropwise to the reaction vessel, followed by stirring at room temperature for 12 hours and at 50° C. for one hour. Thus, a Grignard reagent was prepared.

The boron-containing compound (3.71 g, 7.7 mmol) represented by formula (31) was placed in a different 200-mL three-necked flask, which was then purged with nitrogen. Subsequently, toluene (77 mL) was added. While the contents were stirred at −78° C., the Grignard reagent was added collectively through a cannula. The contents were stirred for 10 minutes, heated to room temperature, and stirred for another 12 hours. Water was added to the resulting reaction solution, followed by extraction with chloroform. The organic layer was washed with saturated saline solution, dried over magnesium sulfate, and filtered. The filtrate was concentrated, and the residue was purified by column chromatography. Thus, the boron-containing compound (3.0 g) represented by formula (16-40) was obtained (yield 82%).

The resulting boron-containing compound was identified by $^1$H-NMR.

$^1$H-NMR (CDCl$_3$): 6.85 (d, J=7.04 Hz, 2H), 7.05 (t, J=7.19 Hz, 2H), 7.32 (t, J=7.48 Hz, 2H), 7.47 (s, 1H) 7.49-7.57 (m, 1H), 7.74-7.84 (m, 3H), 7.90-8.00 (m, 2H), 8.07-8.20 (m, 1H).

Synthesis Example 3

The boron compound A represented by formula (1) was synthesized by the following method using the boron-containing compound represented by formula (16-40).

The boron-containing compound (2.50 g, 5.26 mmol) represented by formula (16-40), 6-tri(n-butylstannyl)-2,2'-bipyridine (5.62 g, 12.6 mmol) represented by formula (32), Pd(PPh$_3$)$_4$ (610 mg, 0.53 mmol), and toluene (26 mL) were placed in a 50-mL two-necked flask, which was then purged with nitrogen. Subsequently, the contents were allowed to react with stirring at 120° C. for 24 hours. Thereafter, the resulting reaction solution was cooled to room temperature and concentrated, and the residue was purified by column chromatography. Thus, the boron compound A (2.0 g) represented by formula (1) was obtained (yield 60%).

The resulting boron compound A was identified by $^1$H-NMR.

$^1$H-NMR (CDCl$_3$): 6.6.96 (d, J=6.8 Hz, 2H), 7.04 (t, J=7.2 Hz, 2H), 7.29-7.35 (m, 4H), 7.49 (d, J=7.8 Hz, 1H), 7.73-7.85 (m, 7H), 8.01 (d, J=0.8 Hz, 1H), 8.16 (d, J=8.4 Hz, 1H), 8.23 (d, J=8.6 Hz, 1H), 8.30-8.42 (m, 5H), 8.60 (d, J=8.0 Hz, 1H), 8.66-8.67 (m, 2H), 8.89 (d, J=8.0 Hz, 1H).

Next, an organic thin film containing the first material and the second material according to the proportions shown in Table 1 was formed on the oxide layer 4 as an electron injection layer 5 by the following method. The phosphine oxide derivative in Table 1 was the phosphine oxide derivative represented by formula (2).

First, the first material and the second material were dissolved in cyclopentanone according to the proportions shown in Table 1 to prepare a coating composition. Next, the substrate 2 having the cathode 3 and the oxide layer 4 prepared in [Step 2] was placed on a spin coater. Then, the substrate 2 was rotated at 3000 rpm for 30 seconds while the coating composition was dropped on the oxide layer 4. Thus, a coat was formed. Subsequently, the substrate 2 was annealed in a nitrogen atmosphere at 120° C. for two hours using a hot plate to prepare an electron injection layer 5. The electron injection layer 5 had an average thickness of 30 nm.

[Step 4]

Next, the substrate 2 with the electron injection layer 5 and previous layers formed thereon was fixed to a substrate holder of a vacuum deposition apparatus. Further, bis[2-(2- benzothiazolyl)phenolato]zinc (II) (Zn(BTZ)$_2$) represented by formula (24), tris[1-phenylisoquinoline]iridium (III) (Ir(piq)$_3$) represented by formula (25), N,N'-di(1-naphthyl)-N,N'-diphenyl-1,1'-biphenyl-4,4'-diamine (α-NPD) represented by formula (26), N4,N4'-bis(dibenzo[b,d]thiophen-4-yl)-N4,N4'-diphenylbiphenyl-4,4'-diamine (DBTPB) represented by formula (27), 1,4,5,8,9,12-hexaazatriphenylene-2,3,6,7,10,11-hexacarbonitrile (HAT-CN) represented by formula (28), and Al were separately put into alumina crucibles, which were set as deposition sources.

(27)

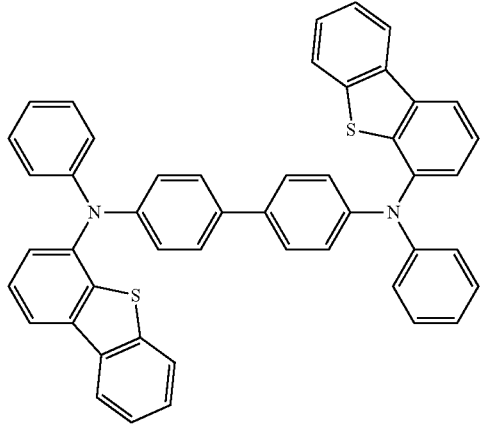

DBTPB (26)

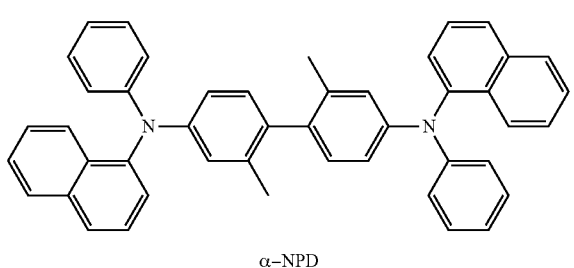

α-NPD (25)

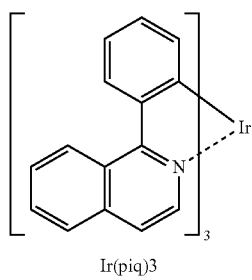

Ir(piq)3

(24)

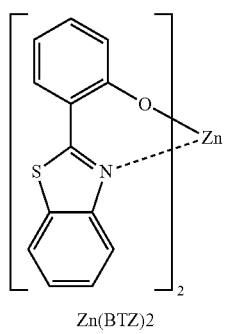

Zn(BTZ)2

(28)

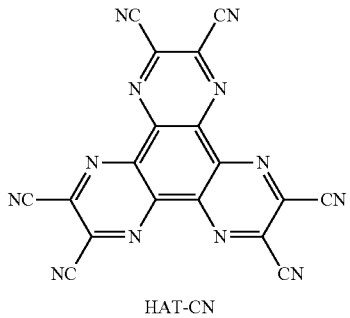

HAT-CN

The pressure in the chamber of the vacuum deposition apparatus was reduced to $1 \times 10^{-5}$ Pa, and an electron transport layer 10, an emitting layer 6, a hole transport layer 7, a hole injection layer 8, and an anode 9 were successively formed by a vacuum deposition method by resistance heating.

First, the electron transport layer 10 with a thickness of 10 nm made of Zn(BTZ)$_2$ was formed. Subsequently, the emitting layer 6 was formed by co-depositing Zn(BTZ)$_2$ as a host and Ir(piq)$_3$ as a dopant to a thickness of 25 nm. At this point, the doping concentration was controlled such that Ir(piq)$_3$ would be 6% by mass relative to the entire emitting layer 6. Next, the hole transport layer 7 was formed on the substrate 2 with the emitting layer 6 and previous layers formed thereon by forming a 10-nm-thick DBTPB film and a 30-nm-thick α-NPD film. In addition, the hole injection layer 8 was formed by forming a 10-nm-thick HAT-CN film. Next, the anode 9 with a thickness of 100 nm made of aluminum was formed by a vacuum deposition method on the substrate 2 with the hole injection layer 8 and previous layers formed thereon.

The anode 9 was formed using a stainless steel deposition mask to obtain a band-like deposition surface having a width of 3 mm. The produced organic EL device had an emitting area of 9 mm$^2$.

[Step 5]

Next, the substrate 2 with the anode 9 and previous layers formed thereon was contained in a glass cap (sealing container) with a concave space, and the glass cap was filled with a sealing material made of an ultraviolet (UV) curable resin to seal the substrate. Thus, Devices 1 to 18 shown in Table 1 were obtained as organic EL devices.

TABLE 1

| Device No. | First material | Second material |
|---|---|---|
| 1 | — | Boron compound (1 mass %) |
| 2 | 2-DMAP (1 mass %) | |
| 3 | 2-DMAP (2 mass %) | Boron compound (1 mass %) |
| 4 | 4-DMAP (1 mass %) | Boron compound (1 mass %) |
| 5 | 2-DMAP (20 mass %) | Boron compound (1 mass %) |
| 6 | 4-DMAP (0.5 mass %) | Boron compound (1 mass %) |
| 7 | TBD (2 mass %) | Boron compound (1 mass %) |
| 8 | N-DMBI (0.01 mass %) | Boron compound (1 mass %) |
| 9 | — | Phosphine derivative (1 mass %) |
| 10 | 2-DMAP (2 mass %) | Phosphine derivative (1 mass %) |
| 11 | 3-MeOP (2 mass %) | Boron compound (1 mass %) |
| 12 | Triethylamine (2 mass %) | Boron compound (1 mass %) |
| 13 | 4-MeOP (2 mass %) | Boron compound (1 mass %) |
| 14 | DBU (2 mass %) | Boron compound (1 mass %) |
| 15 | MTBD (2 mass %) | Boron compound (1 mass %) |
| 16 | DBN (2 mass %) | Boron compound (1 mass %) |

TABLE 1-continued

| Device No. | First material | Second material |
|---|---|---|
| 17 | Phosphazene base P2-t-Bu solution (1 mass %) (THF) | Boron compound (0.5 mass %) |
| 18 | Pyrrole (2 mass %) | Boron compound (1 mass %) |

To Devices 1 to 18 was applied a voltage using "2400 series SourceMeter" produced by Keithley Instruments, and the luminance was measured using "LS-100" produced by Konica Minolta, Inc. Thus, the relationship between the applied voltage and the luminance was determined.

Also, to Devices 1, 3, 4, 8, 15, and 16 was applied a voltage using "2400 series SourceMeter" produced by Keithley Instruments, and the luminance was measured using "LS-100" produced by Konica Minolta, Inc. in continuous driving with an initial luminance of 1000 cd/m$^2$. Thus, the changes in the luminance relative to the elapsed time were determined.

Also, to Devices 1, 3, 4, 7, and 11 to 18 was applied a voltage of 4.8 V using "2400 series SourceMeter" produced by Keithley Instruments. Thus, the current density and the luminance were determined. Also, Devices 1 and 16 without sealing (without [Step 5]) were prepared and allowed to stand in the air atmosphere. The changes of the light emitting surface relative to the elapsed time were observed.

FIGS. 1 to 10 and Table 2 show the results.

Figure 2:
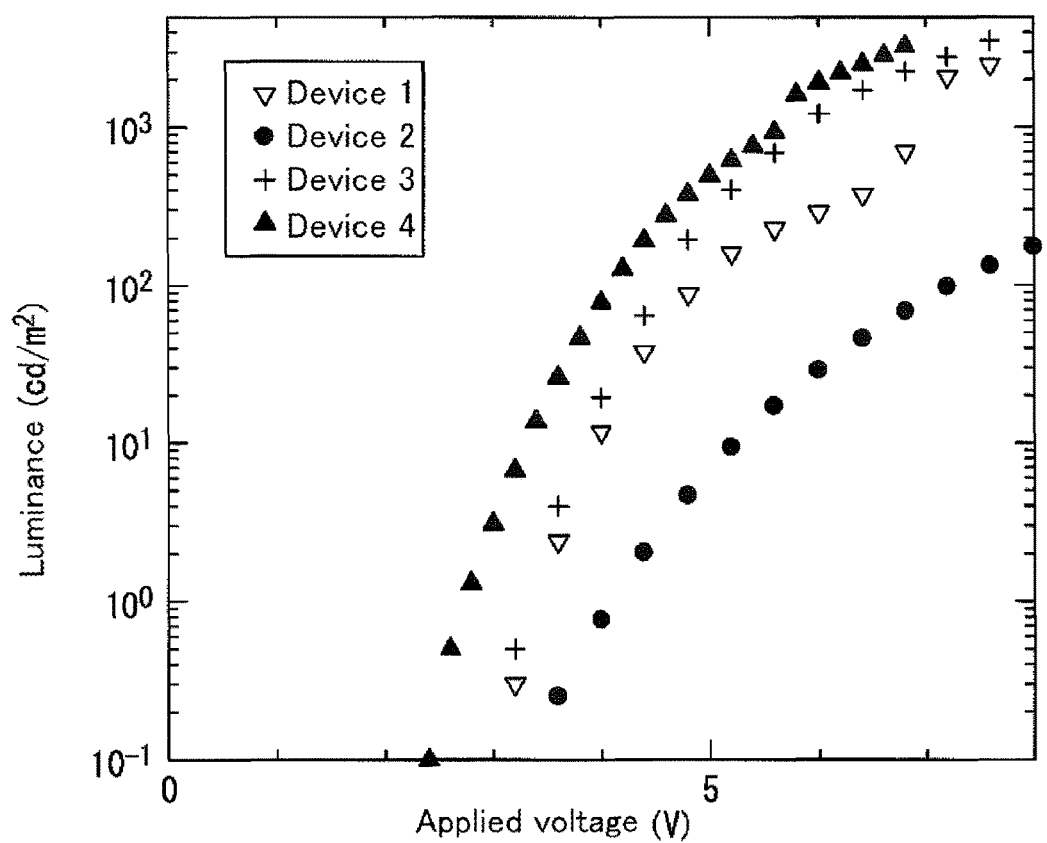
FIG. 2 is a graph showing the relationship between the applied voltage and the luminance of Devices 1 to 4.

FIG. 2 is a graph showing the relationship between the applied voltage and the luminance of Devices 1 to 4.

As shown in Table 1 and FIG. 2, Devices 3 and 4 having an electron injection layer containing the first material and the second material had a higher luminance and were driven at a lower voltage than Device 1 having an electron injection layer consisting only of the second material and Device 2 having an electron injection layer consisting only of the first material under the same applied voltage. This is presumably because the electron injection property is enhanced by 2-DMAP (Device 3) or 4-DMAP (Device 4), which is an organic material having a pKa of 1 or greater, shown in Table 2 and the boron-containing compound represented by formula (1).

Figure 3:
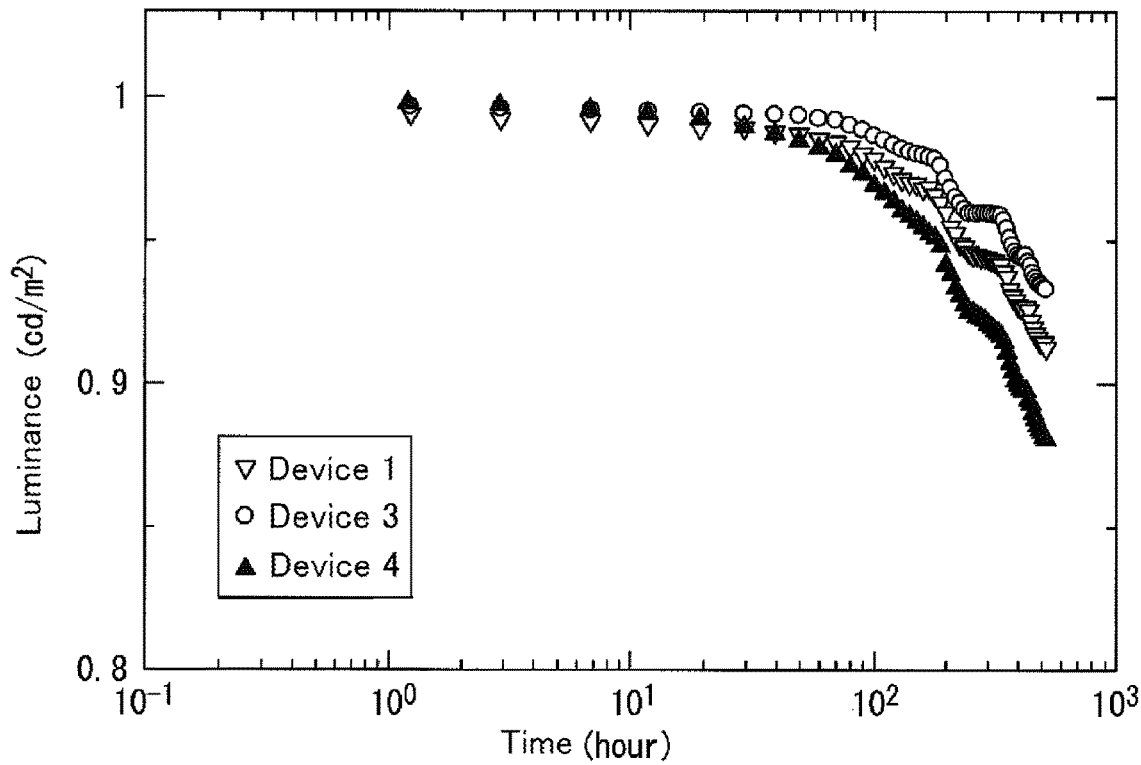
FIG. 3 is a graph showing changes in the luminance relative to the elapsed time of Devices 1, 3, and 4 in continuous driving with an initial luminance of 1000 cd/m$^2$.

FIG. 3 is a graph showing changes in the luminance relative to the elapsed time of Devices 1, 3, and 4 in continuous driving with an initial luminance of 1000 cd/m$^2$.

As shown in Table 1 and FIG. 3, Device 3 containing 2-DMAP as the first material had durability better than Device 1 having an electron injection layer consisting only of the second material.

Device 4 containing 4-DMAP as the second material had durability equal to Device 1.

FIGS. 2 and 3 demonstrate that Devices 3 and 4 were driven even at a low voltage, and the organic thin film used in Devices 3 and 4 less affected on the life of the organic EL devices, and was suitable as the material of an electron injection layer.

Figure 4:
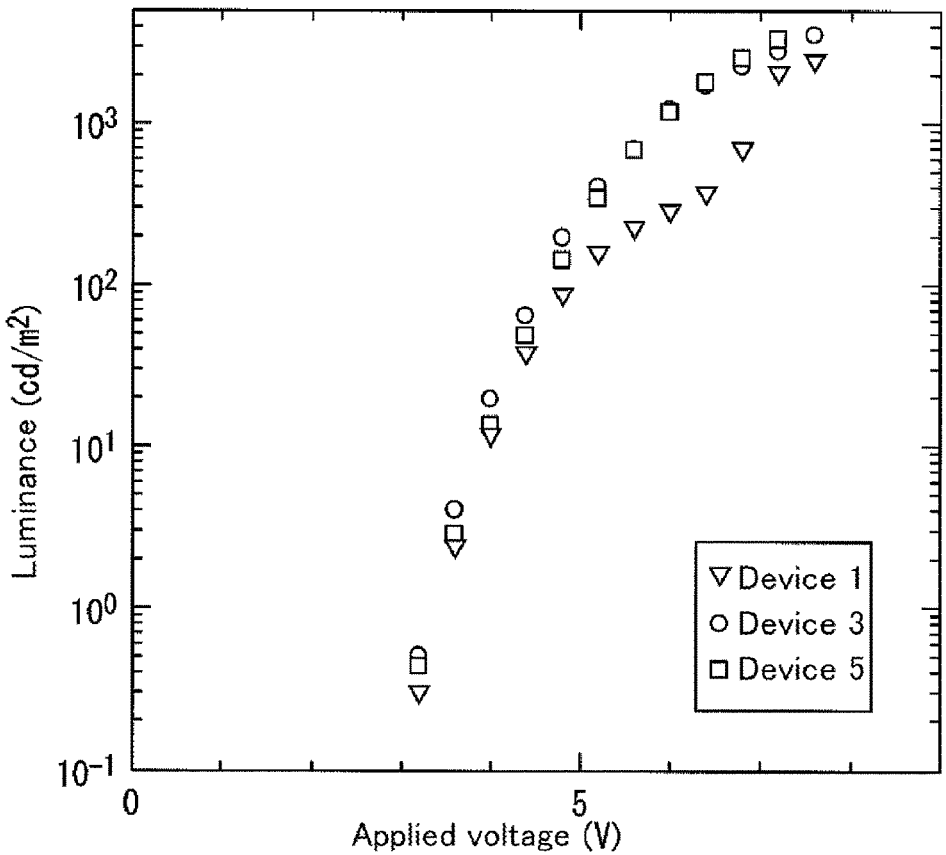
FIG. 4 is a graph showing the relationship between the applied voltage and the luminance of Devices 1, 3, and 5.

FIG. 4 is a graph showing the relationship between the applied voltage and the luminance of Devices 1, 3, and 5.

The results of Devices 1, 3, and 5 shown in Table 1 and FIG. 4 demonstrate that when 2-DMAP is contained as the first material, the mass ratio of 2-DMAP to the second material (first material:second material) is preferably 2:1 to 20:1.

Figure 5:
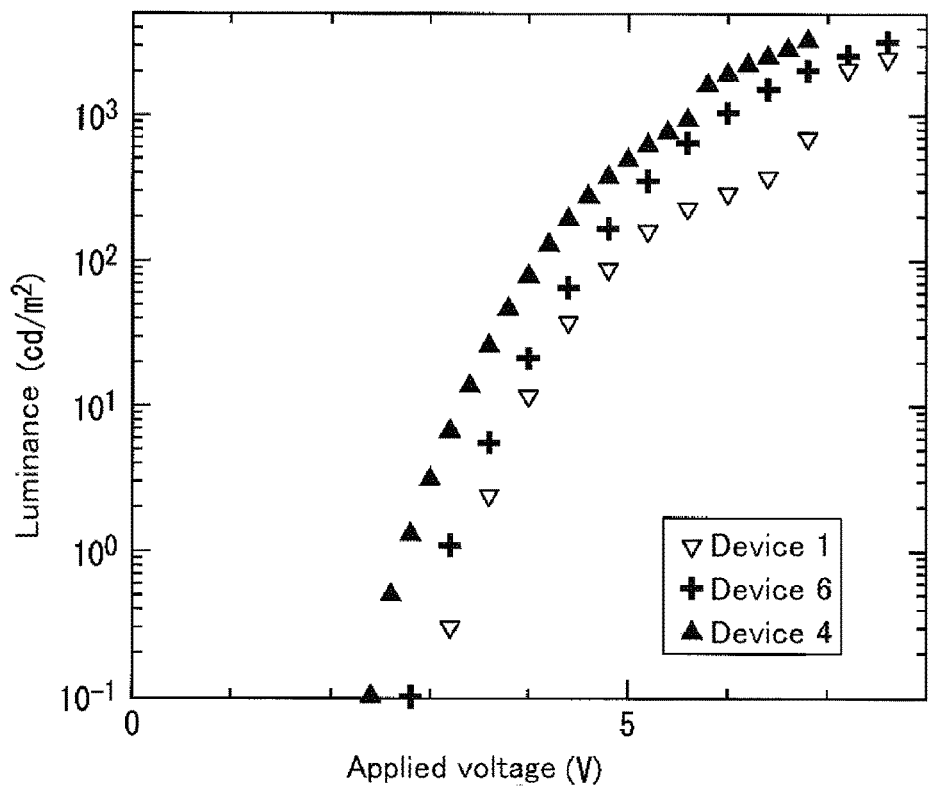
FIG. 5 is a graph showing the relationship between the applied voltage and the luminance of Devices 1, 4, and 6.

FIG. 5 is a graph showing the relationship between the applied voltage and the luminance of Devices 1, 4, and 6.

The results of Devices 1, 4, and 6 shown in Table 1 and FIG. 5 demonstrate that when 4-DMAP is contained as the first material, the mass ratio of 4-DMAP to the second material (first material:second material) is preferably 0.5:1 to 1:1.

Figure 6:
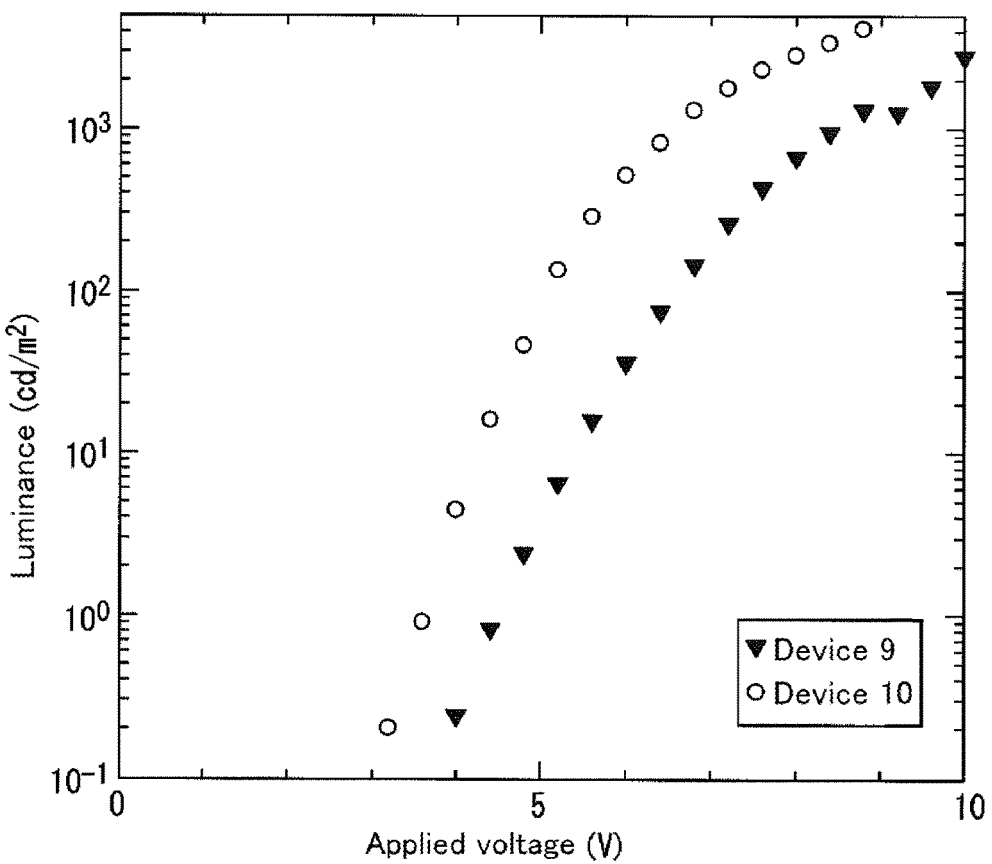
FIG. 6 is a graph showing the relationship between the applied voltage and the luminance of Devices 9 and 10.

FIG. 6 is a graph showing the relationship between the applied voltage and the luminance of Devices 9 and 10.

As shown in Table 1 and FIG. 6, Device 10 containing the phosphine oxide derivative represented by formula (2) as the second material and 2-DMAP as the first material had a higher luminance and was driven at a lower voltage than Device 9 having an electron injection layer formed from the phosphine oxide derivative represented by formula (2) under the same applied voltage.

Figure 7:
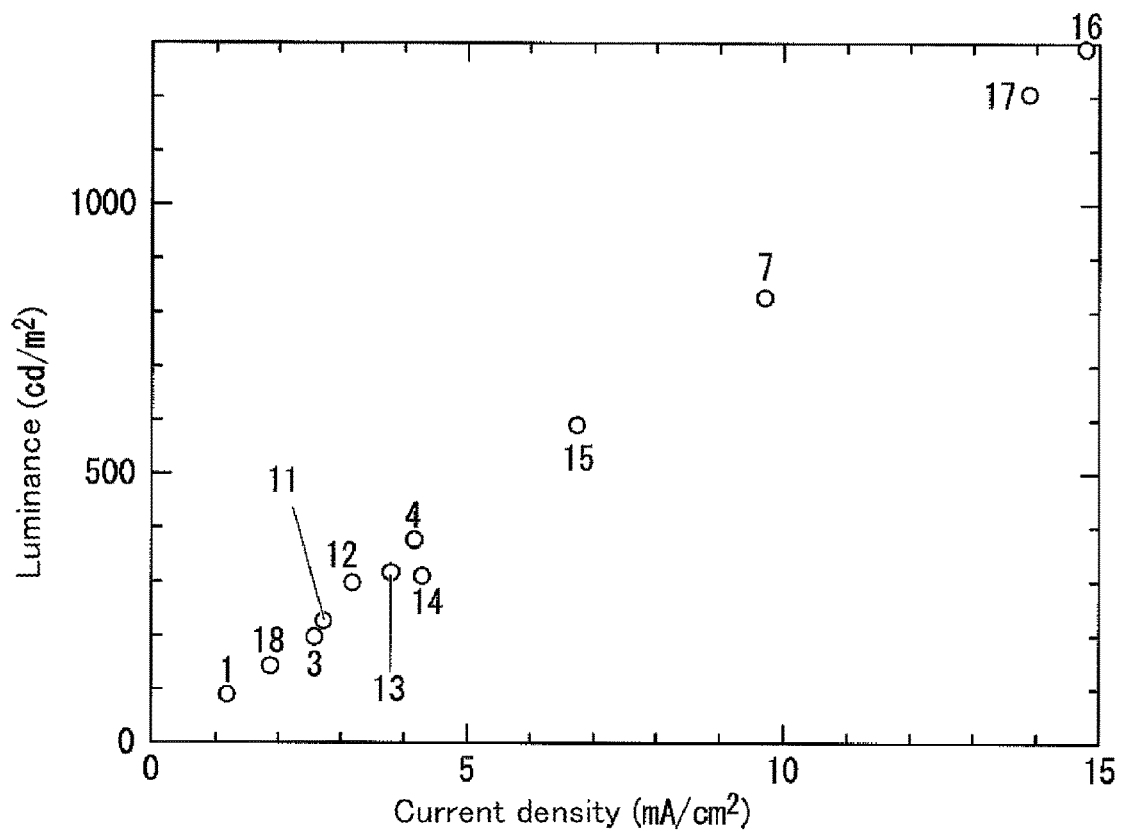
FIG. 7 is a graph showing the relationship between the current density and the emission luminance of Devices 1, 3, 4, 7, and 11 to 18 with an applied voltage of 4.8 V.

FIG. 7 is a graph showing the relationship between the current density (horizontal axis) and the emission luminance (vertical axis) of Devices 1, 3, 4, 7, and 11 to 18 with an applied voltage of 4.8 V.

As shown in Table 2 and FIG. 7, the higher the current density, the higher the luminance.

Figure 8:
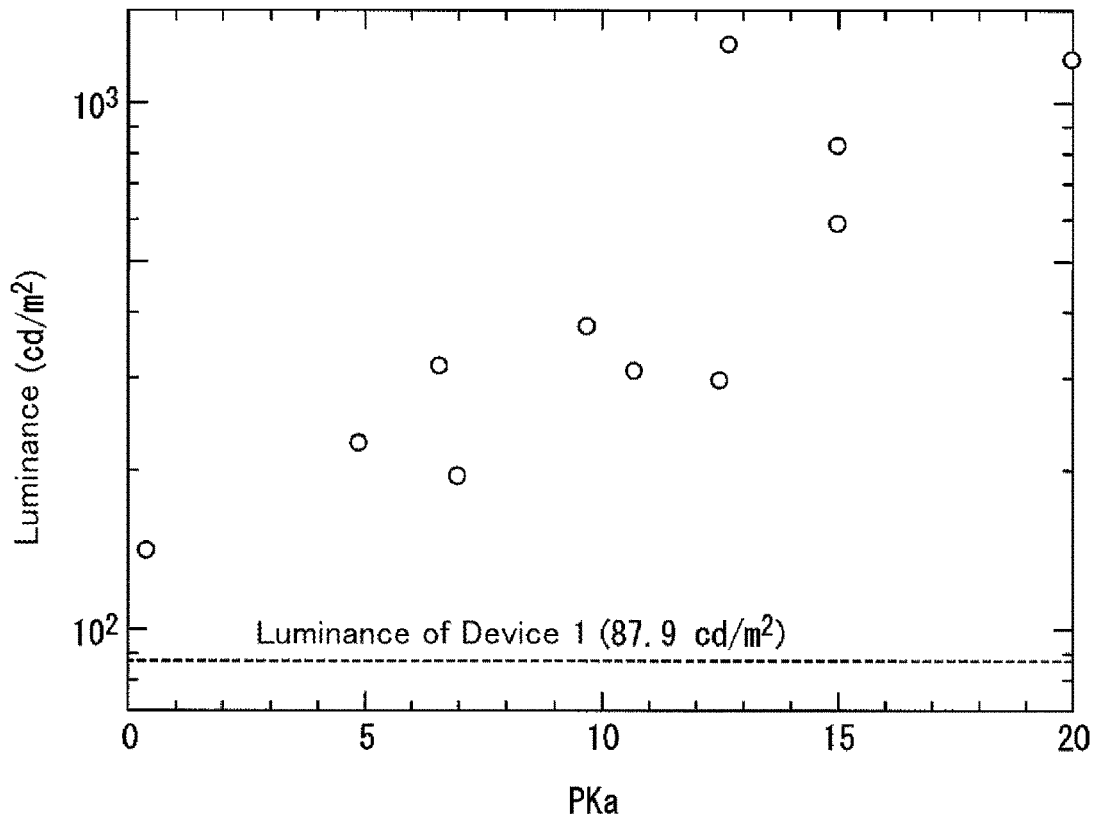
FIG. 8 is a graph showing the relationship between the pKa of the first material used in Devices 1, 3, 4, and 11 to 18 and the luminance with an applied voltage of 4.8 V.

FIG. 8 is a graph showing the relationship between the pKa (acid dissociation constant in water) (horizontal axis) of the first materials used in Devices 1, 3, 4, 7, 8, and 11 to 18 and the luminance (vertical axis) with an applied voltage of 4.8 V. Table 2 shows the pKa (acid dissociation constant in water) of the first materials used in Devices 1, 3, 4, 7, 8, and 11 to 18 and the current density and the luminance with an applied voltage of 4.8 V. In Table 2, an unmeasurable pKa is represented by "–".

TABLE 2

| Device No. | First material | pKa (H$_2$O) | Current density (V = 4.8) | Emission luminance (V = 4.8) |
|---|---|---|---|---|
| 1 | — | — | 1.2 | 87.9 |
| 3 | 2-DMAP | 6.99 | 2.59 | 195 |
| 11 | 3-MeOP | 4.88 | 2.74 | 225 |
| 12 | Triethylamine | 10.7 | 3.2 | 308.6 |
| 13 | 4-MeOP | 6.6 | 3.81 | 315.5 |
| 4 | 4-DMAP | 9.7 | 3.81 | 375 |
| 14 | DBU | 12.5 | 4.17 | 296 |
| 15 | MTBD | 15 | 6.74 | 589 |
| 17 | Phosphazene base P2-t-Bu | 20 | 13.9 | 1204 |
| 16 | DBN | 12.7 | 14.8 | 1288 |
| 18 | Pyrrole | 0.4 | 1.89 | 141 |
| 7 | TBD | 15 | 9.72 | 826 |
| 8 | N-DMBI | — | 12.8 | 1110 |

As shown in Table 2 and FIG. 8, the emission luminance tends to be high as the pKa increases. Further, the use of a material having a pKa of 1 or greater as the first material enhances the luminance of the organic EL device. Preferably, the use of a material having a pKa of 5 or greater further more enhances the luminance of the organic EL device.

Figure 9:
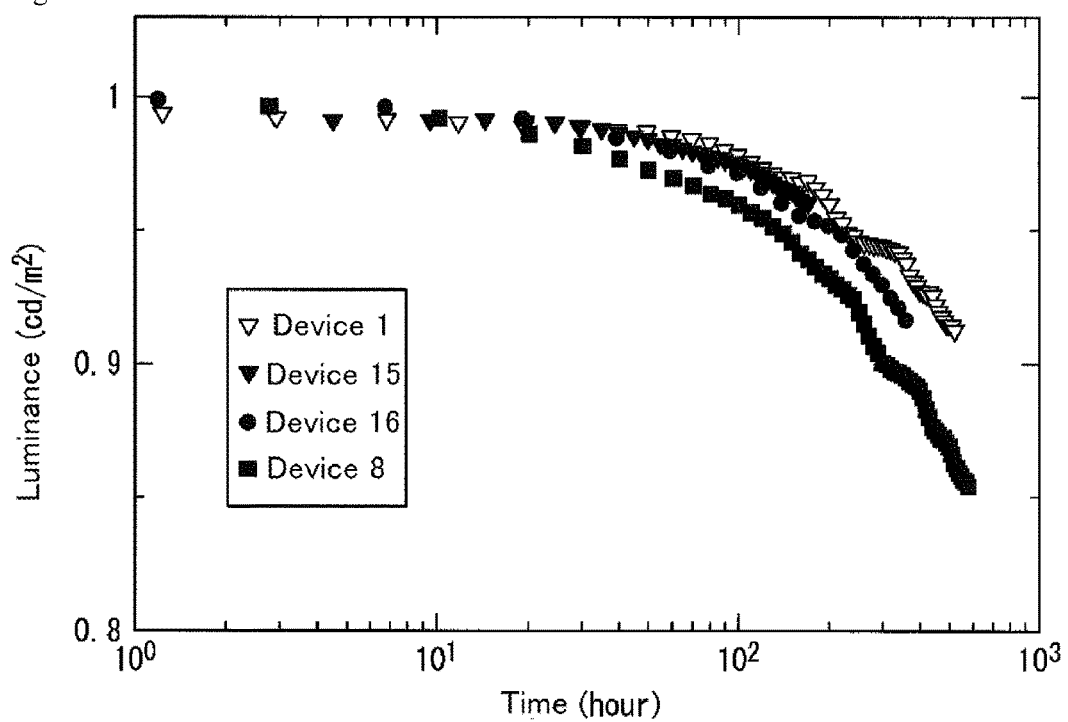
FIG. 9 is a graph showing changes in the luminance relative to the elapsed time of Devices 1, 8, 15, and 16 in continuous driving with an initial luminance of 1000 cd/m$^2$.

FIG. 9 is a graph showing changes in the luminance relative to the elapsed time of Devices 1, 8, 15, and 16 in continuous driving with an initial luminance of 1000 cd/m$^2$.

As shown in Table 1 and FIG. 9, Device 15 containing MTBD as the first material and Device 16 containing DBN as the first material each had durability equal to Device 1 having an electron injection layer consisting only of the second material and had durability better than Device 8 containing N-DMBI represented by formula (29) as the first material.

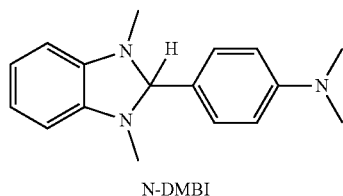

(29)

N-DMBI

This is presumably because the functions of Devices 15 and 16 are different from the function of Device 8. Specifically, in Device 8, the electron mobility is enhanced by n-doping in which an electron is transferred from N-DMBI to an electron transport material, as described in Non-patent document 9; on the other hand, in Devices 15 and 16, the first material extracts a proton (H$^+$) from the second material, so that a negative charge is generated and the second material is negatively charged, leading to enhancement of the electron mobility (electron injection property). Device 8 in which the pKa of the first material is not 1 or greater possibly cannot employ the mechanism of Device 15 or 16, and is less durable.

Figure 10:
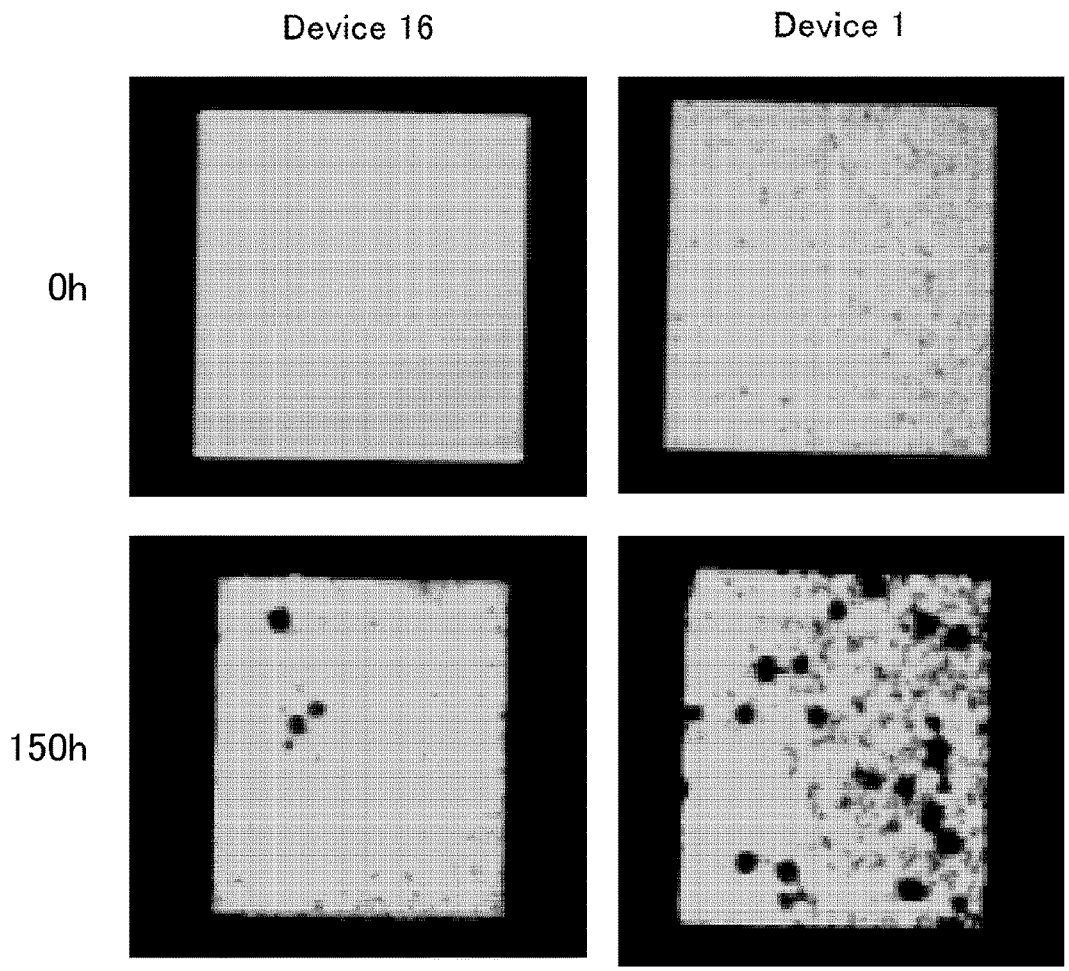
FIG. 10 shows the results of observating changes over time of the light emitting surfaces of the devices having the same structure as Devices 1 and 16 without sealing in the air atmosphere.

FIG. 10 shows the results of observating changes over time of the light emitting surfaces of Devices 1 and 16 without sealing in the air atmosphere. As shown in the figure, Device 16 containing DBN as the first material had less deterioration of the light emitting surface after 150 hours of being left in the air atmosphere and had better atmospheric stability than Device 1 containing only the second material.

FIGS. 2 to 10 demonstrate that the organic EL device including the organic thin film of the present invention has a high electron injection property and good durability.

Example 2

(Preparation of Organic EL Device)

Organic EL devices 1 shown in FIG. 1 were each produced by the following method and evaluated.

First, [Step 1] and [Step 2] were performed in the same manner as in Example 1. Subsequently, the oxide layer 4 was washed with ultraviolet (UV) ozone for 30 minutes before [Step 3]. Next, as [Step 3], an organic thin film containing the first material and the second material according to the proportions shown in Table 3 was formed using the boron compound B synthesized by the following method.

"Synthesis of Boron Compound B"

The boron compound B was the boron-containing compound (2,7-bis(3-dibenzoborolyl-4-pyridylphenyl)-9,9'-spirofluorene) represented by formula (14-2), which was produced according to the reaction scheme (II) described above by the following method.

First, 2-(dibenzoborolylphenyl)-5-bromopyridine (2.6 g, 6.5 mmol) represented by formula (a), 2,7-bis(4,4,5,5-tetramethyl-1,3,2-dioxaborolanyl)-9,9'-spirofluorene (1.5 g, 2.7 mmol) represented by formula (c), and Pd(PtBu$_3$)$_2$ (170 mg, 0.32 mmol) were placed in a 100-mL two-necked recovery flask, which was then purged with nitrogen. Subsequently, THF (65 mL) was added thereto and stirred, and a 2 M aqueous solution of tripotassium phosphate (11 mL, 22 mmol) was added. The contents were allowed to react by heating and stirring under reflux at 70° C. After 12-hour reaction, the reaction solution was cooled to room temperature and transferred to a separatory funnel, and water was added thereto, followed by extraction with ethyl acetate. The organic layer was washed with each of 3 N hydrochloric acid, water, and saturated saline, dried over magnesium sulfate, and filtered. Thereafter, the filtrate was concentrated to obtain a solid, which was washed with methanol. Thus, the boron-containing compound represented by formula (14-2) was obtained in a yield of 47% (1.2 g, 1.3 mmol).

The resulting boron-containing compound was identified by $^1$H-NMR.

$^1$H-NMR (CDCl$_3$): 56.67 (d, J=7.6 Hz, 2H), 6.75 (d, J=1.2 Hz, 2H), 6.82 (d, J=7.2 Hz, 4H), 6.97 (dt, J=7.2, 1.2 Hz, 4H), 7.09 (dt, J=7.2, 0.8 Hz, 2H), 7.24-7.40 (m, 14H), 7.74-7.77 (m, 6H), 7.84-7.95 (m, 10H).

Next, an organic thin film containing the first material and the second material according to the proportions shown in Table 3 was formed on the oxide layer 4 as an electron injection layer 5 by the following method.

First, the first material and the second material were dissolved in cyclopentanone according to the proportions shown in Table 3 to prepare a coating composition. Next, the substrate 2 having the cathode 3 and the oxide layer 4 prepared in [Step 2] was placed on a spin coater. Then, the substrate 2 was rotated at 3000 rpm for 90 seconds while the coating composition was dropped on the oxide layer 4. Thus, a coat was formed. Subsequently, the substrate 2 was annealed in a nitrogen atmosphere at 120° C. for one hour using a hot plate to prepare an electron injection layer 5. The electron injection layer 5 had an average thickness of 10 nm.

TABLE 3

| Device No. | First material | Second material |
|---|---|---|
| 21 | — | Boron compound B (1 mass %) |
| 22 | 2-DMAP (10 mass %) | Boron compound B (1 mass %) |
| 23 | — | Boron compound C (1 mass %) |
| 24 | 2-DMAP (10 mass %) | Boron compound C (1 mass %) |

[Step 4]

Next, the substrate 2 with the electron injection layer 5 and previous layers formed thereon was fixed to a substrate holder of a vacuum deposition apparatus. Then, [Step 4-2] was performed in the same manner as in Example 1, except that the hole injection layer 8 was formed using molybdenum trioxide instead of HAT-CN. Thereafter, [Step 5] was performed in the same manner as in Example 1 to prepare Devices 21 and 22 shown in Table 3 as organic EL devices.

Regarding Devices 21 and 22 as organic EL devices, the relationship between the applied voltage, the luminance, and the current density was determined in the same manner as in Example 1. The results are shown in FIG. 11.

Figure 11:
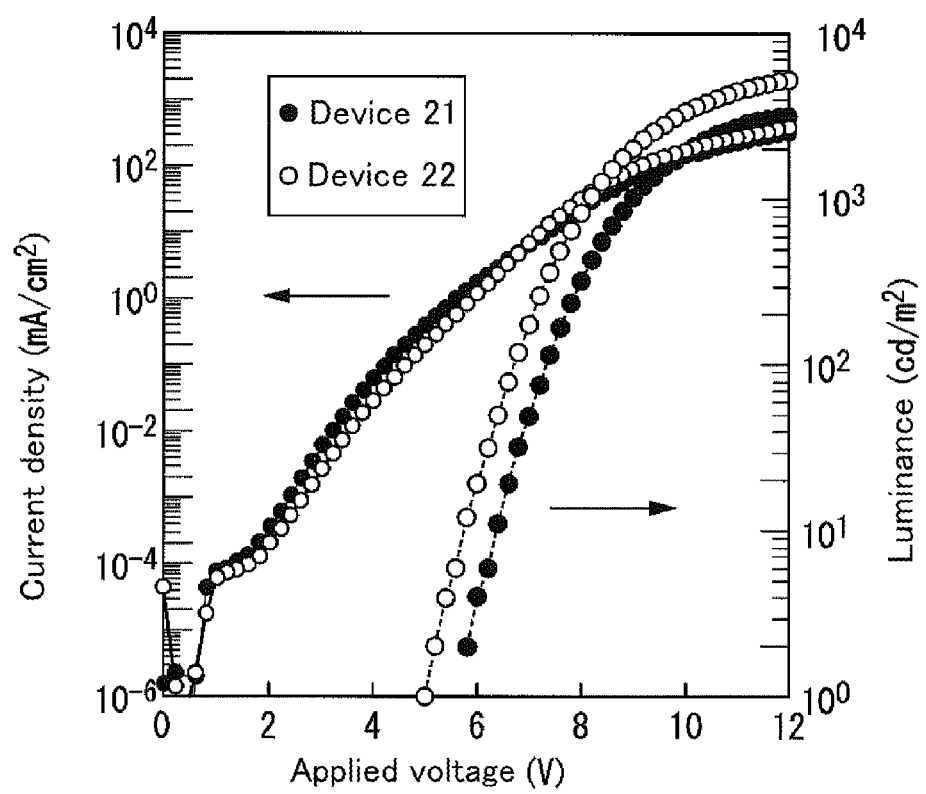
FIG. 11 is a graph showing the relationship between the applied voltage, the luminance, and the current density of Devices 21 and 22.

FIG. 11 is a graph showing the relationship between the applied voltage, the luminance, and the current density of Devices 21 and 22. As shown in FIG. 11, Device 22 having an electron injection layer containing the first material and the second material had an equal current density and a higher luminance and was driven at a lower voltage than Device 21 having an electron injection layer consisting only of the second material under the same applied voltage. This is presumably because the electron injection property is enhanced by 2-DMAP, which is an organic material having a pKa of 1 or greater, and the boron-containing compound represented by formula (14-2).

Example 3

(Preparation of Organic EL Device)

Organic EL devices 1 shown in FIG. 1 were each produced by the following method and evaluated.

First, [Step 1] and [Step 2] were performed in the same manner as in Example 1. Next, as [Step 3], an organic thin film containing the first material and the second material according to the proportions shown in Table 3 was formed using the boron compound C synthesized by the following method.

"Synthesis of Boron Compound C"

The boron compound C was the boron-containing compound represented by formula (21-2), which was produced using the boron-containing compound represented by formula (16-40) by the following method.

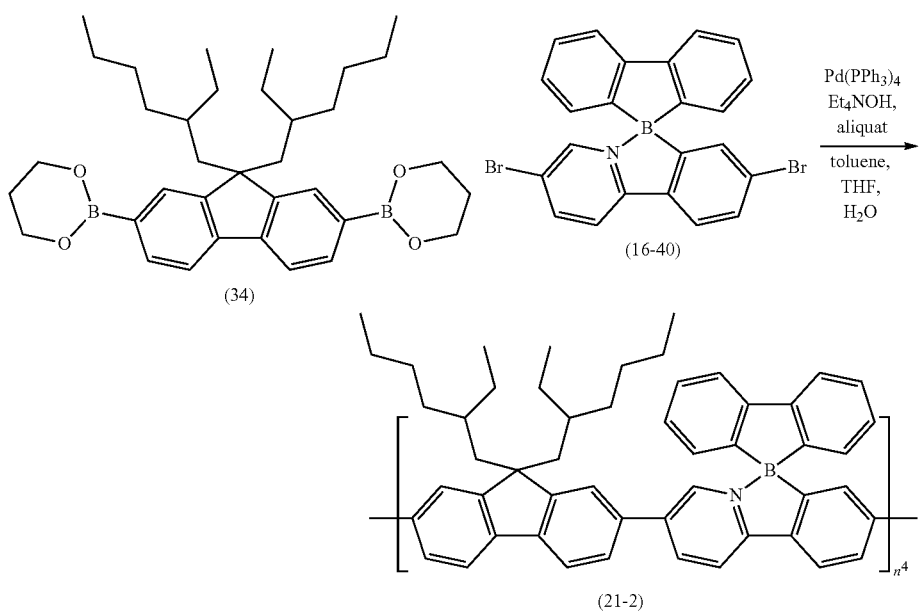

The boron-containing compound represented by formula (16-40) (1.0 g, 2.11 mmol) was placed in a two-necked flask, which was then purged with nitrogen. To the flask was added a 0.5 M solution of 9,9-di(2-ethylhexyl)fluorene-2,7-diboronic acid bis(1,3-propanediol)ester represented by formula (34) in toluene (4.3 mL, 2.15 mmol), THF (12 mL), a 35 wt % aqueous solution of tetraethyl ammonium hydroxide (3.5 mL), water (4.6 mL), and a solution of aliquat (registered trademark) (85 mg) in toluene (12 mL). To the solution was added Pd(PPh$_3$)$_4$ (73 mg, 0.063 mmol), and the contents were heated and stirred at 115° C. for 24 hours. Then, bromobenzene (430 mg, 2.74 mmol) was added thereto and the contents were stirred at 115° C. for 10 hours. Thereafter, phenylboronic acid (1.21 g, 9.9 mmol) was further added and the contents were reacted by stirring at 115° C. overnight. The resulting reaction solution was cooled to room temperature, diluted with toluene, transferred to a separatory funnel, and washed with water. The organic layer was concentrated, the resulting residue was dissolved in toluene, and the solution was allowed to pass through a silica gel short column. The resulting solution was concentrated and dissolved in chloroform, and methanol was added thereto to obtain a yellow precipitate, which was filtered off. The yellow precipitate was subjected to Soxhlet extraction (methanol, hexane). Thus, the boron-containing compound represented by formula (21-2) was obtained (10.5 mg).

Figure 12:
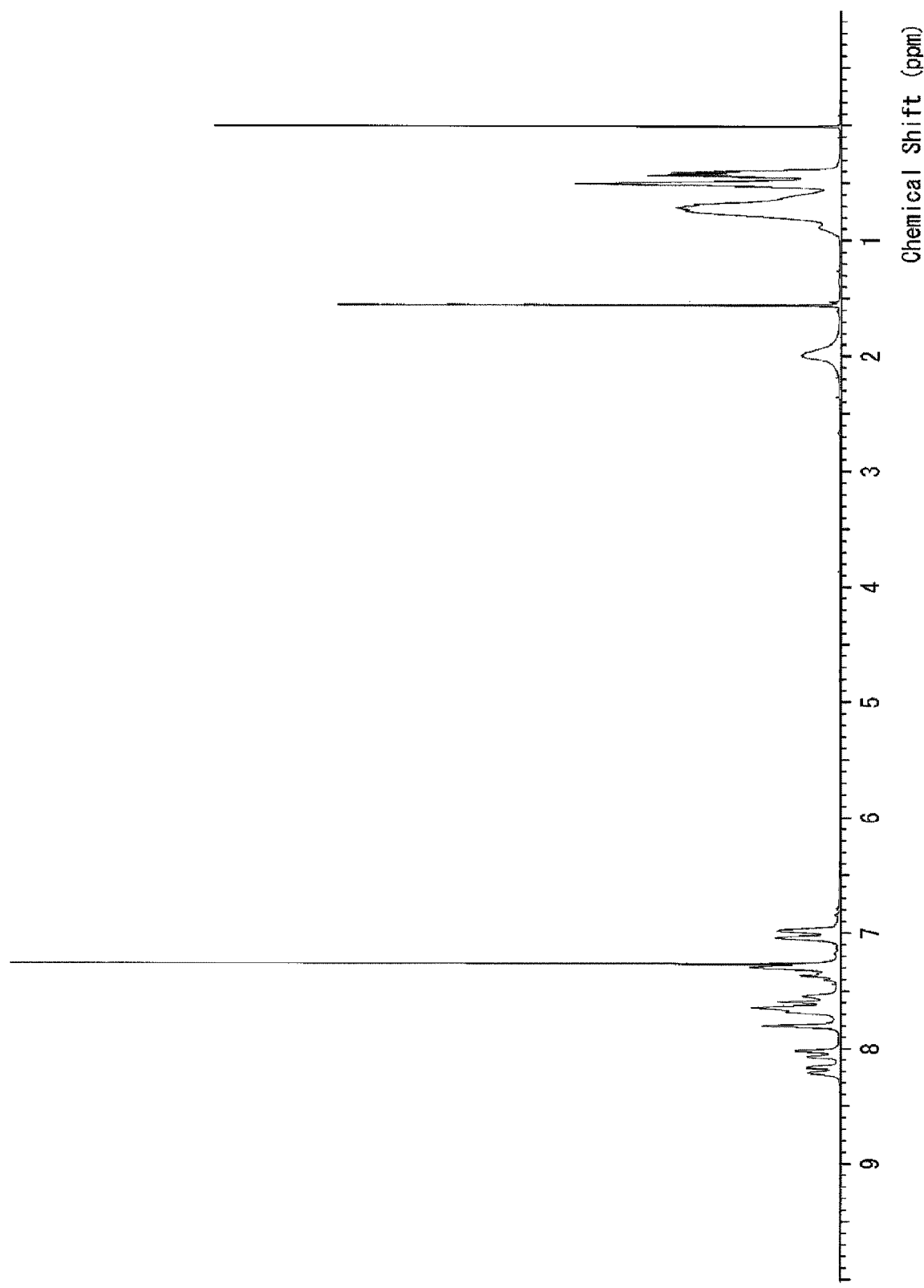
FIG. 12 is a graph showing the result of $^1$H-NMR measurement of the boron compound C.

The resulting boron-containing compound was identified by $^1$H-NMR. The result of $^1$H-NMR measurement was shown in FIG. 12.

The resulting boron-containing compound had a number average molecular weight (Mn) of 11,607, a weight average molecular weight (Mw) of 29,887, and a PDI (Mw/Mn) of 2.58.

Next, an organic thin film containing the first material and the second material according to the proportions shown in Table 3 was formed on the oxide layer 4 as an electron injection layer 5 by the following method.

First, the first material and the second material were dissolved in cyclopentanone according to the proportions shown in Table 3 to prepare a coating composition. Next, the substrate 2 having the cathode 3 and the oxide layer 4 prepared in [Step 2] was placed on a spin coater. Then, the substrate 2 was rotated at 2000 rpm for 90 seconds while the coating composition was dropped on the oxide layer 4. Thus, a coat was formed. Subsequently, the substrate 2 was annealed in a nitrogen atmosphere at 120° C. for one hour using a hot plate to prepare an electron injection layer 5. The electron injection layer 5 had an average thickness of 15 nm.

Next, [Step 4] and [Step 5] were performed in the same manner as in Example 2 to prepare Devices 23 and 24 shown in Table 3 as organic EL devices.

Regarding Devices 23 and 24 as organic EL devices, the relationship between the applied voltage, the luminance, and the current density was determined in the same manner as in Example 1. The results are shown in FIG. 13.

Figure 13:
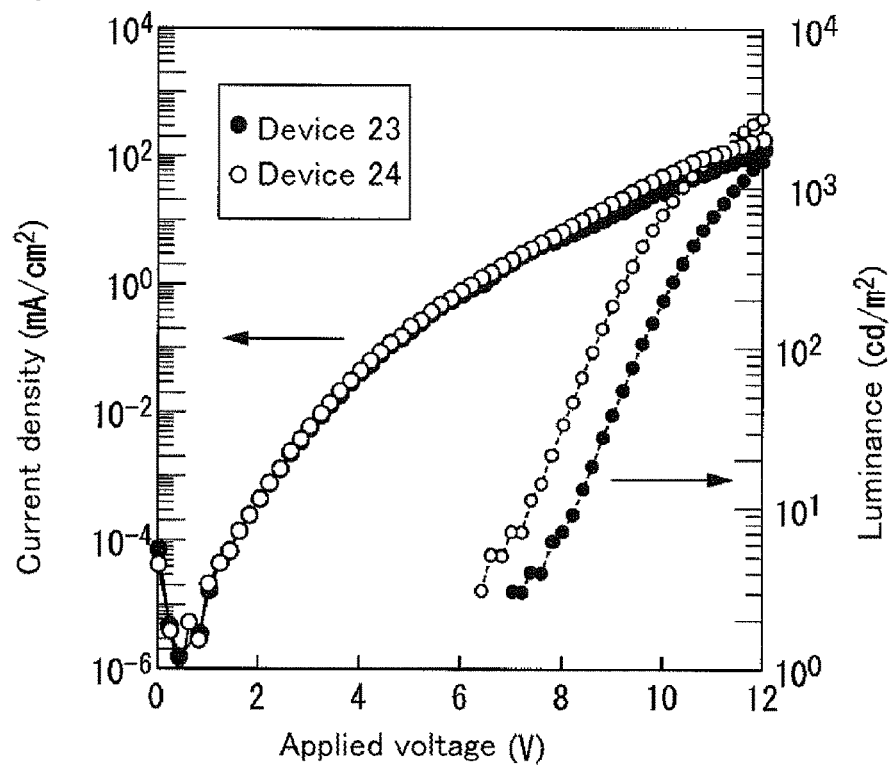
FIG. 13 is a graph showing the relationship between the applied voltage, the luminance, and the current density of Devices 23 and 24.

FIG. 13 is a graph showing the relationship between the applied voltage, the luminance, and the current density of Devices 23 and 24. As shown in FIG. 13, Device 24 having an electron injection layer containing the first material and the second material had a current density equal to and a luminance higher than Device 23 having an electron injection layer consisting only of the second material under the same applied voltage, and Device 24 was driven at a lower voltage than Device 23. This is presumably because the electron injection property is enhanced by 2-DMAP, which is an organic material having a pKa of 1 or greater, and the boron-containing compound represented by formula (21-2).

Example 4

(Preparation of Organic EL Device)

Organic EL devices 1 shown in FIG. 1 were each produced by the following method and evaluated.

[Step 1] was performed in the same manner as in Example 1, and then [Step 2-2] was performed in the following way.
[Step 2-2]

The substrate 2 having the cathode 3 washed in [Step 1] was fixed to a substrate holder of a mirrortron sputtering apparatus having a zinc metal target. The pressure in the chamber of the sputtering apparatus was reduced to about $1 \times 10^{-4}$ Pa, and the substrate 2 was subjected to sputtering with argon and oxygen introduced therein to form a zinc oxide layer having a thickness of about 7 nm on the cathode 3 of the substrate 2. Upon the preparation of the zinc oxide layer, the zinc oxide film was not formed on part of the ITO electrode (cathode 3) in order to take out the electrode. A 1% solution of magnesium acetate in a water-ethanol (volume ratio 1:3 (ratio of number of atoms)) mixture was prepared, and the substrate 2 having the zinc oxide layer was attached to a spin coater. The solution of magnesium acetate was dropped on the substrate, and the substrate was rotated at 1300 rpm for 60 seconds. Thereafter, the substrate 2 was annealed in the air atmosphere at 400° C. for one hour to form the oxide layer 4 on the substrate.

Next, an organic thin film containing the first material and the second material according to the proportions shown in Table 4 was formed on the oxide layer 4 as an electron injection layer 5 by the following [Step 3-2]. In the case of Device 26, no DBN coat was formed.
[Step 3-2]

The substrate 2 having the cathode 3 and the oxide layer 4 prepared in [Step 2-2] was placed on a spin coater. Then, the substrate 2 was rotated at 2000 rpm for 90 seconds while the first material was dropped on the oxide layer 4. Thus, a coat of the first material was formed. The substrate 2 was rotated at 2000 rpm for 90 seconds while a solution prepared by dissolving the second material in cyclopentanone was dropped on the substrate 2 having the coat of the first material. Thus, a coat of the second material was formed. Thereafter, the substrate 2 was annealed at 120° C. for one hour using a hot plate to prepare an electron injection layer 5. The electron injection layer 5 had an average thickness of 15 nm.

TABLE 4

| Device No. | First material | Second material |
|---|---|---|
| 25 | DBN | Boron compound A |
| 26 | — | Boron compound A |

Next, [Step 4-2] was performed in the same manner as in Example 2, and then [Step 5] was performed in the same manner as in Example 1 to prepare Devices 25 and 26 shown in Table 4 as organic EL devices.

Regarding Devices 25 and 26, the relationship between the applied voltage and the luminance was determined in the same manner as in Example 1. Further, the relationship between the time and the relative luminance was determined. The results are shown in FIGS. 14 and 15.

Figure 14:
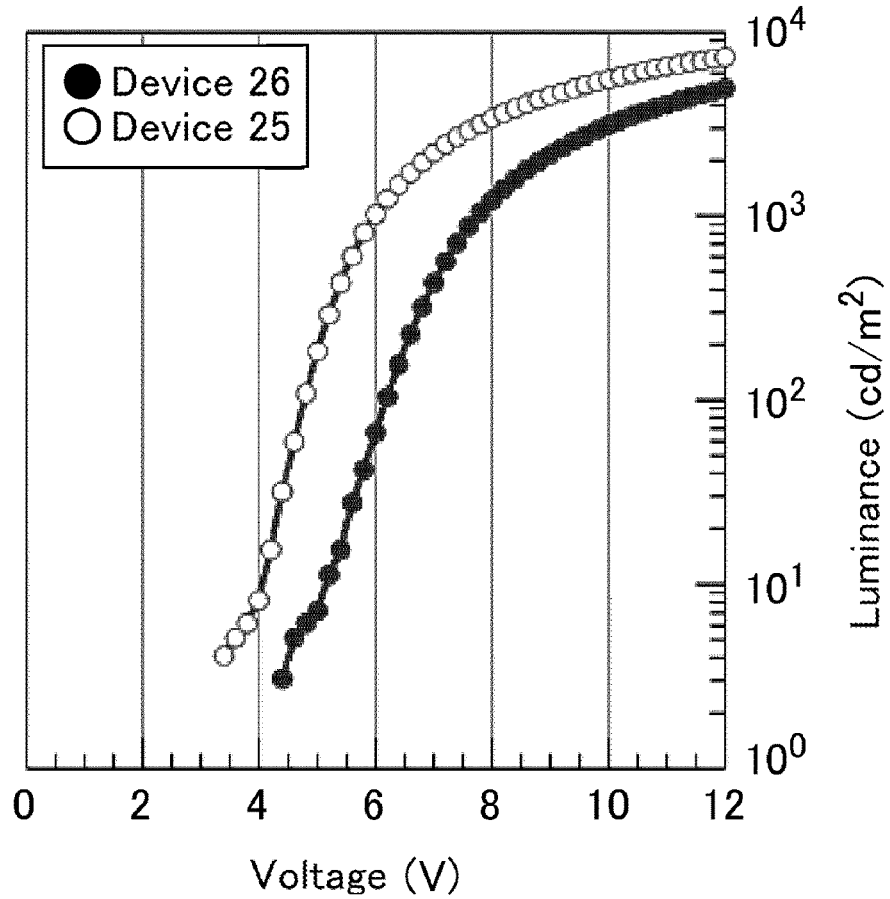
FIG. 14 is a graph showing the relationship between the applied voltage and the luminance of Devices 25 and 26.
Figure 15:
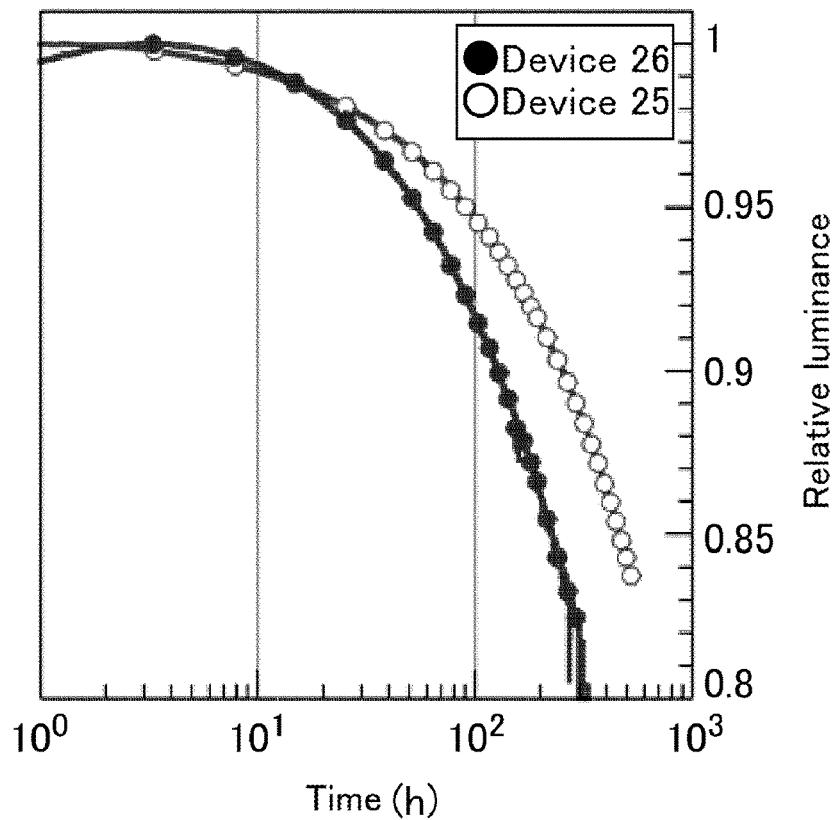
FIG. 15 is a graph showing the relationship between the light-emitting time and the relative luminance of Devices 25 and 26.

FIG. 14 is a graph showing the relationship between the applied voltage and the luminance of Devices 25 and 26. As shown in FIG. 14, Device 25 having an electron injection layer containing the first material and the second material had a higher luminance and was driven at a lower voltage than Device 26 having an electron injection layer consisting only of the second material under the same applied voltage. As shown in FIG. 15, the luminance decreased more slowly and was maintained for a longer time in Device 25 than in Device 26. This is presumably because the electron injection property is enhanced by DBN, which is an organic material having a pKa of 1 or greater, and the boron compound A. Further, such results demonstrate that high luminance is obtained at a low driving voltage not only in the case of forming an electron injection layer by applying a composition prepared by preliminarily mixing the first material and the second material, but also in the case of forming a layer of the first material and a layer of the second material.

Example 5

(Preparation of Organic EL Device)

Organic EL devices 1 shown in FIG. 1 were each produced by the following method and evaluated.

[Step 1] was performed in the same manner as in Example 1, and then [Step 2-2] was performed in the same manner as in Example 4.

Next, as [Step 3], an organic thin film containing the first material and the second material according to the proportions shown in Table 5 was formed using the boron compound D synthesized by the following method.
"Synthesis of Boron Compound D"

The boron compound D was the boron-containing compound represented by formula (42), which was produced according to the following Synthesis Examples 4 to 7.

Synthesis Example 4

The boron compound 2 was synthesized by the following method.

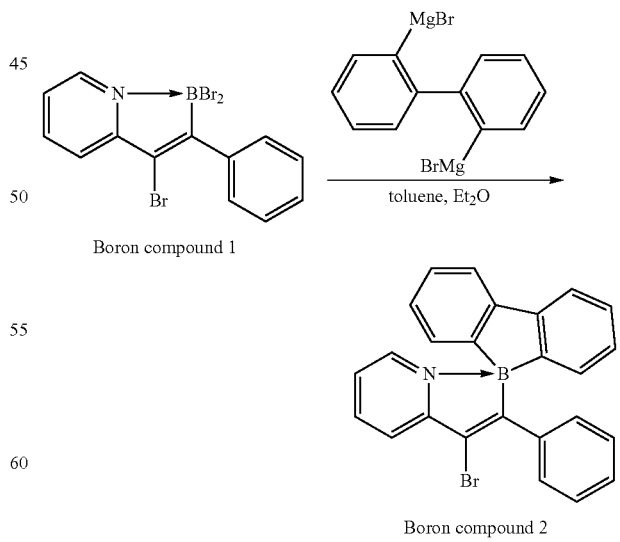

Boron compound 1

Boron compound 2

Magnesium (1.23 g, 50.5 mmol) was placed in a three-necked flask, which was then purged with nitrogen. Subsequently, diethyl ether (50 mL) was placed in the reaction vessel and a small portion of iodine was placed therein, followed by stirring until the color disappeared. Then, 2,2'-dibromobiphenyl (7.5 g, 24 mmol) was added to the reaction vessel, followed by stirring at room temperature for 10 hours and at 50° C. for 1 hour. Thus, a Grignard reagent was prepared. To the reaction solution was added toluene (204 mL), the solution was cooled to −78° C., and the boron-containing compound 1 (8.8 g, 20.4 mmol) was added thereto. The solution was heated to room temperature, followed by stirring overnight. The reaction was stopped with water, and 2 N hydrochloric acid was added, followed by extraction with chloroform. The organic layer was washed with saturated saline, dried over magnesium sulfate, and filtered. The filtrate was concentrated, and the residue was purified by column chromatography. A thus obtained coarse product was recrystallized from toluene. Thus, the boron compound 2 (2.72 g (6.4 mmol), yield 32%) was obtained. This reaction was represented by the above scheme.

The result of $^1$H-NMR measurement of the boron compound 2 was as follows.

$^1$H-NMR (600 MHz, CDCl$_3$): δ=8.02 (t, J=7.9 Hz, 1H), 7.95 (td, J=1.0, 8.2 Hz, 1H), 7.73-7.69 (m, 3H), 7.44-7.34 (m, 2H), 7.31-7.23 (m, 2H), 7.15-7.11 (m, 3H), 7.08 (ddd, J=1.3, 5.8, 7.3 Hz, 1H), 7.06-7.02 (m, 4H).

Synthesis Example 5

The boron compound 3 was synthesized by the following method from the boron compound 2 synthesized in Synthesis Example 4.

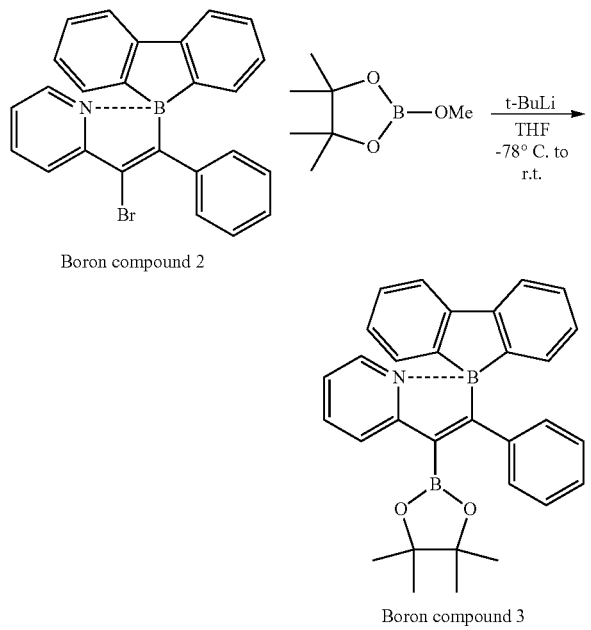

Boron compound 2

Boron compound 3

The boron compound 1 (3.1 g, 7.2 mmol) was placed in a 100-mL two-necked flask, which was then purged with nitrogen. Subsequently, THF (36 mL) was added thereto, and the contents were cooled to −78° C.

To the solution was slowly added tert-butyllithium (1.61 M pentane solution, 9.0 mL, 14.5 mmol), followed by stirring for one hour. Then, 2-methoxy-4,4,5,5-tetramethyl-1,3,2-dioxaborolane (3.5 mL, 21.7 mmol) was added thereto. The solution was stirred at −78° C. for one hour and heated to room temperature, followed by stirring overnight. To the reaction solution was added water, followed by extraction with ethyl acetate. The organic layer was washed with saturated saline, dried over magnesium sulfate, and filtered.

The filtrate was concentrated, the resulting residue was dissolved in chloroform, and the solution was allowed to pass through a silica gel short column and concentrated. Hexane was added to the residue to obtain a solid precipitate, which was filtered off. Thus, the boron compound 3 was obtained (1.6 g (3.1 mmol, 47%)).

The result of $^1$H-NMR measurement of the boron compound 3 was as follows.

$^1$H-NMR (600 MHz, CDCl$_3$): δ=8.01 (d, J=8.4 Hz, 1H), 7.83 (dt, J=(8.2, 7.4, 1.6, 1.2 Hz, 1H), 7.67 (d, J=7.6 Hz, 2H), 7.62 (d, J=5.6 Hz, 1H), 7.19-7.23 (m, 2H), 6.97-7.09 (m, 9H), 6.92 (t, J=6.6 Hz, 1H).

Synthesis Example 6

The following described the synthesis of 6-(4-bromophenyl)-2,2'-bipyridine.

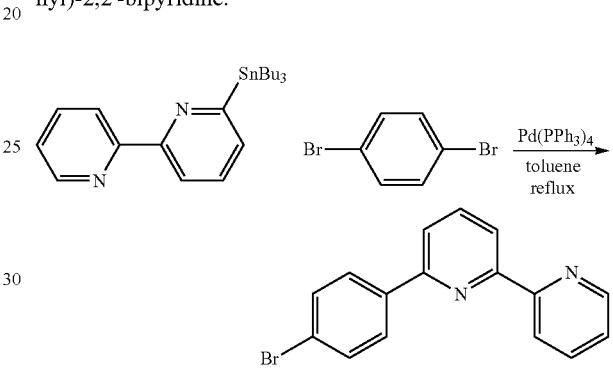

First, 1,4-dibromobenzene (6.4 g, 26.9 mmol) and Pd(PPh$_3$)$_4$ (519 mg, 0.45 mmol) were placed in a 200-mL two-necked flask, which was then purged with nitrogen, and were dissolved in toluene (67 mL). To the solution was added 6-(tributylstannyl)-2,2'-bipyridine (4.0 g, 9.0 mmol), and the solution was heated and stirred under reflux overnight. The reaction solution was cooled down to room temperature and concentrated, and the residue was purified by column chromatography. Thus, 6-(4-bromophenyl)-2,2'-bipyridine was obtained (2.2 g (7.0 mmol, 78%)).

The result of $^1$H-NMR measurement of 6-(4-bromophenyl)-2,2'-bipyridine was as follows.

$^1$H-NMR (600 MHz, CDCl$_3$): δ=8.69-8.70 (m, 1H), 8.60 (d, J=8.0 Hz, 1H), 8.39 (dd, J=8.0, 0.8 Hz, 1H), 8.03 (d, J=8.4 Hz, 2H), 7.83-7.91 (m, 2H), 7.74 (dd, J=8.4, 1.2, 0.8 Hz, 1H), 7.63 (d, J=8.8 Hz, 2H), 7.32-7.35 (m, 1H).

Synthesis Example 7

The boron compound D was synthesized in the following way.

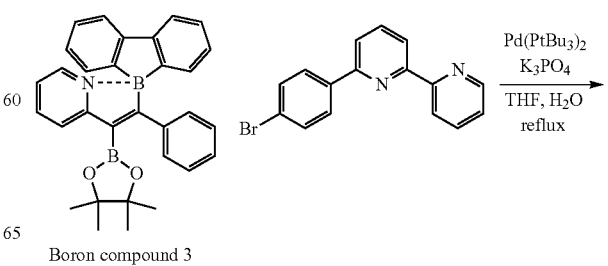

Boron compound 3

-continued

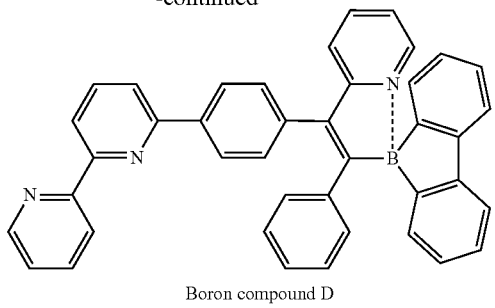

Boron compound D

The boron compound 3 (2.0 g, 4.2 mmol), 6-(4-bromophenyl)-2,2'-bipyridine (0.93 g, 3.0 mmol), and Pd(PtBu$_3$)$_2$ (77 mg, 0.15 mmol) were placed in a 100-mL two-necked flask, which was then purged with nitrogen, and were dissolved in THF (30 mL). To the solution was added an aqueous solution of K$_3$PO$_4$ (1.78 g, 8.4 mmol, 4.2 mL), and the solution was heated and stirred under reflux overnight. The reaction solution was cooled to room temperature, and water was added thereto, followed by extraction with ethyl acetate. The organic layer was washed with saturated saline, dried over magnesium sulfate, and filtered.

The filtrate was concentrated, and the residue was purified by silica gel column chromatography. Thus, the boron compound D was obtained (460 mg (0.80 mmol, 27%)).

The result of $^1$H-NMR measurement of the boron compound D was as follows.

$^1$H-NMR (600 MHz, CDCl$_3$): δ=7.72 (d, J=4.0 Hz, 1H), 8.68 (d, J=7.6 Hz, 1H), 8.42 (d, J=7.6 Hz, 1H), 8.28 (d, J=7.6 Hz), 7.73-7.95 (m, 7H), 7.57 (dd, J=6.8, 2.0 Hz, 2H), 7.49 (d, J=8.0 Hz, 1H), 7.35 (t, J=6.4, 6.0 Hz, 1H), 7.26-7.30 (m, 2H), 7.15 (d, J=6.8 Hz, 2H), 7.08 (t, J=7.2, 6.8 Hz, 2H), 6.86-6.99 (m, 6H).

Next, an organic thin film containing the first material and the second material according to the proportions shown in Table 5 was formed on the oxide layer 4 as an electron injection layer 5 by the following method.

First, the first material and the second material were dissolved in cyclopentanone according to the proportions shown in Table 5 to prepare a coating composition. Next, the substrate 2 having the cathode 3 and the oxide layer 4 prepared in [Step 2] was placed on a spin coater. Then, the substrate 2 was rotated at 2000 rpm for 90 seconds while the coating composition was dropped on the oxide layer 4. Thus, a coat was formed. Thereafter, the substrate 2 was annealed in a nitrogen atmosphere at 120° C. for one hour using a hot plate to prepare an electron injection layer 5. The electron injection layer 5 had an average thickness of 15 nm.

TABLE 5

| Device No. | First material | Second material |
|---|---|---|
| 27 | DBN (2 mass %) | Boron compound D (1 mass %) |
| 28 | — | Boron compound D (1 mass %) |

Next, [Step 4-2] was performed in the same manner as in Example 2, and then [Step 5] was performed in the same manner as in Example 1 to prepare Devices 27 and 28 shown in Table 5 as organic EL devices.

Regarding Devices 27 and 28, the relationship between the applied voltage and the luminance was determined in the same manner as in Example 1. The results are shown in FIG. 16.

Figure 16:
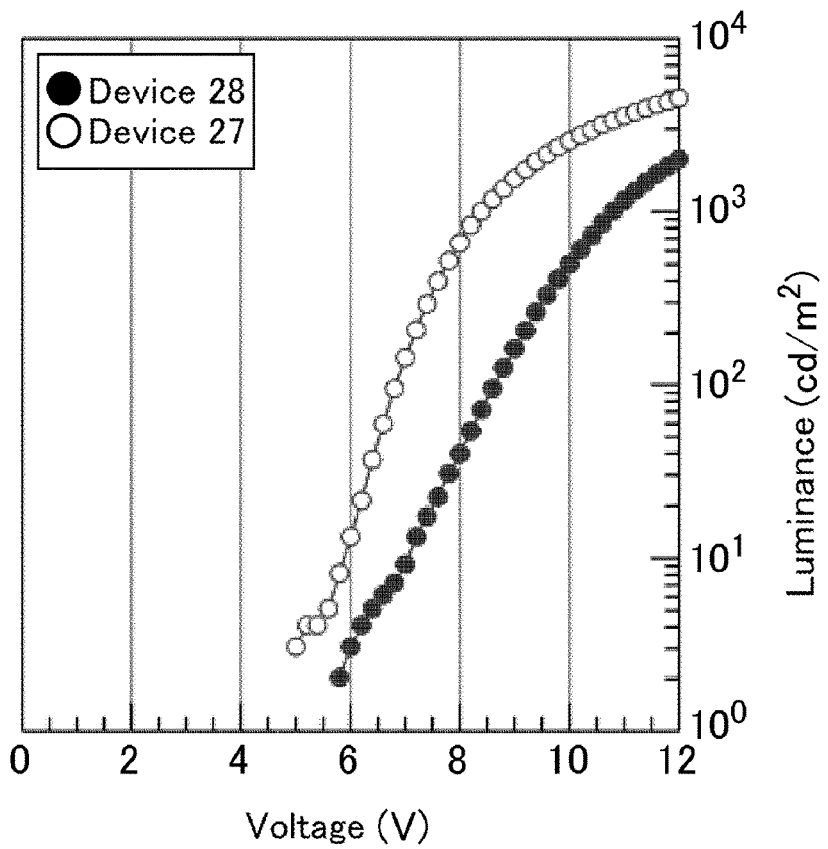
FIG. 16 is a graph showing the relationship between the applied voltage and the luminance of Devices 27 and 28.

FIG. 16 is a graph showing the relationship between the applied voltage and the luminance of Devices 27 and 28. As shown in FIG. 16, Device 27 having an electron injection layer containing the first material and the second material had a higher luminance under the same applied voltage and was driven at a lower voltage under the same luminance than Device 28 having an electron injection layer consisting only of the second material. This is presumably because the electron injection property is enhanced by DBN, which is an organic material having a pKa of 1 or greater, and the boron compound D.

Example 6

(Preparation of Organic EL Device)

An organic EL device 1 shown in FIG. 1 was produced by the following method using the boron compound E synthesized by the following method and evaluated.

"Synthesis of Boron Compound E"

The boron compound E was produced using the boron-containing compound represented by formula (16-40) by the following Synthesis Examples 8 and 9.

Synthesis Example 8

The following described the synthesis of 2-(3-(5H-dibenzo[b,d]borol-5-yl)-5-(4,4,5,5-tetramethyl-1,3,2-dioxaborolan-2-yl)thiophen-2-yl)-5-(4,4,5,5-tetramethyl-1,3,2-dioxaborolan-2-yl)pyridine.

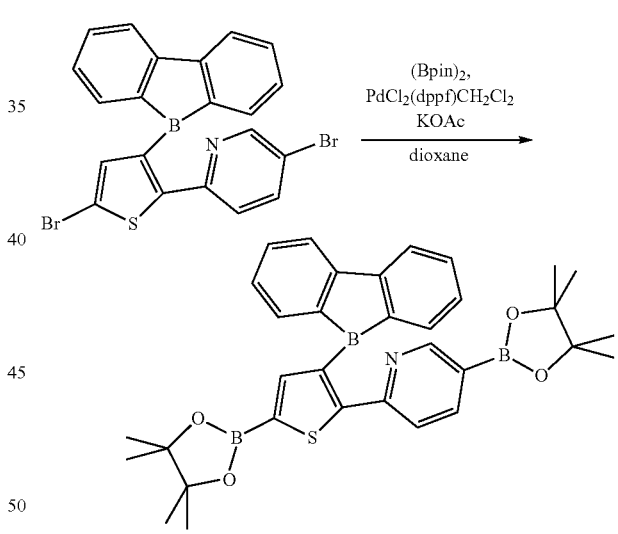

Figure 17:
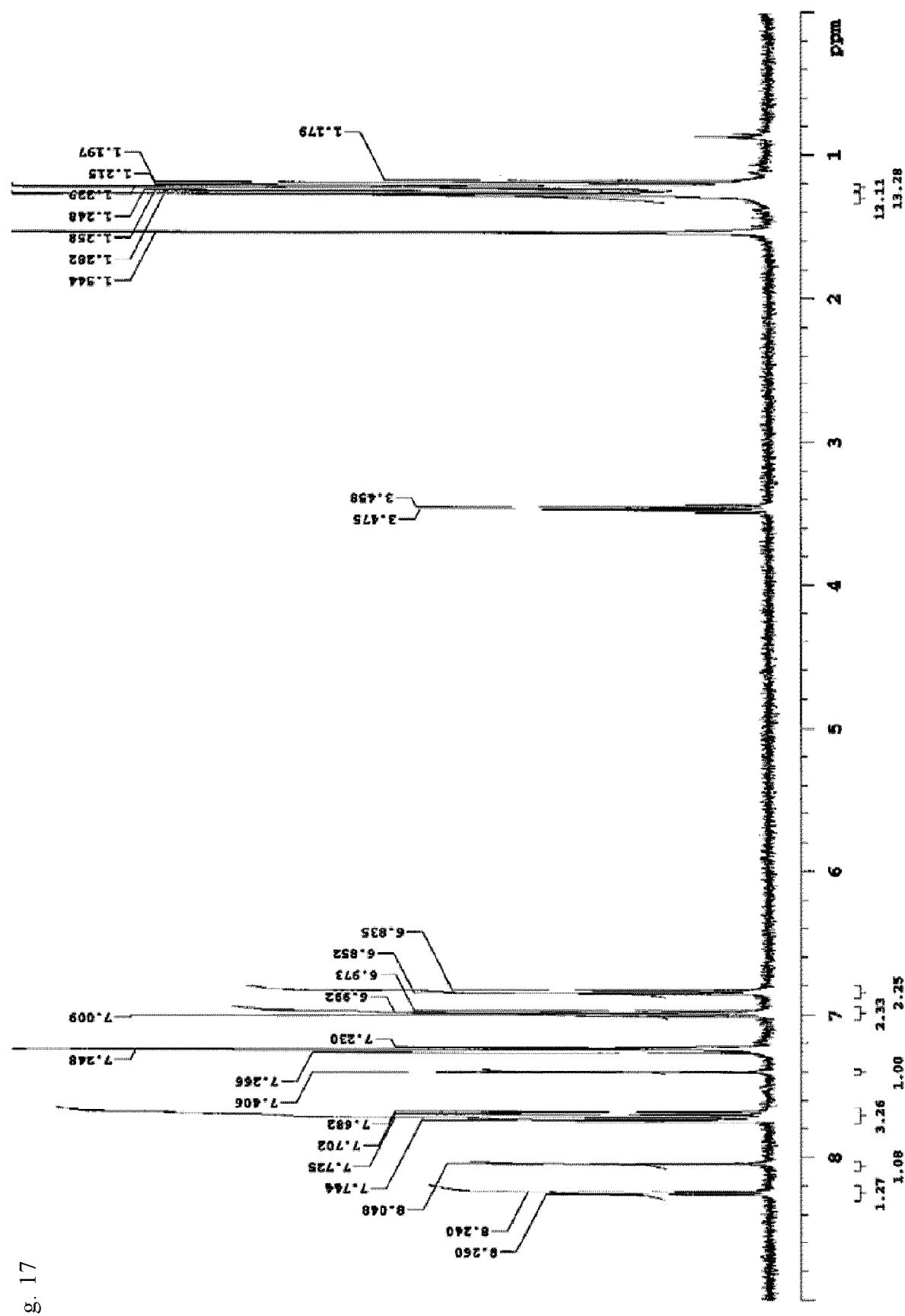
FIG. 17 shows the result of $^1$H-NMR measurement of 2-(3-(5H-dibenzo[b,d]borol-5-yl)-5-(4,4,5,5-tetramethyl-1,3,2-dioxaborolan-2-yl)thiophen-2-yl)-5-(4,4,5,5-tetramethyl-1,3,2-dioxaborolan-2-yl)pyridine produced in Synthesis Example 8.

In dehydrated dioxane (Wako Pure Chemical Industries, Ltd., 20 mL) were dissolved 5-bromo-2-(5-bromo-3-(5H-dibenzo[b,d]borol-5-yl)thiophen-2-yl)pyridine (1.0 g), bis(pinacolato)diboron ((Bpin)$_2$, Tokyo Chemical Industry Co., Ltd., 2.1 g), [1,1'-bis(diphenylphosphino)ferrocene]palladium (II) dichloride dichloromethane complex (PdCl$_2$(dppf)CH$_2$Cl$_2$, Aldrich, 0.04 g), and potassium acetate (Wako Pure Chemical Industries, Ltd., 0.6 g), followed by reaction with stirring at 80° C. overnight. After the reaction, the solution was cooled to room temperature and concentrated, and the residue was purified by silica gel column chromatography to give 2-(3-(5H-dibenzo[b,d]borol-5-yl)-5-(4,4,5,5-tetramethyl-1,3,2-dioxaborolan-2-yl)thiophen-2-yl)-5-(4,4,5,5-tetramethyl-1,3,2-dioxaborolan-2-yl)pyridine (0.4 g). The synthesis was confirmed by $^1$H-NMR (FIG. 17).

Synthesis Example 9

The boron compound E was synthesized in the following way.

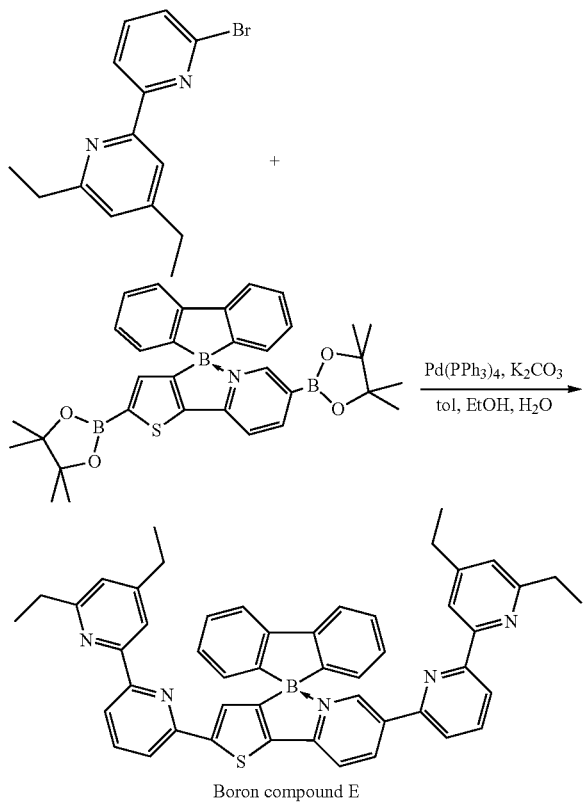

Boron compound E

Figure 18:
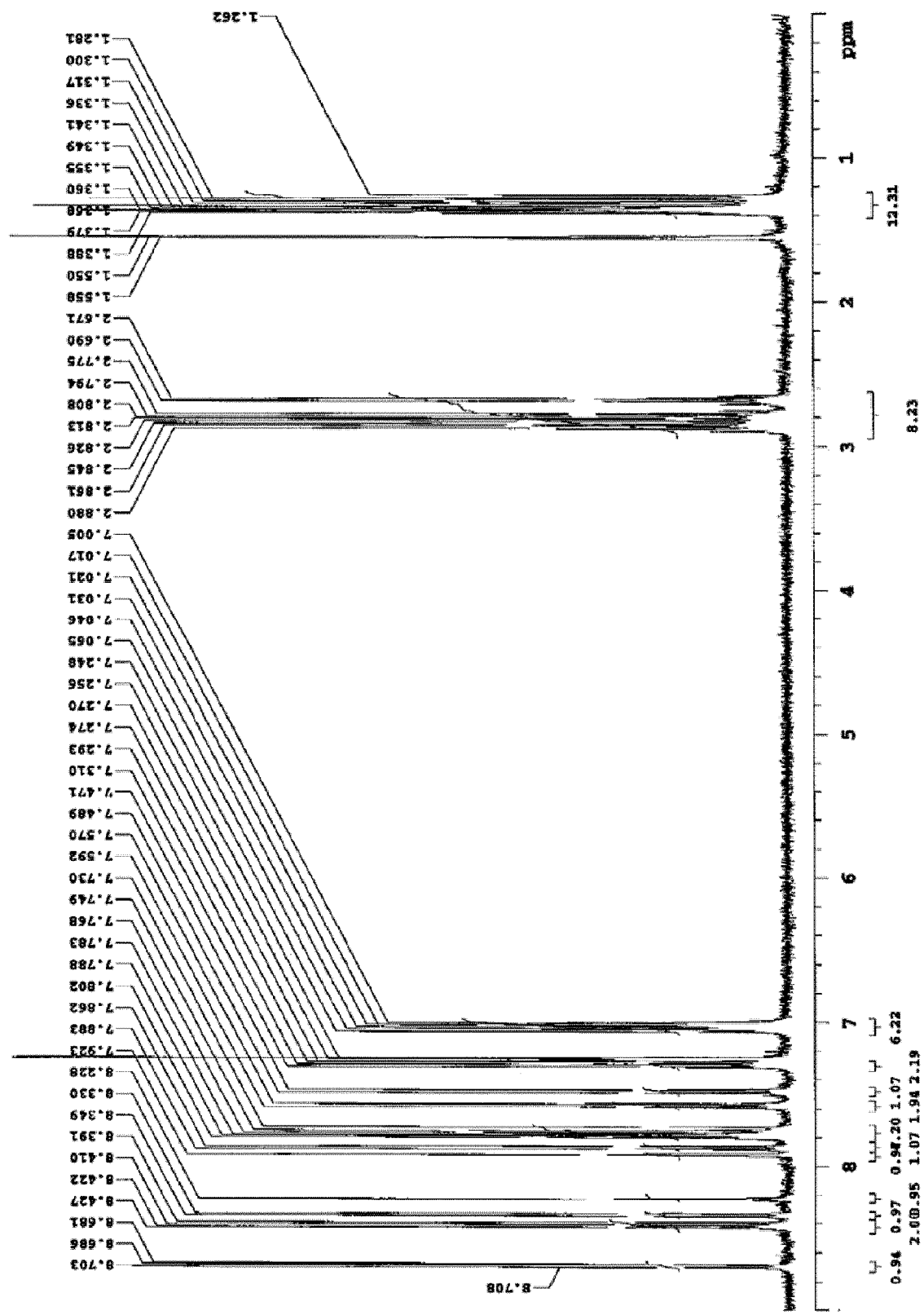
FIG. 18 shows the result of $^1$H-NMR measurement of 6"-(5-([2,2'-bipyridin]-6-yl)-3-(5H-dibenzo[b,d]borol-5-yl) thiophen-2-yl)-2,2':6'3"-terpyridine which is the boron compound E synthesized in Example 9.

In a solvent mixture of dehydrated toluene (Wako Pure Chemical Industries, Ltd., 14 mL) and dehydrated ethanol (Wako Pure Chemical Industries, Ltd., 5.6 mL) were dissolved 2-(3-(5H-dibenzo[b,d]borol-5-yl)-5-(4,4,5,5-tetramethyl-1,3,2-dioxaborolan-2-yl)thiophen-2-yl)-5-(4,4,5,5-tetramethyl-1,3,2-dioxaborolan-2-yl)pyridine (0.40 g), 6'-bromo-4,6-diethyl-2,2'-bipyridine (0.61 g), and tetrakis triphenylphosphine palladium (0) (Tokyo Chemical Industry Co., Ltd., 0.025 g). To the solution was added an aqueous solution of potassium carbonate (in which 0.22 g thereof was dissolved in 2.8 mL of water), followed by reaction with stirring at 100° C. overnight. After the reaction, the reaction solution was cooled to room temperature, followed by extraction with chloroform. The solution was washed with water, and the organic layer was dried over sodium sulfate, filtered, and concentrated. The residue was purified by silica gel column chromatography to give 6"-(3-(5H-dibenzo[b,d] borole-5-(4',6'-diethyl-[2,2'-bipyridine]-6-yl)thiophen-2-yl)-4,6-diethyl-2,2':6',3"-terpyridine (C4-S-SPBBPy2: boron compound E) (0.2 g). The synthesis of the boron compound E was confirmed by $^1$H-NMR measurement (FIG. 18).

(Production of Organic EL Device)

[Step 1-6]

A commercially available ITO-coated transparent glass substrate having an average thickness of 0.7 mm was prepared.

[Step 2-6]

The substrate was washed in each of isopropanol and acetone, and then washed with UV ozone for 20 minutes.

[Step 3-6]

On the ITO electrode, a zinc oxide (ZnO) layer (metal oxide layer) having an average thickness of 10 nm was formed by sputtering with a zinc metal target using oxygen as a reaction gas and argon as a carrier gas. Thereafter, the substrate was washed in each of isopropanol and acetone. In addition, the substrate was annealed in the air atmosphere at 400° C. for one hour using a hot plate.

[Step 4-6]

A 0.5% solution of the boron compound E in cyclopentanone was prepared. An electron injection layer was formed from the boron compound E on the metal oxide layer prepared in [Step 3-6] by spin coating. The electron injection layer had an average thickness of 10 nm.

[Step 5-6]

Next, tris[1-phenylisoquinoline-C2,N]iridium (III) (Ir(piq)$_3$), bis[2-(o-hydroxyphenyl benzothiazole]zinc (II) (Zn(BTZ)$_2$), N4,N4'-bis(dibenzo[b,d]thiophen-4-yl)-N4,N4'-diphenylbiphenyl-4,4'-diamine (DBTPB), and N,N'-di(1-naphthyl)-N,N'-diphenyl-1,1'-biphenyl-4,4'-diamine (α-NPD) were each vacuum-deposited at a degree of vacuum of about 1×10$^{-4}$ Pa. Here, Zn(BTZ)$_2$ and Ir(piq)$_3$ were co-deposited to a thickness of 30 nm so that Zn(BTZ)$_2$ contained 6% of Ir(piq)$_3$. Thus, an emitting layer was formed. Next, a 10-nm-thick DBTPB film and a 30-nm-thick α-NPD film were deposited to form hole transport layers.

[Step 6-6]

Subsequently, a hole injectable metal oxide layer and an anode were prepared. On the organic compound layer, a molybdenum oxide (MoO$_3$) layer (hole infective metal oxide layer) was deposited to an average thickness of 10 nm, and aluminum (Al) (anode) was deposited to an average thickness of 100 nm. Thus, an organic EL device (Device 29) was prepared.

(Measurement of Light-Emitting Properties of Organic EL Device)

Figure 19:
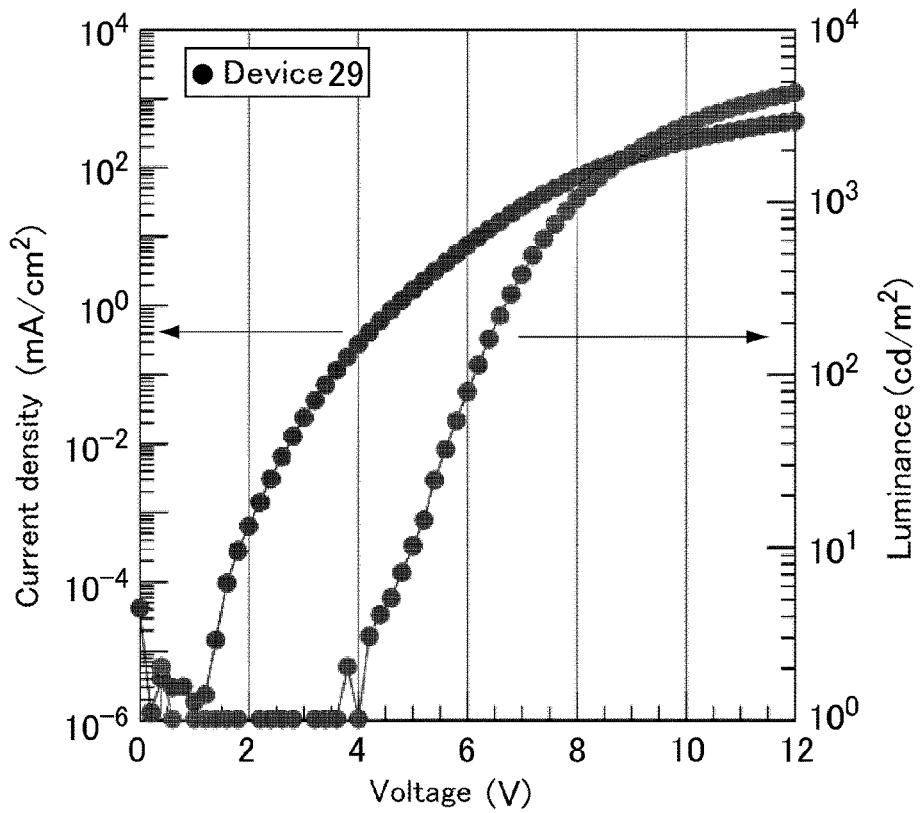
FIG. 19 is a graph showing the relationship between the voltage and the current density and the relationship between the voltage and the luminance characteristics of Device 29 as an organic EL device including the boron compound E-containing organic thin film as an electron injection layer.

A voltage was applied to the device and the current was measured using "2400 series SourceMeter" produced by Keithley Instruments. The emission luminance was measured using "BM-7" produced by Topcon Corporation. The uniformity of a light emitting surface was visually observed. FIG. 19 shows the voltage-current efficiency characteristics of Device 29 produced in Example 6 to which a direct voltage of 0 V to 12 V was applied in a nitrogen atmosphere.

FIG. 19 demonstrates that Device 29 also has good characteristics, specifically, achieves emission even at a low applied voltage. This is presumably because the electron injection property is enhanced by the effect of cyclopentanone, which is the first material, on the boron compound E, which is the second material.

Example 7

(Preparation of Organic EL Device)

Devices 30 and 31 shown in FIG. 1 were produced as organic EL devices by the following method and evaluated.

First, [Step 1] was performed in the same manner as in Example 1, and [Step 2-2] was performed in the same manner as in Example 4. Next, the following [Step 3-2] was performed instead of [Step 3] in Example 1. [Step 3-2]

The substrate 2 having the cathode 3 and the oxide layer 4 prepared in [Step 2-2] was placed on a spin coater. Then, the substrate 2 was rotated at 2000 rpm for 90 seconds while DBN was dropped on the oxide layer 4. Thus, a coat was formed.

Next, [Step 4-7] described below was performed and [Step 5] was performed in the same manner as in Example 1 to prepare Device 30 as an organic EL device. Device 31 was obtained as an organic EL device in the same manner as for Device 30, except that [Step 3-2] was not performed.

[Step 4-7]

Next, the substrate 2 with the electron injection layer 5 and previous layers formed thereon was fixed to a substrate holder of a vacuum deposition apparatus. Further, Zn(BTZ)$_2$, Ir(piq)$_3$, α-NPD, and DBTPB represented by the respective formulas (24) to (27), molybdenum trioxide (MoO$_3$), and Al were separately put into crucibles, which were set as deposition sources.

The pressure in the chamber of the vacuum deposition apparatus was reduced to 1×10$^{-5}$ Pa, and an emitting layer 6, a hole transport layer 7, a hole injection layer 8, and an anode 9 were successively formed by a vacuum deposition method by resistance heating.

First, the emitting layer 6 was formed by co-depositing Zn(BTZ)$_2$ as a host and Ir(piq)$_3$ as a dopant to a thickness of 20 nm. At this point, the doping concentration was controlled such that Ir(piq)$_3$ would be 6% by mass relative to the entire emitting layer 6. Next, the hole transport layer 7 was formed on the substrate 2 with the emitting layer 6 and previous layers formed thereon by forming a 10-nm-thick DBTPB film and a 30-nm-thick α-NPD film. In addition, the hole injection layer 8 was formed by forming a 10-nm-thick MoO$_3$ film. Next, the anode 9 with a thickness of 100 nm made of aluminum was formed by a vacuum deposition method on the substrate 2 with the hole injection layer 8 and previous layers formed thereon.

The anode 9 was formed using a stainless steel deposition mask to obtain a band-like deposition surface having a width of 3 mm. The produced organic EL device had an emitting area of 9 mm$^2$.

Regarding Devices 30 and 31 as organic EL devices, the relationship between the applied voltage and the luminance was determined in the same manner as in Example 1. The results are shown in FIG. 20.

Figure 20:
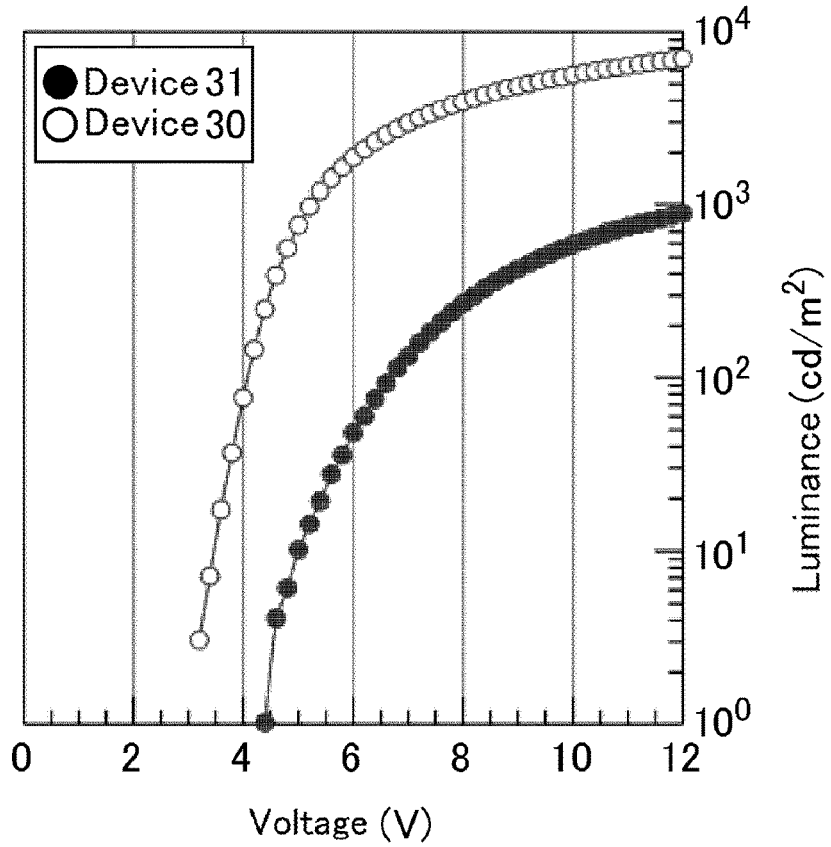
FIG. 20 is a graph showing the relationship between the applied voltage and the luminance of Devices 30 and 31.

FIG. 20 is a graph showing the relationship between the applied voltage and the luminance of Devices 30 and 31. In Device 30, Zn(BTZ)$_2$ contained in the emitting layer was regarded as the second material. As shown in FIG. 20, Device 30 in which the second material was formed into a layer after the formation of a layer of the first material had a higher luminance under the same applied voltage and was driven at a lower voltage under the same luminance than Device 31 including only the second material (no first material).

Example 8

(Preparation of Organic EL Device)

Organic EL devices 1 shown in FIG. 1 were produced by the following method as Devices 32 and 33, and were evaluated.

First, [Step 1] and [Step 2-2] were performed in the same manner as in Example 4.

[Step 3-2]

The substrate 2 having the cathode 3 and the oxide layer 4 prepared in [Step 2-2] was placed on a spin coater. The substrate 2 was rotated at 2000 rpm for 90 seconds while the first material was dropped on the oxide layer 4. Thus, a coat of the first material was formed. Next, the boron compound A as the second material was vacuum-deposited to an average thickness of 10 nm. Thus, the electron injection layer 5 was obtained. In the case of Device 33, no DBN coat was formed.

TABLE 6

| Device No. | First material | Second material |
|---|---|---|
| 32 | DBN | Boron compound A |
| 33 | — | Boron compound A |

Next, [Step 4-2] was performed in the same manner as in Example 2, and then [Step 5] was performed in the same manner as in Example 1 to prepare Devices 32 and 33 shown in Table 6 as organic EL devices.

Regarding Devices 32 and 33 as organic EL devices, the relationship between the applied voltage and the luminance was determined in the same manner as in Example 1. Further, the relationship between the time and the relative luminance was determined. The results are shown in FIGS. 21 and 22.

Figure 21:
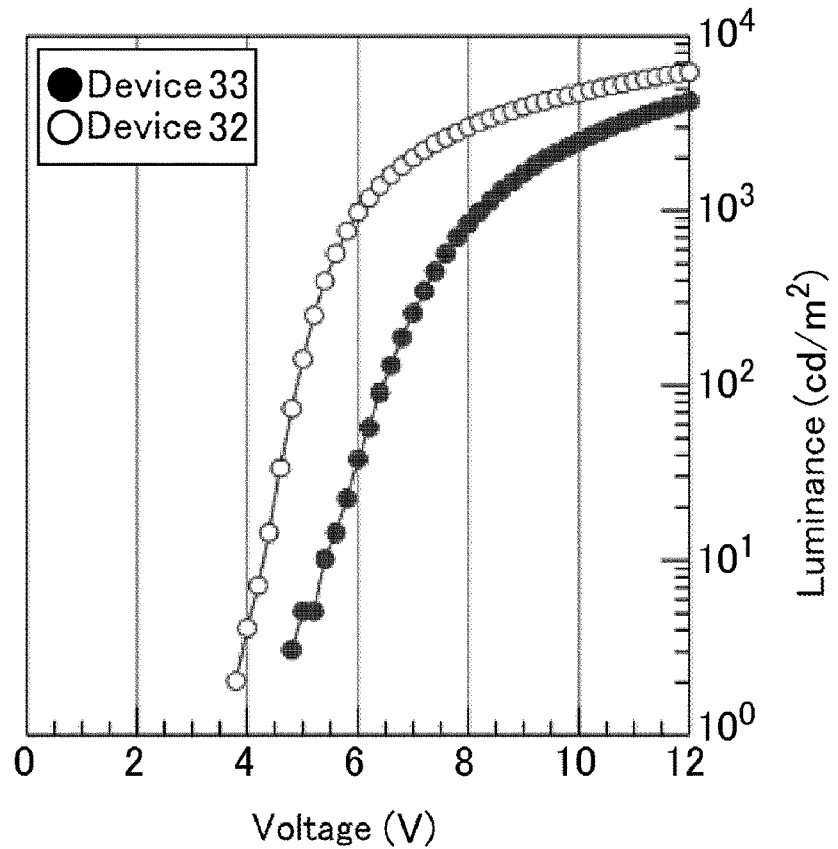
FIG. 21 is a graph showing the relationship between the applied voltage and the luminance of Devices 32 and 33.
Figure 22:
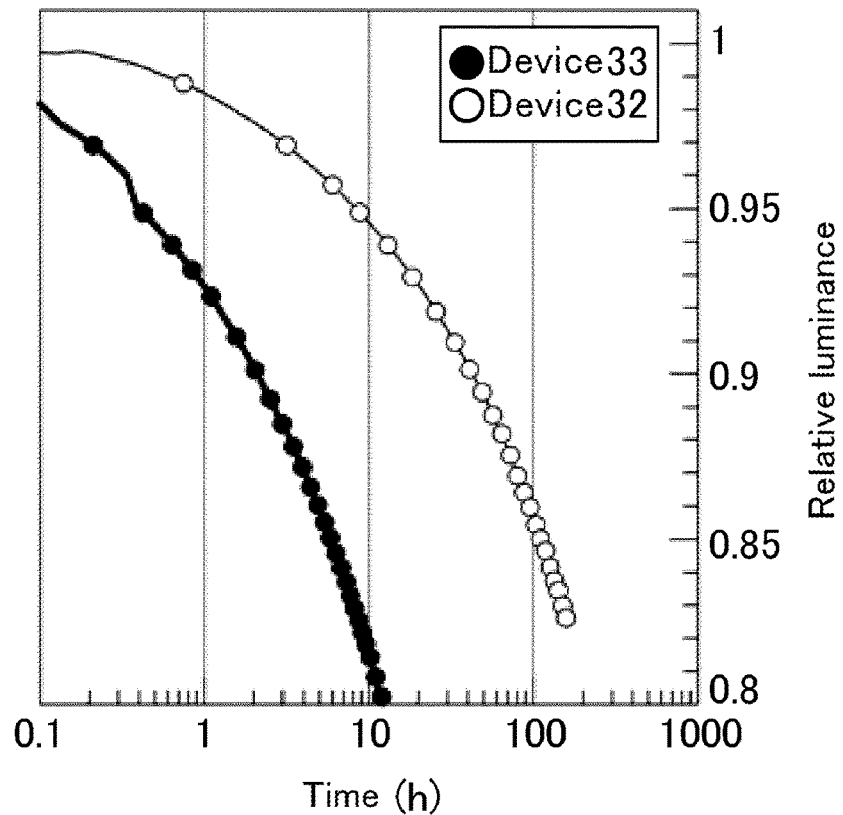
FIG. 22 is a graph showing the relationship between the light-emitting time and the relative luminance of Devices 32 and 33.

FIG. 21 is a graph showing the relationship between the applied voltage and the luminance of Devices 32 and 33. As shown in FIG. 21, Device 32 having an electron injection layer containing the first material and the second material had a higher luminance under the same applied voltage and was driven at a lower voltage under the same luminance than Device 33 having an electron injection layer consisting only of the second material. Further, the luminance decreased more slowly in Device 32 than in Device 33, and the luminance of Device 32 was maintained 100 times longer than the time to maintain the luminance of Device 33. This is presumably because the electron injection property is enhanced by DBN, which is an organic material having a pKa of 1 or greater, and the boron compound A. Further, such results demonstrate that high luminance is obtained at a low driving voltage not only in the case of forming an electron injection layer by applying a composition prepared by preliminarily mixing the first material and the second material, but also in the case of forming a layer of the first material and a layer of the second material.

Example 9

(Preparation of Organic EL Device)

Organic EL devices 1 shown in FIG. 1 were each produced by the following method as Devices 34 and 35, and were evaluated.

First, [Step 1] and [Step 2-2] were performed in the same manner as in Example 4.

Next, [Step 3-2] was performed, in which the first material and the second material were as shown in Table 7. In the case of Device 35, no coat of indene represented by formula (54) was formed.

TABLE 7

| Device No. | First material | Second material |
|---|---|---|
| 34 | Indene | Boron compound A |
| 35 | — | Boron compound A |

Next, [Step 4-2] was performed in the same manner as in Example 2, and then [Step 5] was performed in the same manner as in Example 1 to prepare Devices 34 and 35 shown in Table 7 as organic EL devices.

Regarding Devices 34 and 35, the relationship between the applied voltage and the luminance was determined in the same manner as in Example 1. Further, the relationship between the time and the relative luminance was determined. The results are shown in FIGS. 23 and 24.

Figure 23:
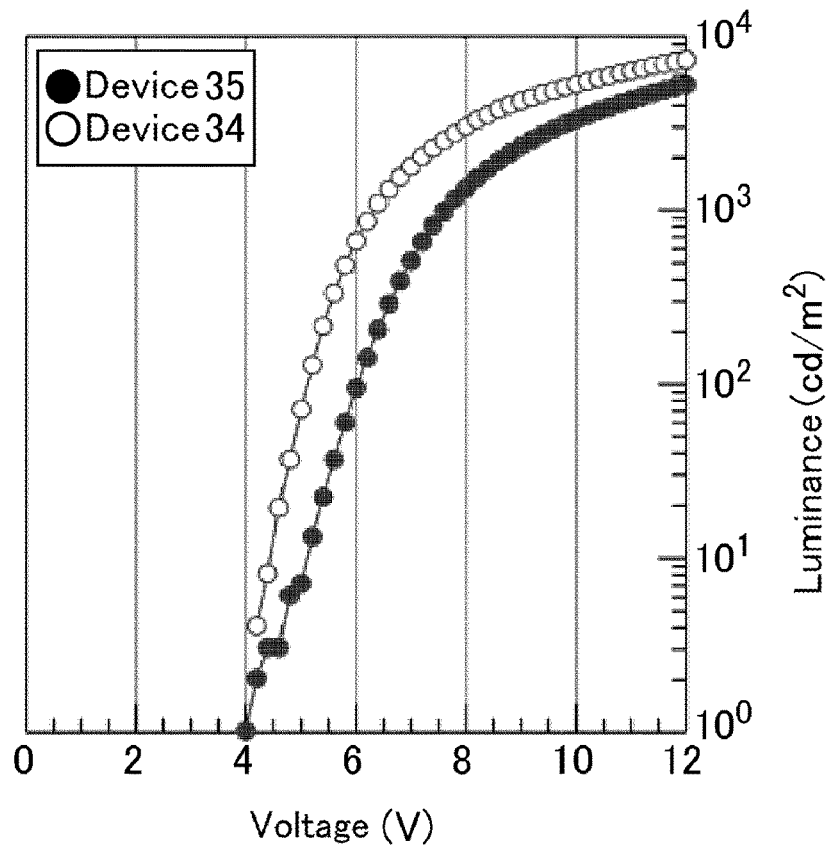
FIG. 23 is a graph showing the relationship between the applied voltage and the luminance of Devices 34 and 35.
Figure 24:
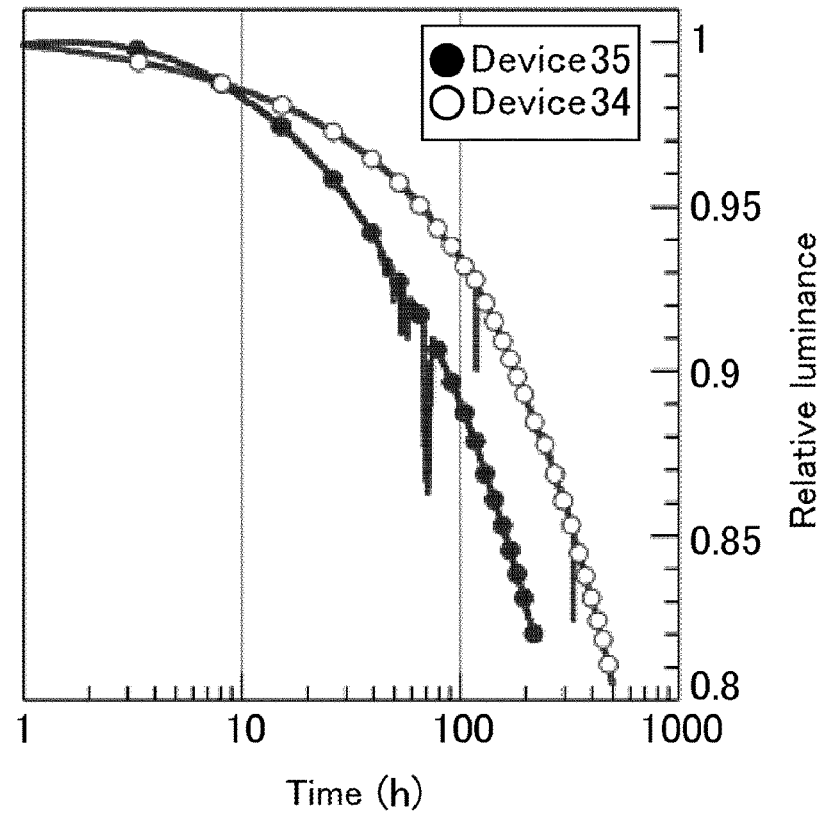
FIG. 24 is a graph showing the relationship between the light-emitting time and the relative luminance of Devices 34 and 35.

FIG. 23 is a graph showing the relationship between the applied voltage and the luminance of Devices 34 and 35. As shown in FIG. 23, Device 34 having an electron injection layer containing the first material and the second material had a higher luminance under the same applied voltage and was driven at a lower voltage under the same luminance than Device 35 having an electron injection layer consisting only of the second material. The luminance decreased more slowly in Device 34 than in Device 35. This is presumably because the electron injection property is enhanced by indene, which is an organic material having a pKa of 1 or greater, and the boron compound A. Further, such results also demonstrate that high luminance is obtained at a low driving voltage not only in the case of forming an electron injection layer by applying a composition prepared by preliminarily mixing the first material and the second material, but also in the case of forming a layer of the first material and a layer of the second material.

Example 10

(Preparation of Organic EL Device)

Organic EL devices 1 shown in FIG. 1 were each produced by the following method as Devices 100 and 101, and were evaluated.

First, [Step 1] and [Step 2] were performed in the same manner as in Example 1.

Next, [Step 3] was performed except that the annealing after the spin coating was performed at 150° C. for one hour, in which the first material and the second material were as shown in Table 8. In the case of Device 100, no AOB represented by formula (43) was used.

TABLE 8

| Device No. | First material | Second material |
| --- | --- | --- |
| 100 | — | Boron compound A (1 mass %) |
| 101 | AOB (0.03 mass %) | Boron compound A (0.97 mass %) |

Next, [Step 4] was performed in the same manner as in Example 1 except that the thicknesses of some of the films were changed as described below.

Thus, Devices 100 and 101 shown in Table 8 were obtained as organic EL devices.

First, the electron transport layer 10 with a thickness of 10 nm made of Zn(BTZ)$_2$ was formed. Subsequently, the emitting layer 6 was formed by co-depositing Zn(BTZ)$_2$ as a host and Ir(piq)$_3$ as a dopant to a thickness of 20 nm. At this point, the doping concentration was controlled such that Ir(piq)$_3$ would be 6% by mass relative to the entire emitting layer 6. Next, the hole transport layer 7 was formed on the substrate 2 with the emitting layer 6 and previous layers formed thereon by forming a 10-nm-thick DBTPB film and a 40-nm-thick α-NPD film. In addition, the hole injection layer 8 was formed by forming a 10-nm-thick HAT-CN film. Next, the anode 9 with a thickness of 100 nm made of aluminum was formed by a vacuum deposition method on the substrate 2 with the hole injection layer 8 and previous layers formed thereon.

Figure 25:
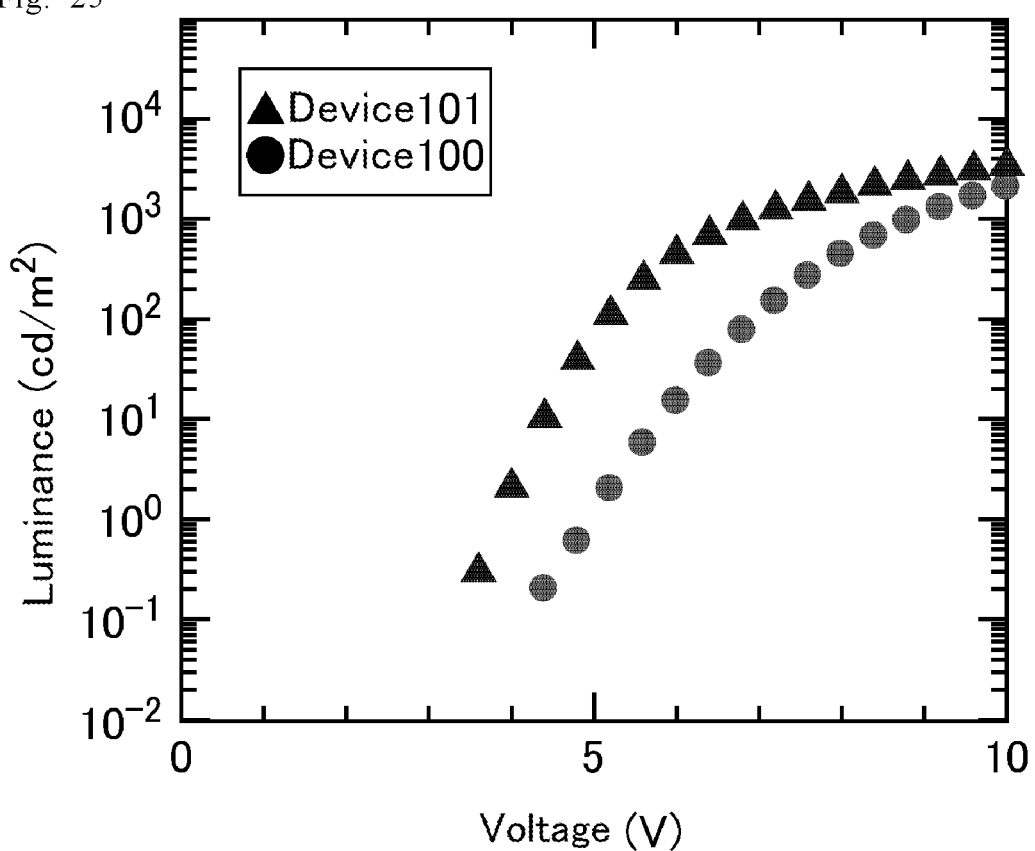
FIG. 25 is a graph showing the relationship between the applied voltage and the luminance of Devices 100 and 101.

FIG. 25 is a graph showing the relationship between the applied voltage and the luminance of Devices 100 and 101. As shown in FIG. 25, Device 101 having an electron injection layer containing the first material and the second material had a higher luminance under the same applied voltage and was driven at a lower voltage under the same luminance than Device 100 having an electron injection layer consisting only of the second material. This is presumably because the electron injection property is enhanced by AOB, which is an organic material having a pKa of 1 or greater, and the boron compound A.

REFERENCE SIGNS LIST

1: organic EL device, 2: substrate, 3: cathode, 4: oxide layer, 5: electron injection layer, 6: emitting layer, 7: hole transport layer, 8: hole injection layer, 9: anode, 10: electron transport layer.

The invention claimed is:

1. An organic electroluminescence device comprising:
a cathode;
an anode;
an emitting layer between the cathode and the anode; and
an organic thin film or a laminate film comprising the organic thin film formed on an oxide layer,
wherein the organic thin film or the laminate film comprising the organic thin film formed on the oxide layer is disposed between the cathode and the emitting layer,
wherein, the organic thin film at least comprising:
a first material which is an organic material having an acid dissociation constant pKa of 1 or greater; and
a second material which transports an electron, wherein
the first material is one or more selected from the group consisting of tertiary amines, phosphazene compounds, guanidine compounds, heterocyclic compounds containing an amidine structure, hydrocarbon compounds having a ring structure, and ketone compounds,
the tertiary amines are dialkylaminopyridines, amines having a structure represented by NR$^1$R$^2$R$^3$, or alkoxypyridine derivatives, R$^1$, R$^2$, and R$^3$ being the same as or different from each other and each representing a hydrocarbon group having 1 to 8 carbon atoms which may optionally be substituted,
the phosphazene compounds have a structure represented by formula (35):

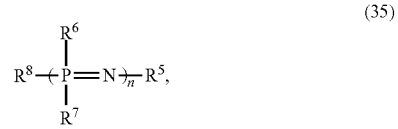

(35)

R$^5$ representing a hydrogen atom or a hydrocarbon group; and R$^6$ to R$^8$ each representing a hydrogen atom, a hydrocarbon group, or —NR'R", R' and R" each independently representing a hydrogen atom or a hydrocarbon group,
the hydrocarbon compounds having the ring structure are compounds consisting of a ring structure, compounds in which a C1-C20 alkyl group is bonded to a ring structure, compounds in which multiple ring structures are directly bonded to each other, or compounds in which multiple ring structures are bonded via a C1-C20 hydrocarbon as a linking group, and the first material and the second material are mixed in the same layer.

2. The organic electroluminescence device according to claim 1, wherein the second material is at least one compound selected from the group consisting of boron-containing compounds represented by formulas (14), (37), (39), (16), and (18):

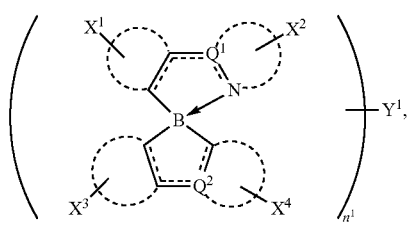

(14)

wherein dotted arcs indicate that ring structures are formed with a backbone shown in solid lines; dotted line portions of the backbone shown in the solid lines each indicate that a pair of atoms connected by a corresponding dotted line is optionally bonded by a double bond; an arrow from a nitrogen atom to a boron atom indicates that the nitrogen atom is coordinated to the boron atom; $Q^1$ and $Q^2$ are the same as or different from each other and each represents a linking group in the backbone shown in the solid lines, at least part of the linking group forms a ring structure with a dotted arc portion and is optionally substituted; $X^1$, $X^2$, $X^3$, and $X^4$ are the same as or different from each other and each represents a hydrogen atom or a monovalent substituent as a substituent in the corresponding ring structure; each of the ring structures forming the dotted arc portions optionally contains multiple $X^1$s, multiple $X^2$s, multiple $X^4$s, or multiple $X^4$s; $n^1$ represents an integer of 2 to 10; and $Y^1$ represents a direct bond or an $n^1$-valent linking group and bonds to each of $n^1$ structural units other than $Y^1$ independently at any one site selected from the ring structures forming the dotted arc portions, $Q^1$, $Q^2$, $X^1$, $X^2$, $X^3$, and $X^4$;

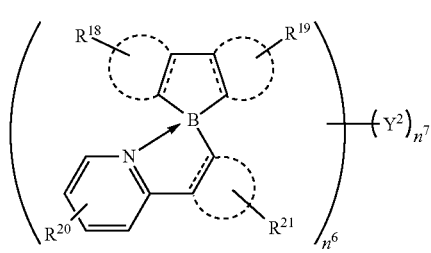

(37)

wherein dotted arcs are the same as or different from each other and indicate that ring structures are formed with a backbone shown in solid lines; dotted line portions of the backbone shown in the solid lines each indicate that a pair of atoms connected by a corresponding dotted line is optionally bonded by a double bond; an arrow from a nitrogen atom to a boron atom indicates that the nitrogen atom is coordinated to the boron atom; $R^{18}$ to $R^{21}$ are the same as or different from each other and each represents a hydrogen atom, a monovalent substituent as a substituent in the corresponding ring structure, a divalent group, or a direct bond; each of the ring structures forming the dotted arc portions optionally contains multiple $R^{18}$s, multiple $R^{19}$s, or multiple $R^{21}$s; the pyridine ring structure optionally contains multiple $R^{20}$s; the ring to which $R^{21}$ is bonded is an aromatic heterocyclic ring; $n^6$ is an integer of 1 to 4; $n^7$ is 0 or 1; when $n^7$ is 1, $Y^2$ represents an $n^6$-valent linking group or a direct bond and bonds to each of $n^6$ structural units other than $Y^2$ independently at any one site selected from $R^{18}$, $R^{19}$, $R^{20}$, and $R^{21}$; and when $n^7$ is 0, $n^6$ is 1 and at least one of $R^{18}$ to $R^{21}$ represents a monovalent substituent as a substituent in the corresponding ring structure;

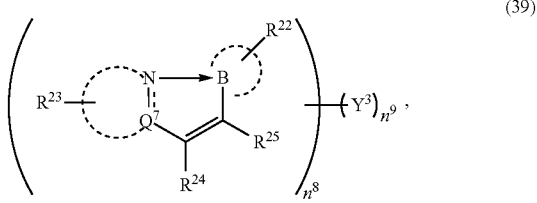

(39)

wherein dotted arcs indicate that ring structures are formed with a boron atom or a backbone shown in solid lines; the ring structures are the same as or different from each other and are each optionally a monocyclic structure constituted by one ring or a fused ring structure constituted by multiple rings; dotted line portions of the backbone shown in the solid lines each indicate that a pair of atoms connected by the corresponding dotted line is optionally bonded by a double bond; an arrow from a nitrogen atom to the boron atom indicates that the nitrogen atom is coordinated to the boron atom; $Q^7$ represents a linking group in the backbone shown in the solid lines, at least part of the linking group forms a ring structure with a dotted arc portion and is optionally substituted; $R^{22}$ and $R^{23}$ are the same as or different from each other and each represents a hydrogen atom, a monovalent substituent as a substituent in the corresponding ring structure, a divalent group, or a direct bond; each of the ring structures forming the dotted arc portions optionally contains multiple $R^{22}$s or multiple $R^{23}$s; $R^{24}$ and $R^{25}$ are the same as or different from each other and each represents a hydrogen atom, a monovalent substituent, a divalent group, or a direct bond; $R^{24}$ and $R^{25}$ are not bonded to each other and do not form a ring structure with the backbone portion shown in the double line; $n^8$ is an integer of 1 to 4; $n^9$ is 0 or 1; when $n^9$ is 1, $Y^3$ represents an $n^8$-valent linking group or a direct bond and bonds to each of $n^8$ structural units other than $Y^3$ independently at any one site selected from $R^{22}$, $R^{23}$, $R^{24}$ and $R^{25}$;

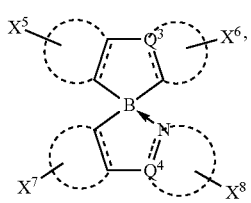

(16)

wherein dotted arcs indicate that ring structures are formed with a backbone shown in solid lines; dotted line portions of the backbone shown in the solid lines each indicate that a pair of atoms connected by the corresponding dotted line is optionally bonded by a double bond; an arrow from a nitrogen atom to a boron atom indicates that the nitrogen atom is coordinated to the boron atom; $Q^3$ and $Q^4$ are the same as or different from each other and each represents a linking group in the backbone shown in the solid lines, at least part of the linking group forms a ring structure with a dotted arc portion and is optionally substituted; $X^5$ and $X^6$ are the same as or different from each other and each represents a hydrogen atom or a monovalent substituent as a substituent in the corresponding ring structure; $X^7$ and $X^8$ are the same as or different from each other and each represents a monovalent substituent having electron transporting property as a substituent in the corresponding ring structure; and each of the ring structures forming the dotted arc portions optionally contains multiple $X^5$s, multiple $X^6$s, multiple $X^7$s, or multiple Vs; and

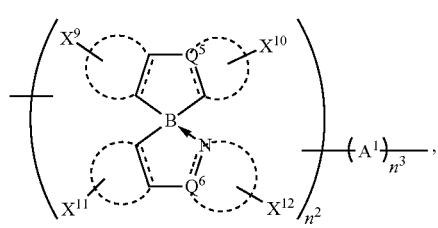

(18)

wherein dotted arcs indicate that ring structures are formed with a backbone shown in the solid lines; dotted line portions of the backbone shown in solid lines each indicate that a pair of atoms connected by the corresponding dotted line is optionally bonded by a double bond; an arrow from a nitrogen atom to a boron atom indicates that the nitrogen atom is coordinated to the boron atom; $Q^5$ and $Q^6$ are the same as or different from each other and each represents a linking group in the backbone shown in the solid lines, at least part of the linking group forms a ring structure with a dotted arc portion and is optionally substituted; $X^9$, $X^{10}$, $X^{11}$, and $X^{12}$ are the same as or different from each other and each represents a hydrogen atom, a monovalent substituent as a substituent in the corresponding ring structure, or a direct bond; each of the ring structures forming the dotted arc portions optionally contains multiple $X^9$s, multiple $X^{10}$s, multiple $X^{11}$s, or multiple $X^{12}$s; $A^1$s are the same as or different from each other and each represents a divalent group; a structural unit in a parenthesis marked with $n^2$ bonds to its adjacent structural units via any two of $X^9$, $X^{10}$, $X^{11}$, and $X^{12}$; and $n^2$ and $n^3$ are the same as or different from each other and each independently represents 1 or greater.

3. The organic electroluminescence device according to claim 1,
wherein the second material is any one of boron-containing compounds represented by formulas (1), (14-2), and (21-2) and a phosphine oxide derivative represented by formula (2):

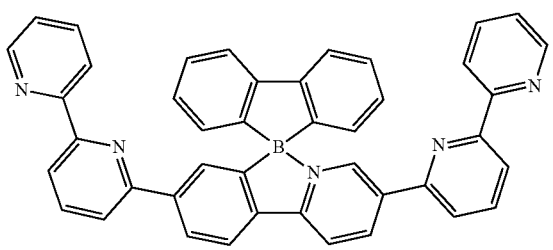

(1)

-continued

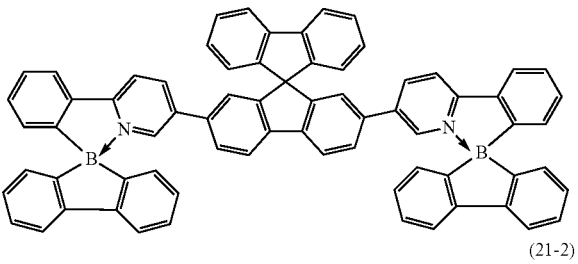

(14-2)

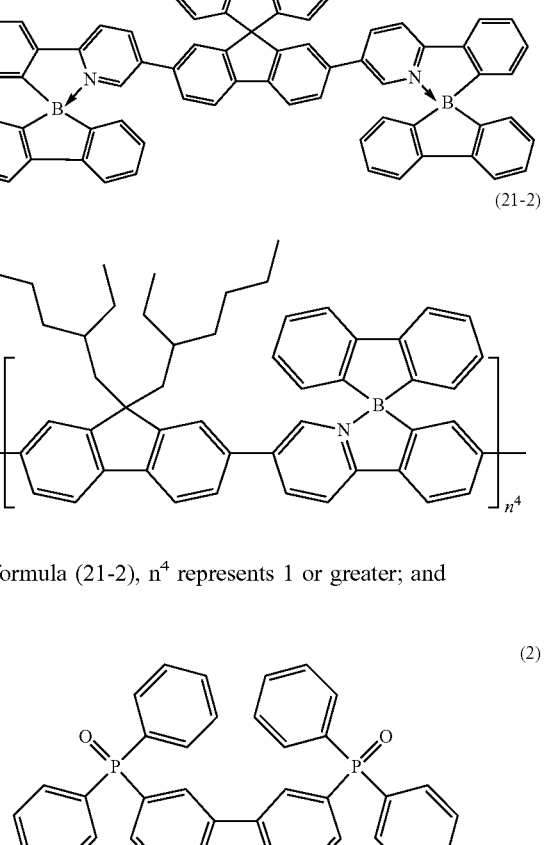

(21-2)

in formula (21-2), $n^4$ represents 1 or greater; and

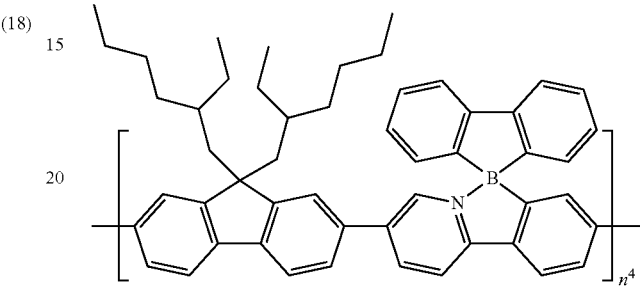

(2)

4. The organic electroluminescence device according to claim 1, wherein the acid dissociation constant pKa of the first material is 11 or greater.

5. The organic electroluminescence device according to claim 1, wherein the laminate film is present.

6. The organic electroluminescence device according to claim 1, wherein the organic thin film has an average thickness of 5 to 100 nm.

7. The organic electroluminescence device according to claim 1, further comprising an inorganic oxide layer between the cathode and the organic thin film.

8. A system selected from the group consisting of a display device and a lighting system comprising the organic electroluminescence device according to claim 1.

9. An organic electroluminescence device according to claim 1, which is in a form of an organic thin-film solar cell or a thin-film transistor.

10. A method for producing the organic electroluminescence device according to claim 1, the method comprising:
preparing the organic thin film by applying a coating composition that at least contains the first material and the second material to a surface on which the organic thin film is to be formed, and
incorporating the organic thin film into an organic electroluminescence device.

11. An organic thin film at least comprising:

a first material which is an organic material having an acid dissociation constant pKa of 1 or greater; and a second material which transports an electron, wherein the first material is one or more selected from the group consisting of tertiary amines, phosphazene compounds, guanidine compounds, heterocyclic compounds containing an amidine structure, hydrocarbon compounds having a ring structure, and ketone compounds, the tertiary amines are dialkylaminopyridines, amines having a structure represented by $NR^1R^2R^3$ or alkoxypyridine derivatives, $R^1$, $R^2$, and $R^3$ being the same as or different from each other and each representing a hydrocarbon group having 1 to 8 carbon atoms which may optionally be substituted, the phosphazene compounds have a structure represented by formula (35):

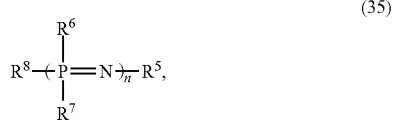

(35)

$R^5$ representing a hydrogen atom or a hydrocarbon group; and $R^6$ to $R^8$ each representing a hydrogen atom, a hydrocarbon group, or —NR'R", R' and R" each independently representing a hydrogen atom or a hydrocarbon group, and the hydrocarbon compounds having the ring structure are compounds selected from the compounds represented by formulas (44), (51), and (54):

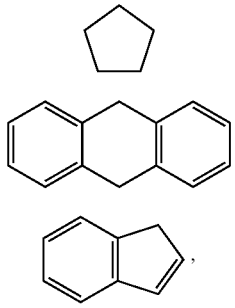

(44)

(51)

(54)

compounds in which a C1-C20 alkyl group is bonded to a ring structure, or the compound (50):

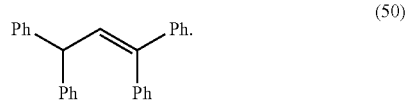 [SMILES: C(=C(c1ccccc1)c1ccccc1)C(c1ccccc1)c1ccccc1]

(50)

12. The organic thin film according to claim 11, wherein the second material is at least one compound selected from the group consisting of boron-containing compounds represented by formulas (14), (37), (39), (16), and (18):

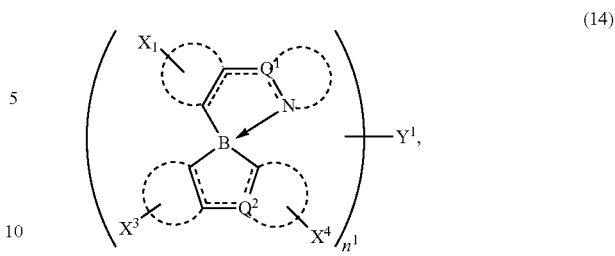

(14)

wherein dotted arcs indicate that ring structures are formed with a backbone shown in solid lines; dotted line portions of the backbone shown in the solid lines each indicate that a pair of atoms connected by a corresponding dotted line is optionally bonded by a double bond; an arrow from an nitrogen atom to a boron atom indicates that the nitrogen atom is coordinated to the boron atom; $Q^1$ and $Q^2$ are the same as or different from each other and each represents a linking group in the backbone shown in the solid lines, at least part of the linking group forms a ring structure with a dotted arc portion and is optionally substituted; $X^1$, $X^2$, $X^3$, and $X^4$ are the same as or different from each other and each represents a hydrogen atom or a monovalent substituent as a substituent in the corresponding ring structure; each of the ring structures forming the dotted arc portions optionally contains multiple $X^1$s, multiple $X^2$s, multiple Vs, or multiple $X^4$s; $n^1$ represents an integer of 2 to 10; and $Y^1$ represents a direct bond or an $n^1$-valent linking group and bonds to each of $n^1$ structural units other than $Y^1$ independently at any one site selected from the ring structures forming the dotted arc portions, $Q^1$, $Q^2$, $X^1$, $X^2$, $X^3$, and $X^4$;

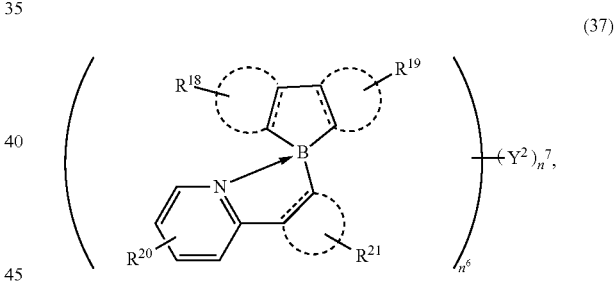

(37)

wherein dotted arcs are the same as or different from each other and indicate that ring structures are formed with a backbone shown in solid lines; dotted line portions of the backbone shown in the solid lines each indicate that a pair of atoms connected by a corresponding dotted line is optionally bonded by a double bond; an arrow from a nitrogen atom to a boron atom indicates that the nitrogen atom is coordinated to the boron atom; $R^{18}$ to $R^{21}$ are the same as or different from each other and each represents a hydrogen atom, a monovalent substituent as a substituent in the corresponding ring structure, a divalent group, or a direct bond; each of the ring structures forming the dotted arc portions optionally contains multiple $R^{18}$s, multiple $R^{19}$s, or multiple $R^{21}$s; the pyridine ring structure optionally contains multiple $R^{20}$s; the ring to which $R^{21}$ is bonded is an aromatic heterocyclic ring; $n^6$ is an integer of 1 to 4; $n^7$ is 0 or 1; when $n^7$ is 1, $Y^2$ represents an $n^6$-valent linking group or a direct bond and bonds to each of $n^6$ structural units other than $Y^2$ independently at any one site selected from $R^{18}$, $R^{19}$, $R^{20}$, and $R^{21}$; and when $n^7$ is 0, $n^6$ is 1 and at least one of $R^{18}$ to $R^{21}$ represents a monovalent substituent as a substituent in the corresponding ring structure;

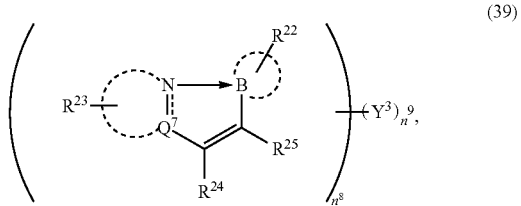

(39)

wherein dotted arcs indicate that ring structures are formed with a boron atom or a backbone shown in solid lines; the ring structures are the same as or different from each other and are each optionally a monocyclic structure constituted by one ring or a fused ring structure constituted by multiple rings; dotted line portions of the backbone shown in the solid lines each indicate that a pair of atoms connected by the corresponding dotted line is optionally bonded by a double bond; an arrow from an nitrogen atom to the boron atom indicates that the nitrogen atom is coordinated to the boron atom; $Q^7$ represents a linking group in the backbone shown in the solid lines, at least part of the linking group forms a ring structure with a dotted arc portion and is optionally substituted; $R^{22}$ and $R^{23}$ are the same as or different from each other and each represents a hydrogen atom, a monovalent substituent as a substituent in the corresponding ring structure, a divalent group, or a direct bond; each of the ring structures forming the dotted arc portions optionally contains multiple $R^{22}$s or multiple $R^{23}$s; $R^{24}$ and $R^{25}$ are the same as or different from each other and each represents a hydrogen atom, a monovalent substituent, a divalent group, or a direct bond; $R^{24}$ and $R^{25}$ are not bonded to each other and do not form a ring structure with the backbone portion shown in the double line; $n^8$ is an integer of 1 to 4; $n^9$ is 0 or 1; when $n^9$ is 1, $Y^3$ represents an $n^8$-valent linking group or a direct bond and bonds to each of $n^8$ structural units other than $Y^3$ independently at any one site selected from $R^{22}$, $R^{23}$, $R^{24}$, and $R^{25}$;

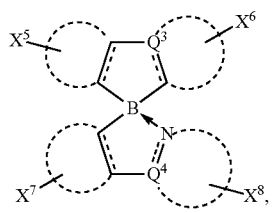

(16)

wherein dotted arcs indicate that ring structures are formed with a backbone shown in solid lines; dotted line portions of the backbone shown in the solid lines each indicate that a pair of atoms connected by the corresponding dotted line is optionally bonded by a double bond; an arrow from a nitrogen atom to a boron atom indicates that the nitrogen atom is coordinated to the boron atom; $Q^3$ and $Q^4$ are the same as or different from each other and each represents a linking group in the backbone shown in the solid lines, at least part of the linking group forms a ring structure with a dotted arc portion and is optionally substituted; $X^5$ and $X^6$ are the same as or different from each other and each represents a hydrogen atom or a monovalent substituent as a substituent in the corresponding ring structure; $X^7$ and $X^8$ are the same as or different from each other and each represents a monovalent substituent having electron transporting property as a substituent in the corresponding ring structure; and each of the ring structures forming the dotted arc portions optionally contains multiple $X^5$s, multiple $X^6$s, multiple $X^7$s, or multiple $X^8$s; and

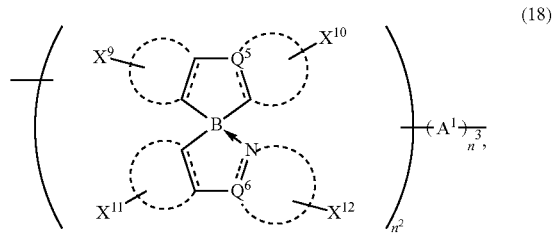

(18)

wherein dotted arcs indicate that ring structures are formed with a backbone shown in the solid lines; dotted line portions of the backbone shown in solid lines each indicate that a pair of atoms connected by the corresponding dotted line is optionally bonded by a double bond; an arrow from a nitrogen atom to a boron atom indicates that the nitrogen atom is coordinated to the boron atom; $Q^5$ and $Q^6$ are the same as or different from each other and each represents a linking group in the backbone shown in the solid lines, at least part of the linking group forms a ring structure with a dotted arc portion and is optionally substituted; $X^9$, $X^{10}$, $X^{11}$, and $X^{12}$ are the same as or different from each other and each represents a hydrogen atom, a monovalent substituent as a substituent in the corresponding ring structure, or a direct bond; each of the ring structures forming the dotted arc portions optionally contains multiple $X^9$s, multiple $X^{10}$s, multiple $X^{11}$s, or multiple $X^{12}$s; $A^1$s are the same as or different from each other and each represents a divalent group; a structural unit in a parenthesis marked with $n^2$ bonds to its adjacent structural units via any two of $X^9$, $X^{10}$, $X^{11}$, and $X^{12}$; and $n^2$ and $n^3$ are the same as or different from each other and each independently represents 1 or greater.

13. The organic thin film according to claim 11, wherein the second material is any one of boron-containing compounds represented by formulas (1), (14-2), and (21-2) and a phosphine oxide derivative represented by formula (2):

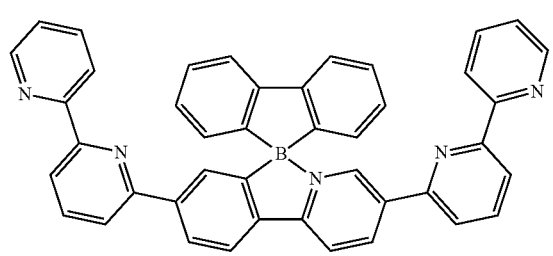

(1)

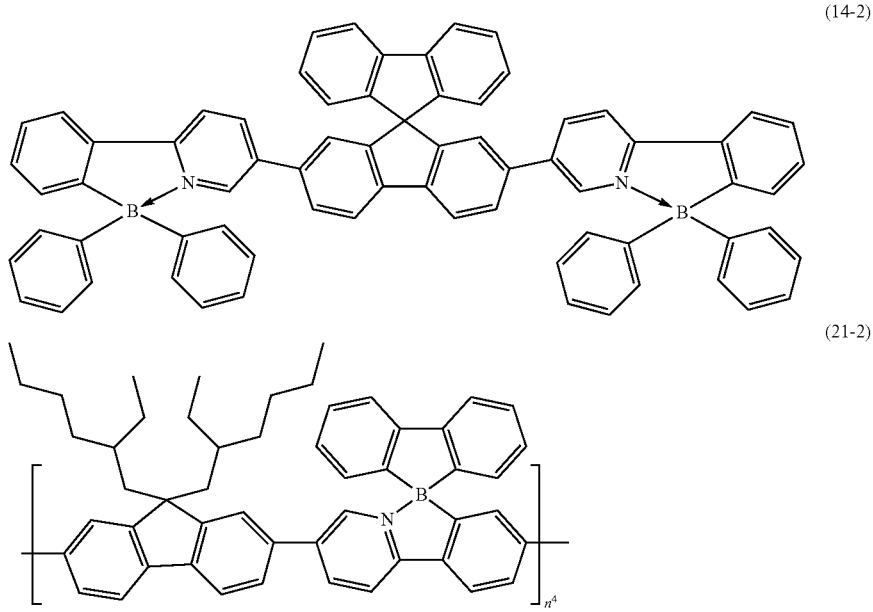

in formula (21-2), n⁴ represents 1 or greater; and

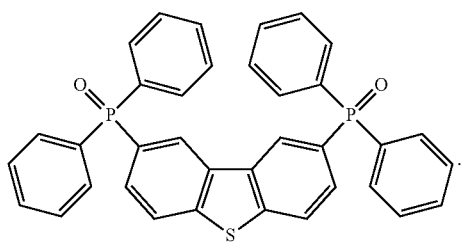

14. The organic thin film according to claim 11,
wherein the acid dissociation constant pKa of the first material is 11 or greater.

15. A laminate film comprising:
an oxide layer; and
the organic thin film according to claim 11 formed on the oxide layer.

16. An organic electroluminescence device comprising:
a cathode;
an anode;
an emitting layer between the cathode and the anode; and
the organic thin film according to claim 11 or a laminate film comprising the organic thin film according to claim 11 formed on an oxide layer,
wherein the organic thin film or the laminate film is disposed between the cathode and the emitting layer.

17. The organic electroluminescence device according to claim 16,
wherein the organic thin film has an average thickness of 5 to 100 nm.

18. The organic electroluminescence device according to claim 16, further comprising an inorganic oxide layer between the cathode and the organic thin film.

19. A system selected from the group consisting of a display device and a lighting system comprising the organic electroluminescence device according to claim 16.

20. A device selected from the group consisting of an organic thin-film solar cell and a thin-film transistor, comprising the organic thin film according to claim 11 or a laminate film,
wherein the laminate film comprises:
an oxide layer; and
the organic thin film according to claim 11 formed on the oxide layer.

21. A method for producing the organic thin film according to claim 11, the method comprising:
applying a coating composition that at least contains the first material and the second material to a surface on which the organic thin film is to be formed.

* * * * *